(12) United States Patent
Sit et al.

(10) Patent No.: US 11,296,552 B2
(45) Date of Patent: Apr. 5, 2022

(54) TRANSMITTER DEVICE, WIRELESS POWER TRANSFER SYSTEM, AND METHODS OF FORMING THE SAME

(71) Applicant: NANYANG TECHNOLOGICAL UNIVERSITY, Singapore (SG)

(72) Inventors: Ji-Jon Sit, Singapore (SG); Guangyin Feng, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 0 days.

(21) Appl. No.: 17/251,715

(22) PCT Filed: Jun. 11, 2019

(86) PCT No.: PCT/SG2019/050295
§ 371 (c)(1),
(2) Date: Dec. 11, 2020

(87) PCT Pub. No.: WO2019/240668
PCT Pub. Date: Dec. 19, 2019

(65) Prior Publication Data
US 2021/0119488 A1    Apr. 22, 2021

(30) Foreign Application Priority Data
Jun. 12, 2018    (SG) ............................ 10201805002X

(51) Int. Cl.
*H02J 50/12*    (2016.01)
*H03K 3/03*    (2006.01)

(52) U.S. Cl.
CPC ............ *H02J 50/12* (2016.02); *H03K 3/0315* (2013.01)

(58) Field of Classification Search
CPC ....................................................... H02J 50/12
(Continued)

(56) References Cited

U.S. PATENT DOCUMENTS 8,937,408 B2    1/2015   Ganem et al.
10,547,200 B2 *  1/2020  Abidi ..................... H02J 7/045
(Continued)

FOREIGN PATENT DOCUMENTS

CN    201365144 Y    12/2009
CN    102157987 A    8/2011
(Continued)

OTHER PUBLICATIONS

Abouzeid et al., "Adaptive 6.78-MHz ISM Band Wireless Charging for Small Form Factor Receivers," *IEEE International Symposium on Circuits and Systems*:2017 (4 pages).
(Continued)

*Primary Examiner* — Joseph Chang
(74) *Attorney, Agent, or Firm* — Seed IP Law Group LLP

(57) ABSTRACT

Various embodiments may provide a transmitter device. The transmitter device may include an oscillator configured to operate at a variable oscillation frequency to generate an oscillator signal. The transmitter device may also include a transmitter antenna configured to transmit power to a receiver device via magnetic coupling based on the oscillator signal. The transmitter device may further include a feedback arrangement configured to generate a feedback to the oscillator based on a resonant frequency of the magnetic coupling between the transmitter antenna and a receiver antenna of the receiver device such that the variable oscillation frequency of the oscillator is adjusted towards the resonant frequency.

18 Claims, 40 Drawing Sheets

(58) Field of Classification Search
USPC .......................................................... 307/104
See application file for complete search history.

(56) References Cited

U.S. PATENT DOCUMENTS

| | | | |
|---|---|---|---|
| 2008/0278264 A1 | 11/2008 | Karalis et al. | |
| 2012/0038218 A1 | 2/2012 | Ichikawa | |
| 2016/0049826 A1* | 2/2016 | Lee .................... | H02J 50/40 320/108 |
| 2016/0190816 A1* | 6/2016 | Rehm .................. | H02J 7/025 307/104 |
| 2017/0070354 A1* | 3/2017 | Ragonese ............ | H04B 3/54 |

FOREIGN PATENT DOCUMENTS

| | | |
|---|---|---|
| CN | 104124764 A | 10/2014 |
| CN | 104682577 A | 6/2015 |

OTHER PUBLICATIONS

Ahn et al., "Wireless Power Transmission With Self-Regulated Output Voltage for Biomedical Implant," *IEEE Transactions on Industrial Electronics* 61:(5):2225-2235, 2014.

Assawaworrarit et al., "Robust wireless power transfer using a nonlinear parity-time-symmetric circuit," *Nature* 546:387-390, 2017 (13 pages).

Baker et al., "Feedback Analysis and Design of RF Power Links for Low-Power Bionic Systems," *IEEE Transactions on Biomedical Circuits and Systems* 1(1):28-38, 2007.

Bocan et al., "Adaptive Transcutaneous Power Transfer to Implantable Devices: A State of the Art Review," *Sensors* 16:393, 2016 (23 pages).

Costanzo et al., "Rigorous modeling of mid-range wireless power transfer systems based on Royer oscillators," *2013 IEEE Wireless Power Transfer*:69-12, 2013.

Duong et al., "A Dynamically Adaptable Impedance-Matching System for Midrange Wireless Power Transfer with Misalignment," *Energies* 8:7593-7617, 2015.

Gonzalez, "Microwave Transistor Amplifiers: Analysis and Design," Second Edition, Prentice Hall, 1996 (516 pages).

Kim et al., "Adaptive frequency with power-level tracking system for efficient magnetic resonance wireless power transfer," *Electronics Letters* 48(8):2012 (2 pages).

Kim et al., "Automated Adaptive Frequency Tracking System for Efficient Mid-Range Wireless Power Transfer via Magnetic Resonance Coupling," *Proceedings of the 42$^{nd}$ European Microwave Conference*:221-224, 2012.

Ko et al., "Design of radio-frequency powered coils for implant instruments," *Med. & Biol. Eng. & Comput.* 15:634-640, 1977.

Kumar et al., "Resonance-based Wireless Power Delivery for Implantable Devices," *Proc. IEEE BioCAS*:25-28, 2009.

Kurs et al., "Wireless Power Transfer via Strongly Coupled Magnetic Resonances," *Science* 317:83-86, 2007 (5 pages).

Li et al., "A Maximum Efficiency Point Tracking Control Scheme for Wireless Power Transfer Systems Using Magnetic Resonant Coupling," *IEEE Trans. Power Electron* 30(7):3998-4008, 2015.

Luo et al., "A Frequency-Tracking and Impedance-Matching Combined System for Robust Wireless Power Transfer," *International Journal of Antennas and Propagation* 2017(5719835):1-13, 2017 (14 pages).

Ra'di et al., "On-Site Wireless Power Generation," *IEEE Transactions on Antennas and Propagation* 66(8):4260-4268, 2018.

Sample et al., "Analysis, Experimental Results, and Range Adaptation of Magnetically Coupled Resonators for Wireless Power Transfer," *IEEE Transactions on Industrial Electronics* 58(2):544-554, 2011.

Zargham et al., "Integrated CMOS Wireless Power Transfer for Neural Implants," *Proc. IEEE BioCAS*:165-166, 2011.

Zhang et al., "Design for Efficiency Optimization and Voltage Controllability of Series-Series Compensated Inductive Power Transfer Systems," *IEEE Transactions on Power Electronics* 29(1):191-200, 2014.

* cited by examiner

| Distance (mm) | Marker | Impedance @ 40.8MHz | Marker | Impedance @ min S11 | Frequency @ min S11 |
|---|---|---|---|---|---|
| 10 | M1 | 80.6 − j390 | M1a | 55.5 − j1.0 | 36.2 MHz |
| 20 | M2 | 210 − j200 | M2a | 51.8 − j6.0 | 38.5 MHz |
| 30 | M3 | 102 − j16.0 | M3a | 48.2 − j3.4 | 39.8 MHz |
| 40 | M4 | 38.4 + j7.0 | M4 | 38.4 + j7.0 | 40.8 MHz |
| 50 | M5 | 16.9 + j10.1 | M5 | 16.9 + j10.1 | 40.8 MHz |
| 60 | M6 | 9.3 + j10.7 | M6 | 9.3 + j10.7 | 40.8 MHz |
| 70 | M7 | 6.3 + j10.9 | M7 | 6.3 + j10.9 | 40.8 MHz |
| 80 | M8 | 5.1 + j10.9 | M8 | 5.1 + j10.9 | 40.8 MHz |

TRANSMITTER DEVICE, WIRELESS POWER TRANSFER SYSTEM, AND METHODS OF FORMING THE SAME

CROSS-REFERENCE TO RELATED APPLICATION

This application claims the benefit of priority of Singapore application No. 10201805002X filed Jun. 12, 2018, the contents of it being hereby incorporated by reference in its entirety for all purposes.

TECHNICAL FIELD

Various aspects of this disclosure relate to a transmitter device. Various aspects of this disclosure relate to a wireless power transfer (WPT) system. Various aspects of this disclose relate to a method of forming a transmitter device. Various aspects of this disclosure relate to a method of forming a wireless power transfer system.

BACKGROUND

There are two main techniques for wireless power transfer (WPT) in the near-field region, namely, inductive coupling and magnetic resonance coupling. Inductive coupling, also known as inductive power transfer, is formed by placing transmitter and receiver antennas very close to one another, usually at a distance less than the diameter of the transmitter and receiver antennas.

Highly-resonant wireless power transfer via magnetic resonance coupling was proposed in order to increase the distance of the wireless power transfer. Magnetic resonance coupling enables highly-efficient mid-range energy transfer at distances several times the diameter of transmitter (Tx) and receiver (Rx) antennas.

However, there are drawbacks to all highly-resonant WPT systems. Specifically, for optimal power transfer, impedance matching networks are required to transform the transmitter and receiver antenna impedances to the source and load impedances, respectively. This impedance transformation can be chosen at only one spacing where the load will be optimally matched to the source. This is often referred to as critical coupling. When the antennas are brought too close to one another (often referred to as over-coupling), a phenomenon known as pole-splitting or resonant frequency bifurcation occurs. This causes the power transfer efficiency to fall if a constant transmitter frequency is maintained, as the forward transmission coefficient ($S_{21}$) will drop on both sides of the critical coupling point. It should also be noted that the mismatch or return loss (as measured by reflection coefficient $S_{11}$) also increases at the same time. However, if an automatic frequency control (AFC) feedback loop is applied to track either the higher or lower resonant frequency after they split apart, then both high $S_{21}$ and low $S_{11}$ can be achieved.

Several approaches have been explored to track the maximum efficiency of over-coupled WPT systems. In a first approach, it is proposed to use a directional coupler to sense forward and reverse powers (similar to a Vector Network Analyzer, VNA) to track the frequency point with lowest return loss (i.e. $S_{11}$). However, this requires at least a microcontroller and sophisticated software algorithm to track the minimum $S_{11}$. Furthermore, such introduction of a microcontroller will inevitably increase overhead in power and area to house the microcontroller.

A second approach is to dynamically tune the matching network rather than adjusting the frequency, so that the matching network is itself adjusted to the new optimum frequency. This approach also requires a sophisticated control unit, and a sizable array of high-Q radio frequency (RF) switches to select the appropriate passive components, based on a similar search algorithm as required in the first approach. Again, additional power and area are required to implement this approach.

A third approach uses both tracking of frequency and tuning of matching network. However, the drawbacks are similar to the first and second approaches.

A self-oscillating "nonlinear parity-time-symmetric circuit" has been recently reported by Stanford researchers. This circuit relies on an amplifier which is implemented using an off-the-shelf operational amplifier (opamp) and feedback resistor serving as a negative resistance to cancel the dissipative elements in the LC resonant tank (where L refers to inductor while C refers to capacitor). This circuit topology is well known to electrical engineers as a negative impedance oscillator. However, the drawback is the low amplifier efficiency of around only 10%. A Royer oscillator for WPT has been proposed which is capable of achieving more efficient self-oscillation. However, the tracking range appears limited, to only 58% spacing below critical coupling (70 mm/120 mm).

In another approach, the duty cycle, phase or frequency of the oscillator can be made adjustable in response to a voltage measurement received from a voltage sensor, in order to implement dynamic impedance matching. However, the use of a voltage sensor to make a voltage measurement also implies an approach similar to the first and second approaches requiring an integrated measurement, communication and microcontroller system to implement the feedback loop.

SUMMARY

Various embodiments may provide a transmitter device. The transmitter device may include an oscillator configured to operate at a variable oscillation frequency to generate an oscillator signal. The transmitter device may also include a transmitter antenna configured to transmit power to a receiver device via magnetic coupling based on the oscillator signal. The transmitter device may further include a feedback arrangement configured to generate a feedback to the oscillator based on a resonant frequency of the magnetic coupling between the transmitter antenna and a receiver antenna of the receiver device such that the variable oscillation frequency of the oscillator is adjusted towards the resonant frequency.

Various embodiments may provide a wireless power transfer (WPT) system. The system may include a transmitter device. The transmitter device may be any transmitter device as described herein. The system may further include the receiver device including the receiver antenna configured to receive the power transmitted by the transmitter device via the magnetic coupling. The receiver device may be configured to be coupled to a load.

Various embodiments may provide a method of forming a transmitter device. The method may include providing an oscillator configured to operate at a variable oscillation frequency to generate an oscillator signal. The method may also include in coupling a transmitter antenna to the oscillator, the transmitter antenna configured to transmit power to a receiver device via magnetic coupling based on the oscillator signal. The method may additionally include coupling a feedback arrangement with the oscillator and the transmitter antenna. The feedback arrangement may be configured to generate a feedback to the oscillator based on a resonant frequency of the magnetic coupling between the transmitter antenna and a receiver antenna of the receiver device such that the variable oscillation frequency of the oscillator is adjusted towards the resonant frequency.

Various embodiments may provide a method of forming a wireless power transfer system (WPT). The method may include providing the transmitter device. The transmitter device may be any transmitter device as described herein. The method may also include providing a receiver device configured to receive the power transmitted by the transmitter device via the magnetic coupling. The receiver device may be configured to be coupled to a load.

BRIEF DESCRIPTION OF THE DRAWINGS

The invention will be better understood with reference to the detailed description when considered in conjunction with the non-limiting examples and the accompanying drawings, in which.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or transmitter devices/wireless power systems is analogously valid for the other methods or transmitter devices/wireless power systems. Similarly, embodiments described in the context of a method are analogously valid for a transmitter device/wireless power system, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Various embodiments may seek to track the frequency of maximum power transfer efficiency to well below critical coupling while maintaining higher amplifier and overall efficiency, without sophisticated communication system or control algorithms.

Figure 1:
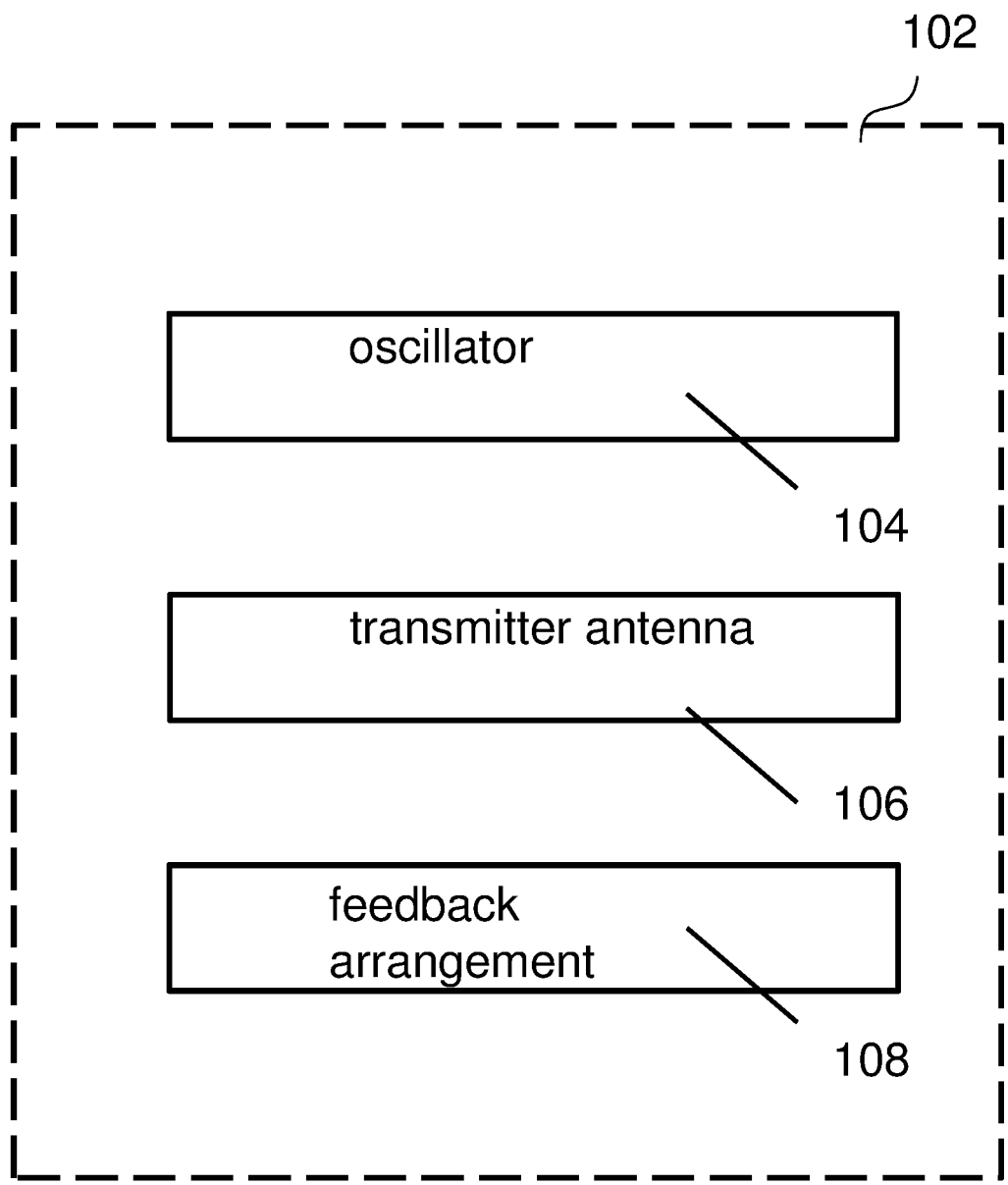
FIG. 1 is a general illustration of a transmitter device according to various embodiments.

FIG. 1 is a general illustration of a transmitter device 102 according to various embodiments. The transmitter device 102 may include an oscillator 104 configured to operate at a variable oscillation frequency to generate an oscillator signal. The transmitter device 102 may also include a transmitter antenna 106 configured to transmit power to a receiver device via magnetic coupling based on the oscillator signal. The transmitter device 102 may further include a feedback arrangement 108 configured to generate a feedback to the oscillator 104 based on a resonant frequency of the magnetic coupling between the transmitter antenna 106 and a receiver antenna of the receiver device such that the variable oscillation frequency of the oscillator 104 is adjusted towards the resonant frequency.

In other words, the transmitter device 102 may include an oscillator 104, a transmitter antenna 106 and a feedback arrangement 108. The feedback arrangement 108 may provide the output of the transmitter device 102 back to the oscillator 104, and may automatically track the resonant frequency of the coupled transmitter antenna 106 and the receiver antenna, thereby controlling the operation frequency of the transmitter device.

For avoidance of doubt, FIG. 1 serves to illustrate the features of a transmitter device 102 according to various embodiments, and is not intended to indicate the arrangement, the sizes, the shapes etc. of the features.

By tracking the resonant frequency and controlling the operation frequency of the transmitter device based on the resonant frequency, high power transfer efficiency may be maintained.

The variable oscillation frequency of the oscillator 104 may be initially at a starting frequency. The variable oscillation frequency of the oscillator 104 may be adjusted to the resonant frequency upon the oscillator 104 receiving the feedback from the feedback arrangement 108.

In various embodiments, the feedback arrangement 108 may include one or more passive elements. The one or more passive elements may be two-terminal elements such as one or more inductors, one or more capacitors, or any combination thereof. The one or more passive elements may form an input-output impedance network.

In various other embodiments, the feedback arrangement 108 may include one or more active elements. The one or more active elements may be three terminal elements such as transistors. An input to the feedback arrangement 108 (from the transmitter antenna 106) may be coupled to a control electrode of the transistor. A first controlled electrode of the transistor may serve as output of the feedback arrangement 108 to the oscillator 104, while a second controlled electrode of the transistor may be connected to a fixed potential such as ground.

In yet various other embodiments, the feedback arrangement 108 may include one or more passive elements and one or more active elements. For instance, the one or more passive elements may form a passive impedance network, an input to the feedback arrangement 108 (from the transmitter antenna 106) may be coupled to the input of the passive impedance network, while an output of the passive impedance network may be coupled to an input of an active element, such as a control electrode of a three-electrode transistor. The output at a controlled electrode of the transistor may be coupled to the oscillator 104.

In various embodiments, the transmitter device 102 may further include a further feedback arrangement configured to provide a further feedback to the oscillator 104 based on the resonant frequency of the magnetic coupling between the transmitter antenna 106 and the receiver antenna of the receiver device such that the variable oscillation frequency of the oscillator 104 is adjusted towards the resonant frequency. The variable oscillation frequency of the oscillator 104 may be adjusted to the resonant frequency upon the oscillator 104 receiving the feedback from the feedback arrangement 108 and the further feedback from the further feedback arrangement.

The oscillator 104 may be a fully differential oscillator having a first input and a second input. The transmitter antenna 106 may be coupled to the oscillator 104 via the feedback arrangement 108 and the further feedback arrangement.

The further feedback arrangement may have same or similar arrangement as the feedback arrangement.

In various embodiments, the further feedback arrangement may include one or more passive elements. In various other embodiments, the further feedback arrangement may include one or more active elements. In yet various other embodiments, the further feedback arrangement may include one or more passive elements and one or more active elements.

The transmitter antenna 106 may have a first end and a second end.

In various embodiments, a first end of the feedback arrangement 108 may be coupled to the first end of the transmitter antenna 106, and a second end of the feedback arrangement 108 may be coupled to the first input of the oscillator 104. A first end of the further feedback arrangement may be coupled to the second end of the transmitter antenna 106, and a second end of the further feedback arrangement may be coupled to the second input of the oscillator 104.

In various other embodiments, a first end of the feedback arrangement 108 may be coupled to the first end of the transmitter antenna 106, and a second end of the feedback arrangement 108 may be coupled to the second input of the oscillator 104. A first end of the further feedback arrangement may be coupled to the second end of the transmitter antenna 106, and a second end of the further feedback arrangement may be coupled to the first input of the oscillator 104.

In yet various other embodiments, a first end of the feedback arrangement 108 may be coupled to a second end of the transmitter antenna 106, and a second end of the feedback arrangement 108 may be coupled to the first input of the oscillator 104. A first end of the further feedback arrangement may be coupled to the first end of the transmitter antenna, and a second end of the further feedback arrangement may be coupled to the second input of the oscillator 104.

In various embodiments, the oscillator 104 may include an oscillator inductor (L), an oscillator capacitor (C) coupled with the oscillator inductor to form a resonant tank (e.g. LC tank), and an active gain element configured to provide energy to the resonant tank to oscillate. The oscillator may be of Hartley oscillator topology, Clapp oscillator topology, or Pierce oscillator topology etc.

In various other embodiments, the oscillator 104 may be or may include a ring oscillator. The ring oscillator may include three or more amplifier stages.

In various embodiments, the transmitter device 102 may also include a power amplifier configured to generate an amplified signal based on the oscillator signal. The transmitter antenna 106 may be configured to transmit the power to the receiver device via the magnetic coupling based on the amplified signal. The power amplifier may, for instance, have a Class C topology, a Class D topology, a Class E topology, or a Class F topology.

The power amplifier may include one or more active power transistors. The one or more active power transistors may be biased at the frequency of interest to provide high power gain and high power-added-efficiency from input to output.

In various embodiments, the transmitter device 102 may include a transmitter matching network having an input coupled to the power amplifier, and an output coupled to the transmitter antenna 106.

In various embodiments, the transmitter matching network may include a single matching network capacitor connected in parallel to the transmitter antenna.

In various other embodiments, the transmitter matching network may include a first matching network capacitor connected in parallel to the transmitter antenna 106. The transmitter matching network may also include a second matching network capacitor having a first end connected to the transmitter antenna 106, and a second end connected to the power amplifier. The transmitter matching network may additionally include a third matching network capacitor having a first end connected to the transmitter antenna 106, and a second end connected to the power amplifier.

In various embodiments, the transmitter device 102 may further include a pre-amplifier coupled to the power amplifier, the pre-amplifier configured to generate a pre-amplification signal based on the oscillator signal generated by the oscillator 104. The amplified signal generated by the power amplifier may be based on the pre-amplification signal.

The pre-amplifier may include a gain stage. The gain stage may be configured to drive the input of the power amplifier in a power-efficient manner.

In various embodiments, the transmitter device 102 may include a load isolator coupled to the oscillator 104. In various other embodiments, the transmitter device 102 may include a load isolator coupled to the feedback arrangement 108. In yet various other embodiments, the transmitter device 102 may include a load isolator coupled to the oscillator 104, and a further load isolator coupled to the feedback arrangement 108.

In various embodiments, the transmitter device 102 may alternatively or additionally include a load isolator coupled to the further feedback arrangement.

The load isolator may include one or more transistors. The further load isolator may include one or more transistors. Each of the one or more transistors may be configured to separate load impedance at the output of the transistor (e.g. a controlled electrode) and the input impedance at the input of the transistor (i.e. the controlled electrode).

In various embodiments, the transmitter device 102 may be referred to as an injection-locked power oscillator.

Figure 2:
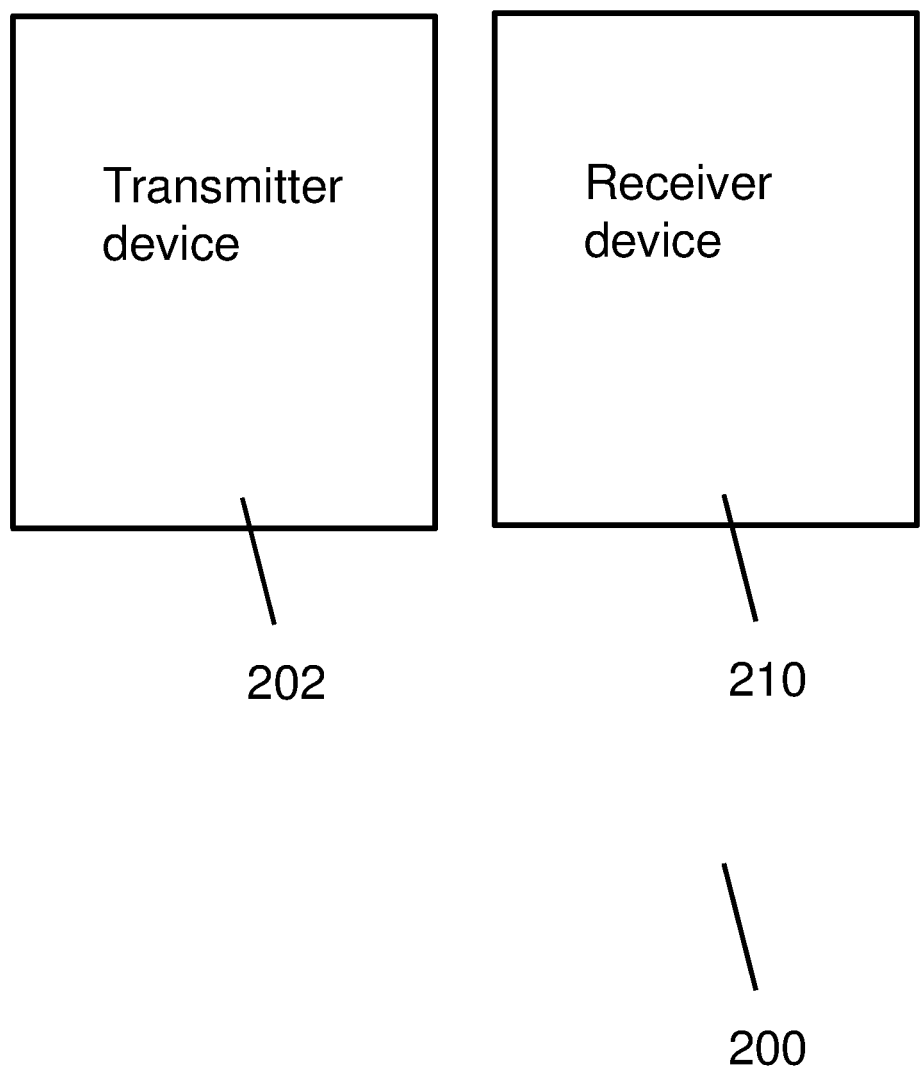
FIG. 2 is a general illustration of a wireless power transfer (WPT) system according to various embodiments.

FIG. 2 is a general illustration of a wireless power transfer (WPT) system 200 according to various embodiments. The system 200 may include a transmitter device 202. The transmitter device 202 may be any transmitter device as described herein. The system 200 may further include the receiver device 210 including the receiver antenna configured to receive the power transmitted by the transmitter device 202 via the magnetic coupling. The receiver device 210 may be configured to be coupled to a load.

In other words, the transmitter device 202 may be configured to transfer power to a receiver device 210, which in in turn is configured to transfer the power received to a load.

For avoidance of doubt, FIG. 2 serves to illustrate the features of a system 200 according to various embodiments, and is not intended to indicate the arrangement, the sizes, the shapes etc. of the features.

The system 200 may be a magnetic resonance wireless power transfer (WPT) system.

In various embodiments, the system 200 or the receiver device 210 may include a receiver matching network connected to the receiver antenna.

In various embodiments, the system 200 or the receiver device 210 may include a rectifier having one or more inputs coupled to the receiver matching network, and one or more outputs coupled to the load.

Figure 3:
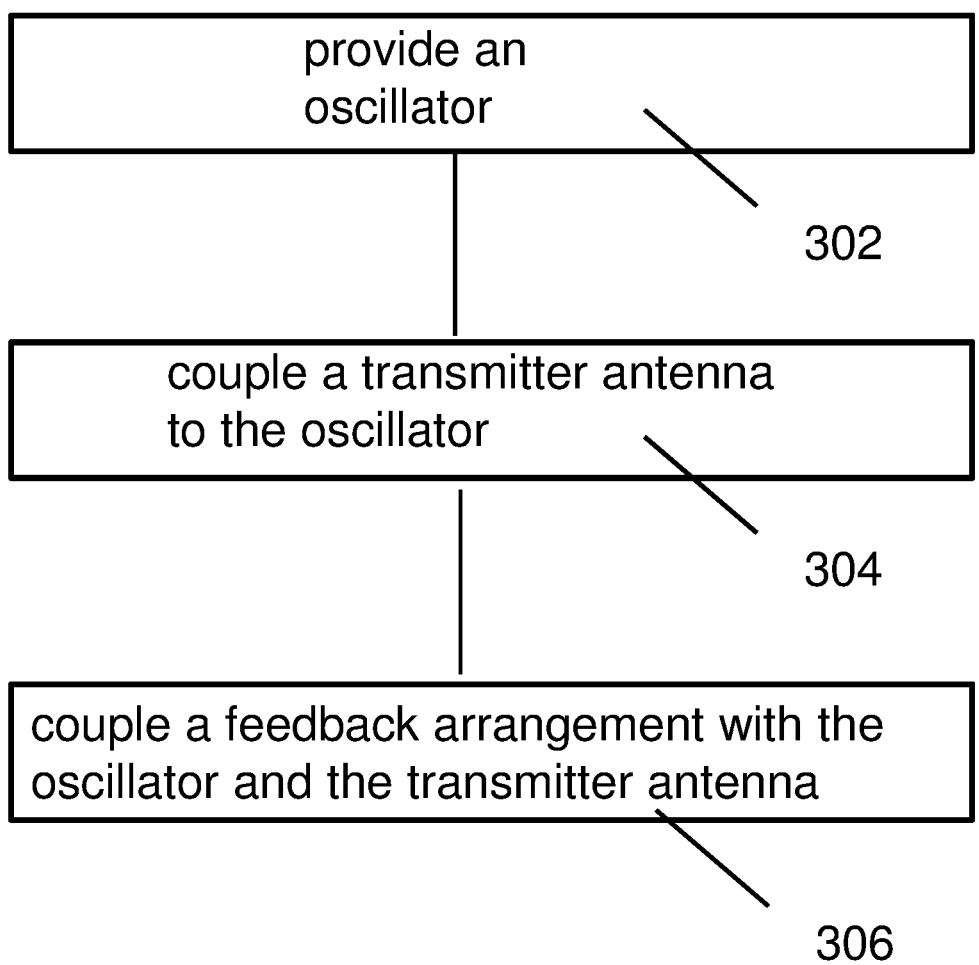
FIG. 3 is a general illustration of a method of forming a transmitter device according to various embodiments.

FIG. 3 is a general illustration of a method of forming a transmitter device according to various embodiments. The method may include, in 302, providing an oscillator configured to operate at a variable oscillation frequency to generate an oscillator signal. The method may also include, in 304, coupling a transmitter antenna to the oscillator, the transmitter antenna configured to transmit power to a receiver device via magnetic coupling based on the oscillator signal. The method may additionally include, in 306, coupling a feedback arrangement with the oscillator and the transmitter antenna. The feedback arrangement may be configured to generate a feedback to the oscillator based on a resonant frequency of the magnetic coupling between the transmitter antenna and a receiver antenna of the receiver device such that the variable oscillation frequency of the oscillator is adjusted towards the resonant frequency.

In other words, the method of forming a transmitter device may include coupling the oscillator, the transmitter antenna, and the feedback arrangement.

For avoidance of doubt, FIG. 3 highlights the various steps of a method according to various embodiments, and is not intended to be in sequence. For instance, step 304 may occur before step 306, after step 306, or at the same time as step 306.

In various embodiments, the method may include coupling a further feedback arrangement with the oscillator and the transmitter antenna. The further feedback arrangement may be configured to provide a further feedback to the oscillator based on the resonant frequency of the magnetic coupling between the transmitter antenna and the receiver antenna of the receiver device such that the variable oscillation frequency of the oscillator is adjusted towards the resonant frequency.

In various embodiments, the method may also include coupling a power amplifier. The power amplifier may be coupled (directly or indirectly) to the oscillator. The power amplifier may be configured to generate an amplified signal based on the oscillator signal.

In various embodiments, the method may also include coupling a pre-amplifier to the power amplifier. The pre-amplifier may be configured to generate a pre-amplification signal based on the oscillator signal generated by the oscillator. The amplified signal may be generated by the power amplifier is based on the pre-amplification signal. The transmitter antenna may be configured to transmit the power to the receiver device via the magnetic coupling based on the amplified signal.

In various embodiments, the method may also include coupling a load isolator to the oscillator. In various other embodiments, the method may include coupling a load isolator to the feedback arrangement. In yet various other embodiments, the method may include coupling a load isolator to the oscillator and a further load isolator to the feedback arrangement The method may alternatively or additionally include coupling a load isolator to the further feedback arrangement.

Figure 4:
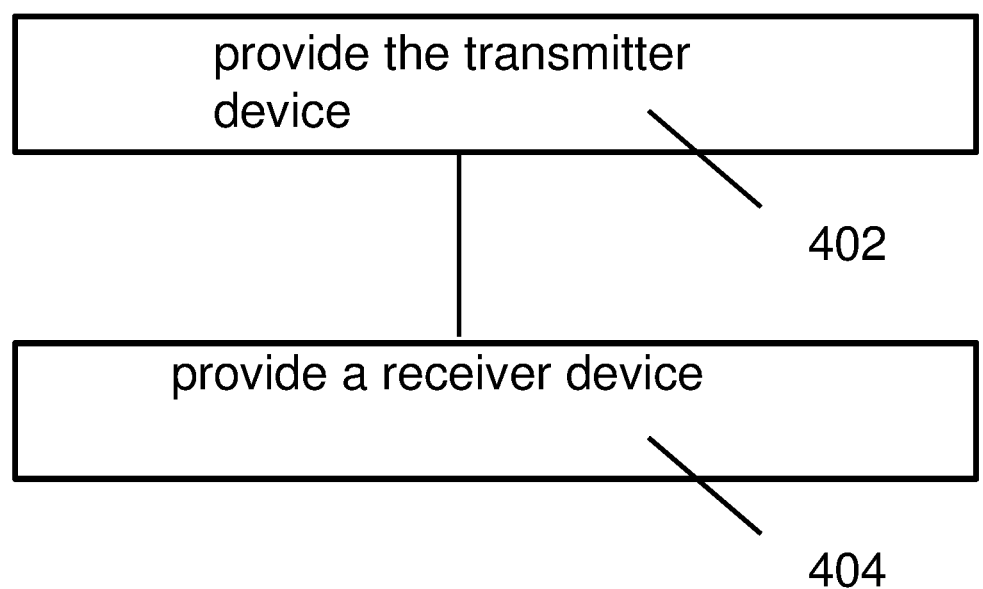
FIG. 4 is a general illustration of a method of forming a wireless power transfer system (WPT) according to various embodiments.

FIG. 4 is a general illustration of a method of forming a wireless power transfer system (WPT) according to various embodiments. The method may include, in 402, providing the transmitter device. The transmitter device may be any transmitter device as described herein. The method may also include, in 404, providing a receiver device configured to receive the power transmitted by the transmitter device via the magnetic coupling. The receiver device may be configured to be coupled to a load.

In other words, the method may include providing the transmitter device and the receiver device to be magnetically coupled to each other.

For avoidance of doubt, FIG. 4 highlights the various steps of a method according to various embodiments, and is not intended to be in sequence. For instance, step 402 may occur before step 404, after step 404, or at the same time as step 404.

Figure 5:
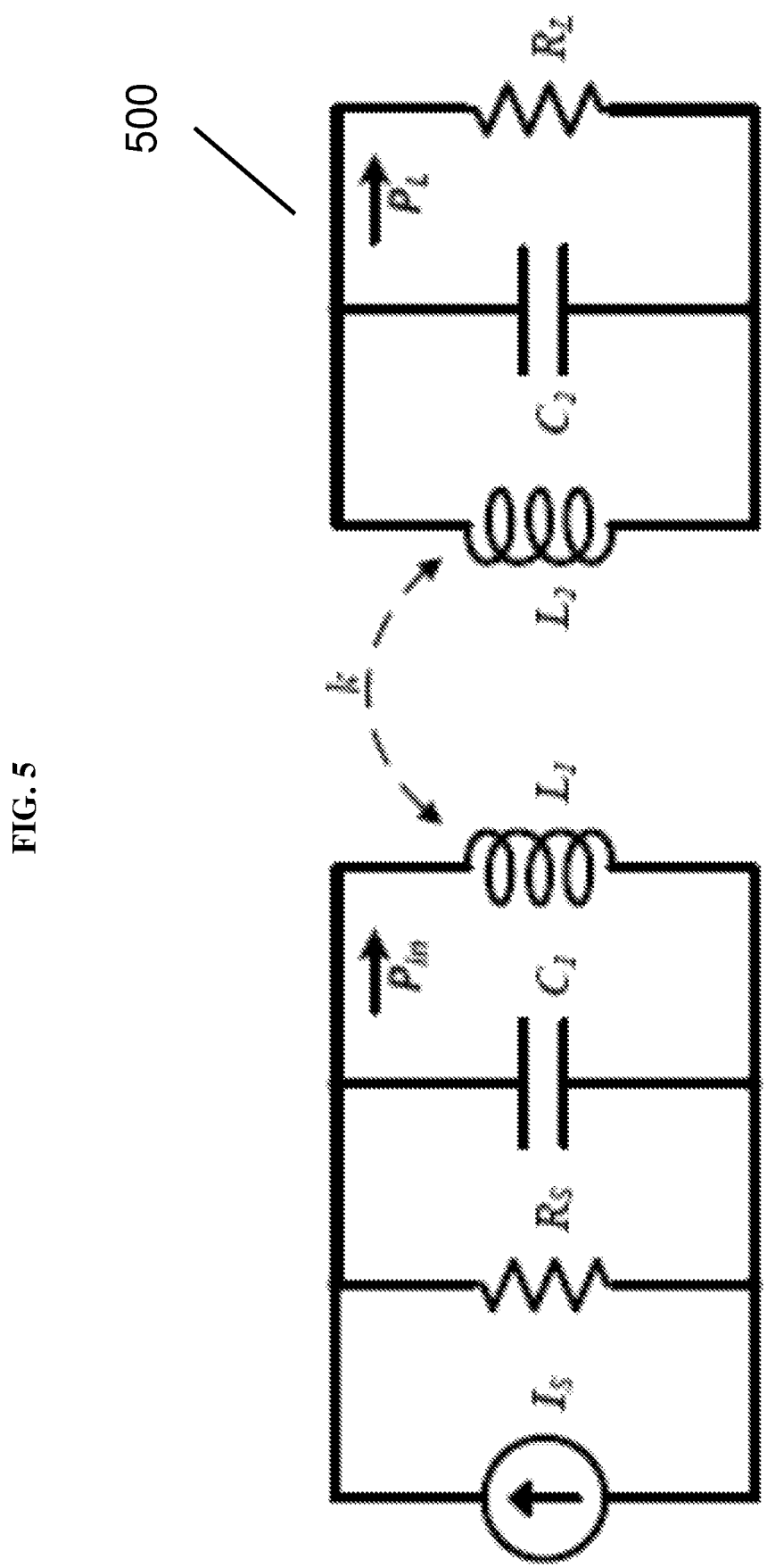
FIG. 5 shows a simplified parallel-circuit model of a magnetic resonance wireless power transfer (WPT) system (with impedance matching networks omitted for clarity).

FIG. 5 shows a simplified parallel-circuit model of a magnetic resonance wireless power transfer (WPT) system 500 (with impedance matching networks omitted for clarity). When the transmitter antenna is driven by a source at the same frequency as the resonance in the system 500, a large voltage swing is built up across the resonant tank $L_1C_1$. The receiver resonator is magnetically coupled at the same resonance frequency as the transmitter and hence builds up the received energy in its own resonant tank $L_2C_2$.

The power transfer efficiency across the antennas $\eta_{ANT}$ can found from an S-parameter measurement of the network:

$$\eta_{ANT} = \frac{P_L}{P_{in}} = \frac{|S_{21}|^2}{1-|S_{11}|^2} \quad \left| \begin{array}{l} P_L/P_{AVS} = |S_{21}|^2 \\ P_{in}/P_{AVS} = 1-|S_{11}|^2 \end{array} \right. \quad (1)$$

where $P_{AVS}$ is the maximum available power from the source. The maximum achievable $\eta_{ANT}$ turns out to be defined solely by $Q_1$ and $Q_2$, the quality factors of transmitter and receiver antennas respectively and their coupling coefficient k:

$$\eta_{opt} = \frac{U^2}{\left(1+\sqrt{1+U^2}\right)^2} \quad \left| U = k\sqrt{Q_1Q_2} \right. \quad (2)$$

It can be shown that $\eta_{ANT}=\eta_{opt}$ (also known in microwave engineering as maximum power gain $G_{p,max}$) only when the antenna impedances are simultaneously conjugate matched to their source and load impedances. For a fixed matching network and fixed source frequency, this condition occurs only at a single spacing commonly referred to as critical coupling.

It can be seen from (2) that the higher the Q factors of transmitter and receiver antennas, the more efficient the WPT system can be for any given coupling, and designers strive to make both $Q_1$ and $Q_2$ as high as possible.

In practice, efficiency then depends highly on the source frequency precisely matching the coupled resonance frequency due to the extremely sharp (or high-Q) bandpass nature of the WPT system. As the distance between transmitter and receiver antennas decreases below the critical coupling point, the increased magnetic coupling drives the four-pole system to split apart from a single resonance frequency into two distinct frequencies. This frequency bifurcation leads to degraded output power and lower efficiency at the original frequency.

Figure 6:
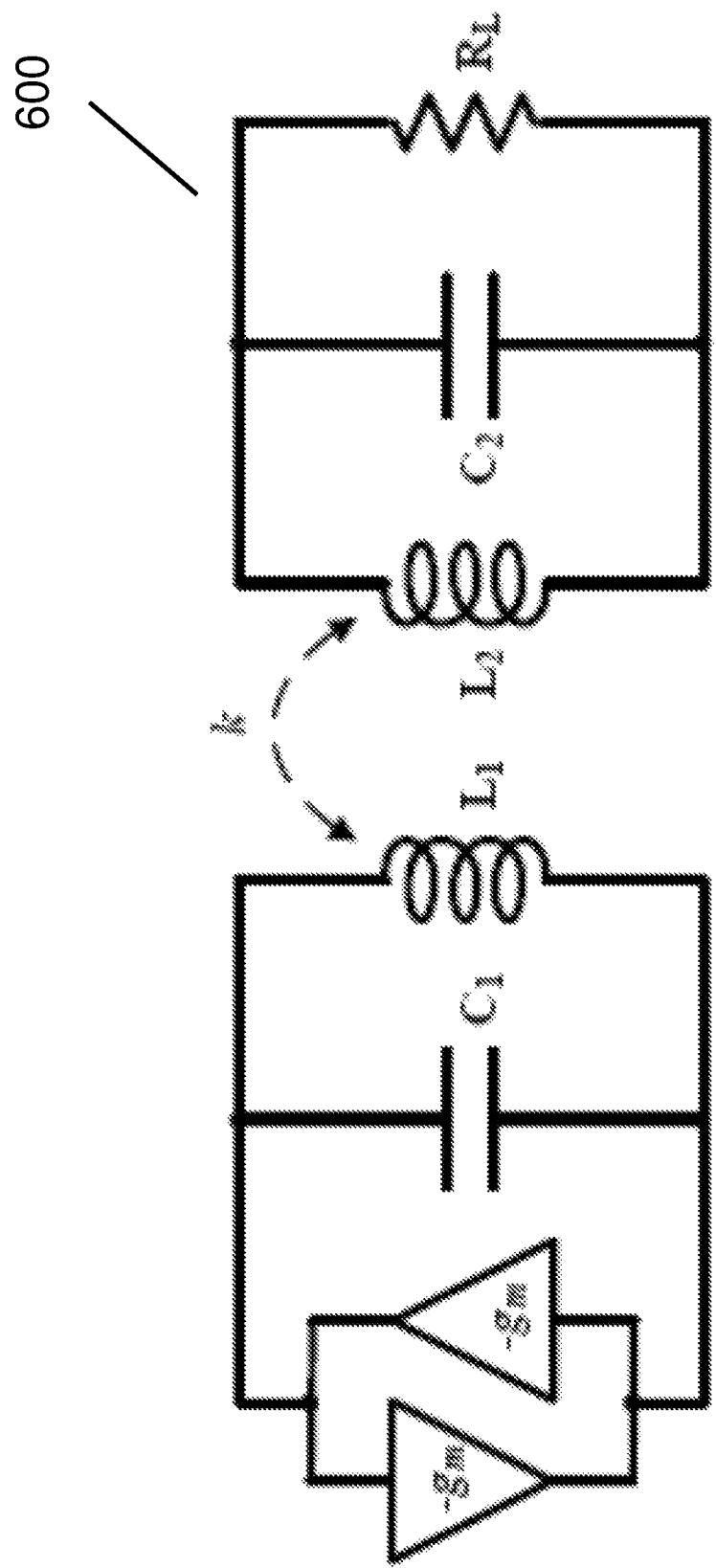
FIG. 6 is a circuit model of a wireless power transfer system (WPT) illustrating automatic frequency tracking of magnetic resonance wireless power transfer (WPT) by formation of a negative impedance oscillator (matching network omitted for clarity).

In order to achieve maximum efficiency, the source frequency may be controlled automatically to match the resonance frequency of the transmitter and receiver antennas as it changes. The basic idea is to replace the frequency-fixed signal source with an oscillator, which may be represented as a negative $g_m$ cell and LC tank to form a negative impedance oscillator, as shown in FIG. 6. FIG. 6 is a circuit model of a wireless power transfer system (WPT) 600 illustrating automatic frequency tracking of magnetic resonance wireless power transfer (WPT) by formation of a negative impedance oscillator (matching network omitted for clarity).

As the antenna distance varies, the effective LC resonance seen by the negative $g_m$ cell will vary, thus the correct oscillation frequency is tracked accordingly. Unfortunately, the final efficiency of WPT as shown in FIG. 6 is often degraded quickly due to the effective impedance mismatch created by the negative gm cell as it adjusts to cancel the sum of real and reflected resistances in the circuit, even though it can control the frequency automatically.

Figure 7:
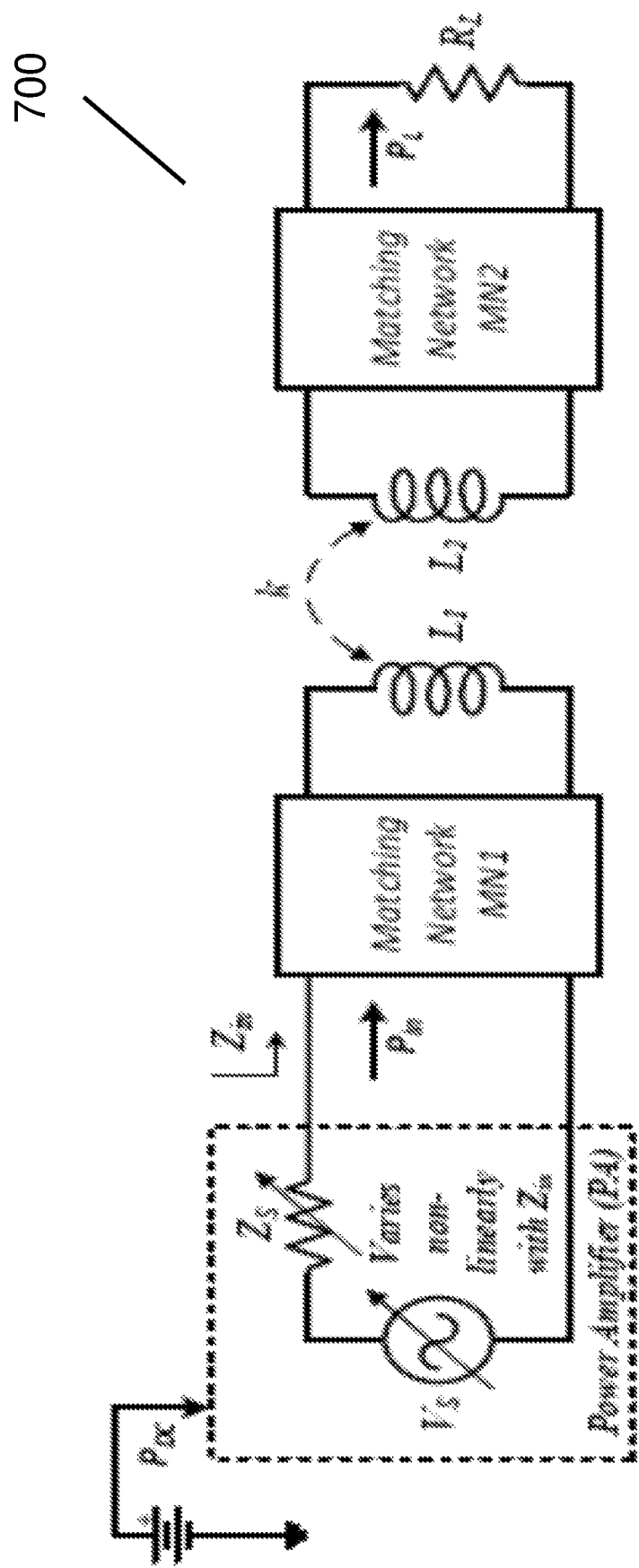
FIG. 7 is a block diagram illustrating how every power amplifier efficiency $\eta_{PA}$ affects total system efficiency $\eta_{TOT}$.

This behavior may be understood by noting that the total system efficiency $\eta_{TOT}$ is the product of a power amplifier efficiency $\eta_{PA}$ (in this case, that of the negative $g_m$ cell) and the antenna efficiency $\eta_{ANT}$, as shown in FIG. 7:

$$\eta_{TOT} = \eta_{PA} \times \eta_{ANT} \mid \eta_{PA} = \frac{P_{in}}{P_{DC}} \quad (3)$$

FIG. 7 is a block diagram illustrating how every power amplifier efficiency $\eta_{PA}$ affects total system efficiency $\eta_{TOT}$. The simultaneous conjugate matching of $L_1$, $L_2$ by MN1, MN2 achieves $\eta_{opt}$ for one value of k. A load pull of the PA must be performed to optimize $Z_{in}$ for the highest $\eta_{PA}$ at an acceptable $P_{in}$ (note in general: $Z_{in} \neq Z_S^*$).

The non-linear behavior of most negative $g_m$ cells cannot sustain a high $\eta_{PA}$ over a wide range of varying input impedance $Z_{in}$, and thereby exhibits high efficiency over only a narrow range of antenna spacings.

Figure 8:
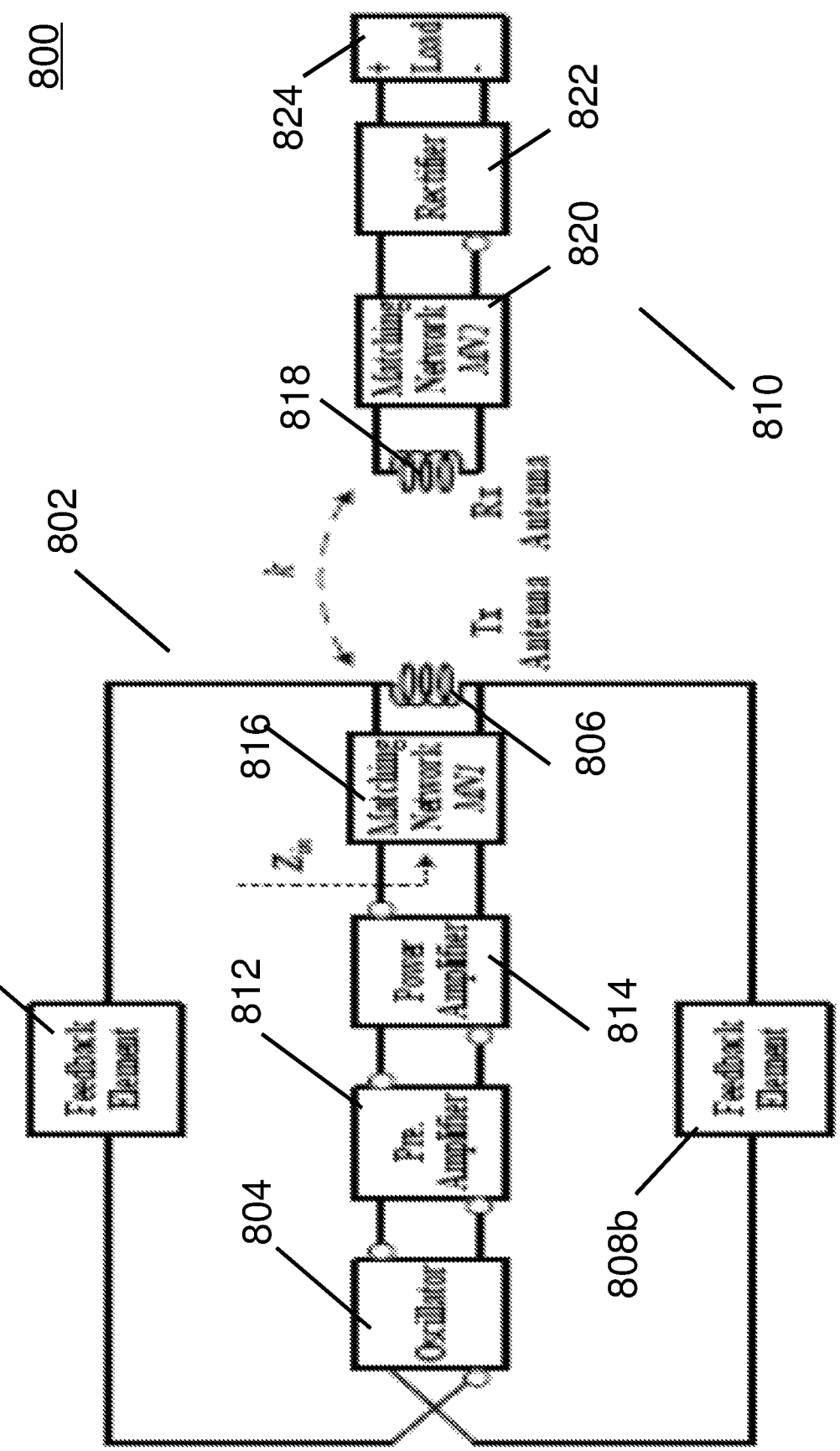
FIG. 8 is a block diagram of a power system including an injection-locked power oscillator and a receiver device according to various embodiments.

Instead of using a negative $g_m$ cell, a closed-loop with oscillator and power amplifier (PA) may be provided for the maximum efficiency tracking, as shown in FIG. 8.

FIG. 8 is a block diagram of a power system 800 including an injection-locked power oscillator 802 and a receiver device 810 according to various embodiments. The injection-locked power oscillator 802 may include an oscillator 804, and a transmitter antenna 806 configured to transmit power to the receiver device 810 via magnetic coupling based on the oscillator signal. The injection-locked power oscillator 802 may include a feedback arrangement 808a configured to generate a feedback to the oscillator and a further feedback arrangement 808b configured to generate a further feedback to the oscillator 804 based on a resonant frequency of the magnetic coupling between the transmitter antenna 806 and a receiver antenna 812 of the receiver device 810 such that the variable oscillation frequency of the oscillator 804 is adjusted towards the resonant frequency. The injection-locked power oscillator 802 may also include a pre-amplifier 812 connected to the oscillator 804, an amplifier 814 connected to the pre-amplifier 812, and a matching network 816 connected to the amplifier 814 and the transmitter antenna 806. The receiver device 810 may include a receiver antenna 818, a matching network 820 connected to the receiver antenna 818, a rectifier 822 connected to the matching network 820. The receiver device 810 may be configured to be coupled to a load 824.

The architecture of the transmitter device 802 may be fully differential. As highlighted above, the differential antenna voltage may be fed back to the oscillator source 804 in a cross-coupled fashion such that a zero-phase condition for the loop transmission is created for positive feedback. At startup, the source oscillator 804 may drive the power amplifier 814 at its open-loop frequency. However, as the power amplifier 814 increases the output power into the resonant tank formed by the matching network 816 and the antenna 806, the high power output of the power amplifier 814 may then injection lock the source oscillator 804 at the frequency of its high-Q output resonance. In other words, the closed-loop transmitter may form an efficient power oscillator with the oscillation frequency determined by the resonant frequency of the coupled antennas.

If that resonant frequency changes for any reason (e.g. due to over-coupling, foreign object proximity, or a change the transmission medium's dielectric constant), the power oscillator 802 may adjust its frequency automatically to follow the resonance. This feedback loop may maintain high $\eta_{PA}$ because changes in resonance frequency only feedback a frequency shift to the oscillator, while the same gate drive to the power amplifier 814 may be maintained by the preamplifier 812.

In contrast, negative gm cells may not decouple the frequency shift from the change in gate drive applied to the power amplifier as $Z_{in}$ varies, and hence their $\eta_{PA}$ may experience a greater non-linear variation which narrows their efficient operating range.

Figure 9:
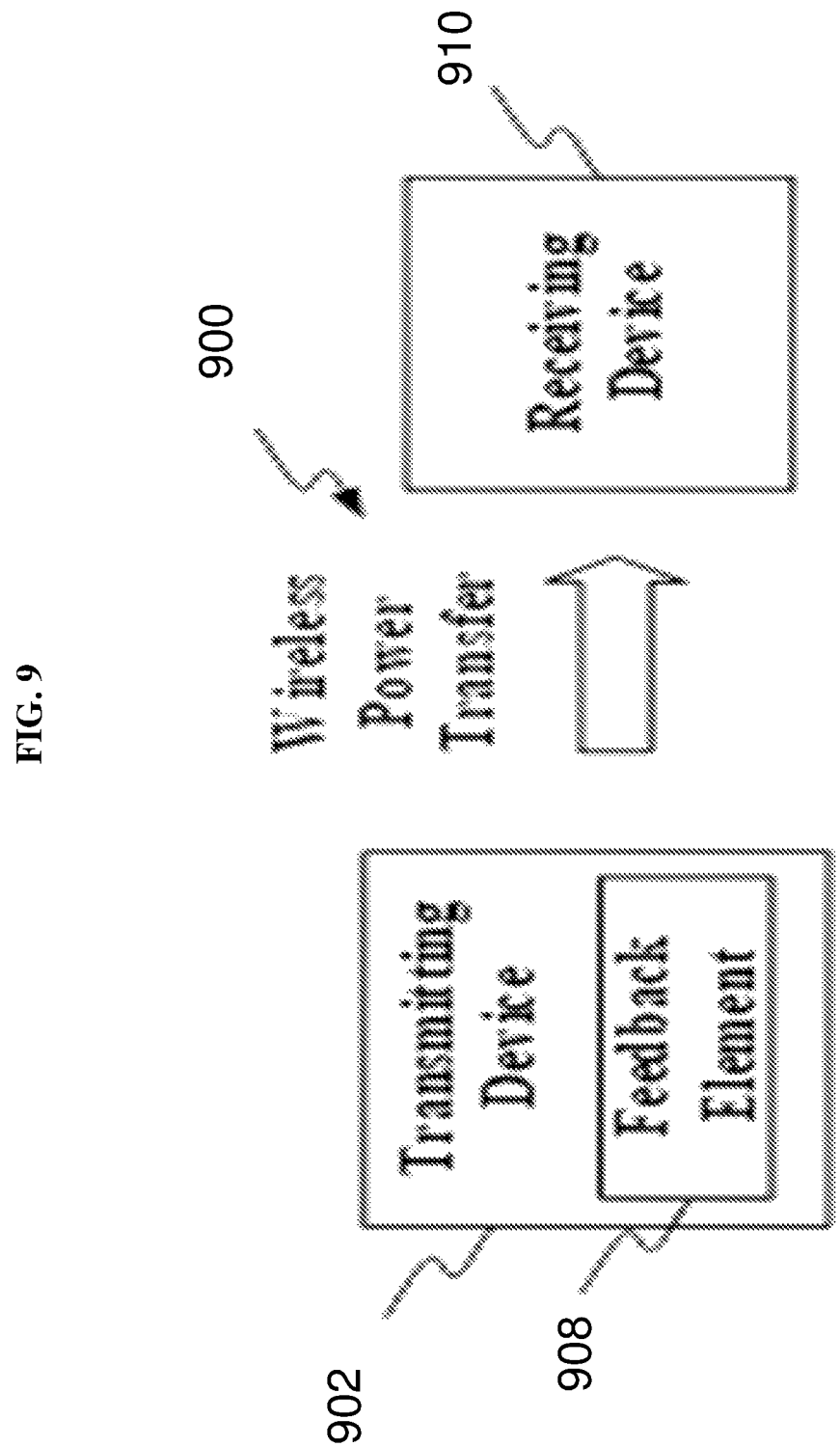
FIG. 9 shows a simplified block diagram of a wireless power transfer (WPT) system according to various embodiments.

FIG. 9 shows a simplified block diagram of a wireless power transfer (WPT) system 900 according to various embodiments. The system may include a transmitter device 902 and a receiver device 910. The power may be transmitted wirelessly from the transmitter device 902 to the receiver device 910. A feedback element or arrangement 908 may be used in the transmitter device 902.

Figure 10A:
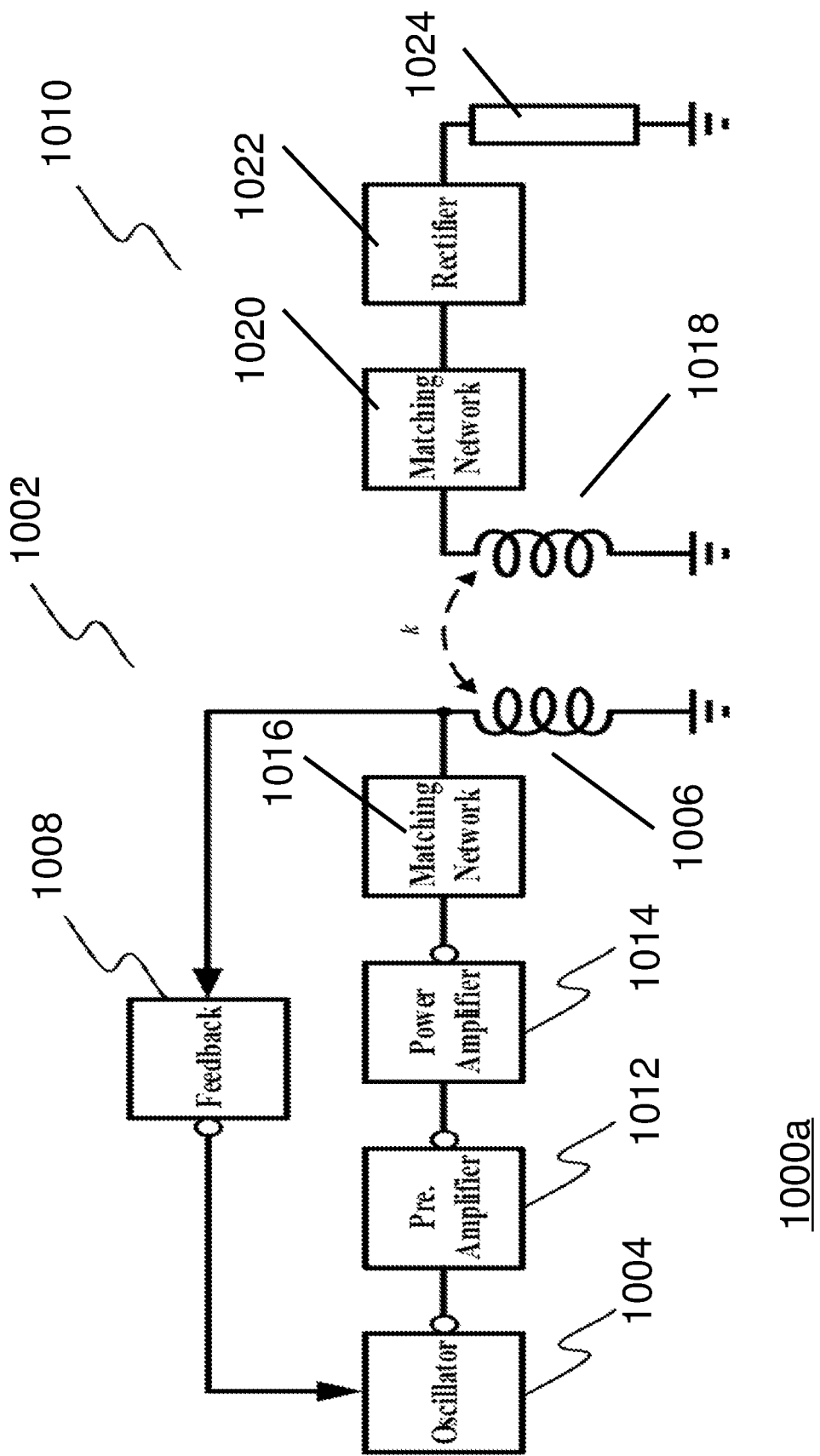
FIG. 10A is a schematic of a single-ended wireless power transfer system according to various embodiments.

FIG. 10A is a schematic of a single-ended wireless power transfer system 1000a according to various embodiments. The transmitting device 1002 may include an oscillator 1004, a pre-amplifier 1012, a power amplifier 1014, a transmitter matching network 1016, and a feedback arrangement or element 1008. The receiver device 1010 may include a receiver matching network 1020, and a rectifier 1022. The receiver device 1010 may be coupled to a load 1024.

The oscillator 1004 may generate the operation frequency, which is used to switch on or off the power amplifier 1014. The pre-amplifier 1012 between the oscillator 1004 and the power amplifier 1014 may be used to enhance the driving capability to the power amplifier 1014, leading to zero-voltage switching (ZVS) of the power amplifier 1014 for high efficiency power delivery. The matching network 1016 between the power amplifier 1014 and the transmitter antenna 1006 may be used for optimizing power transfer of coupled transmitter antenna 1006 and receiver antenna 1008, as well as for improving output power and power added efficiency (PAE) of the power amplifier 1014. The feedback arrangement or element 1008 may feed the output of the transmitter antenna 1006 back to the oscillator 1004. Due to the large swing of transmitter antenna output, the oscillator frequency may be injection-locked to the resonant frequency of the coupled transmitter antenna 1006 and receiver antenna 1018. The injection locking mechanism may lead to dynamically tracking of the resonant frequency of the coupled transmitter antenna 1006 and receiver antenna 1018, and may automatically control the operation frequency of the transmitter device 1002 to maintain high power transfer efficiency.

Figure 10B:
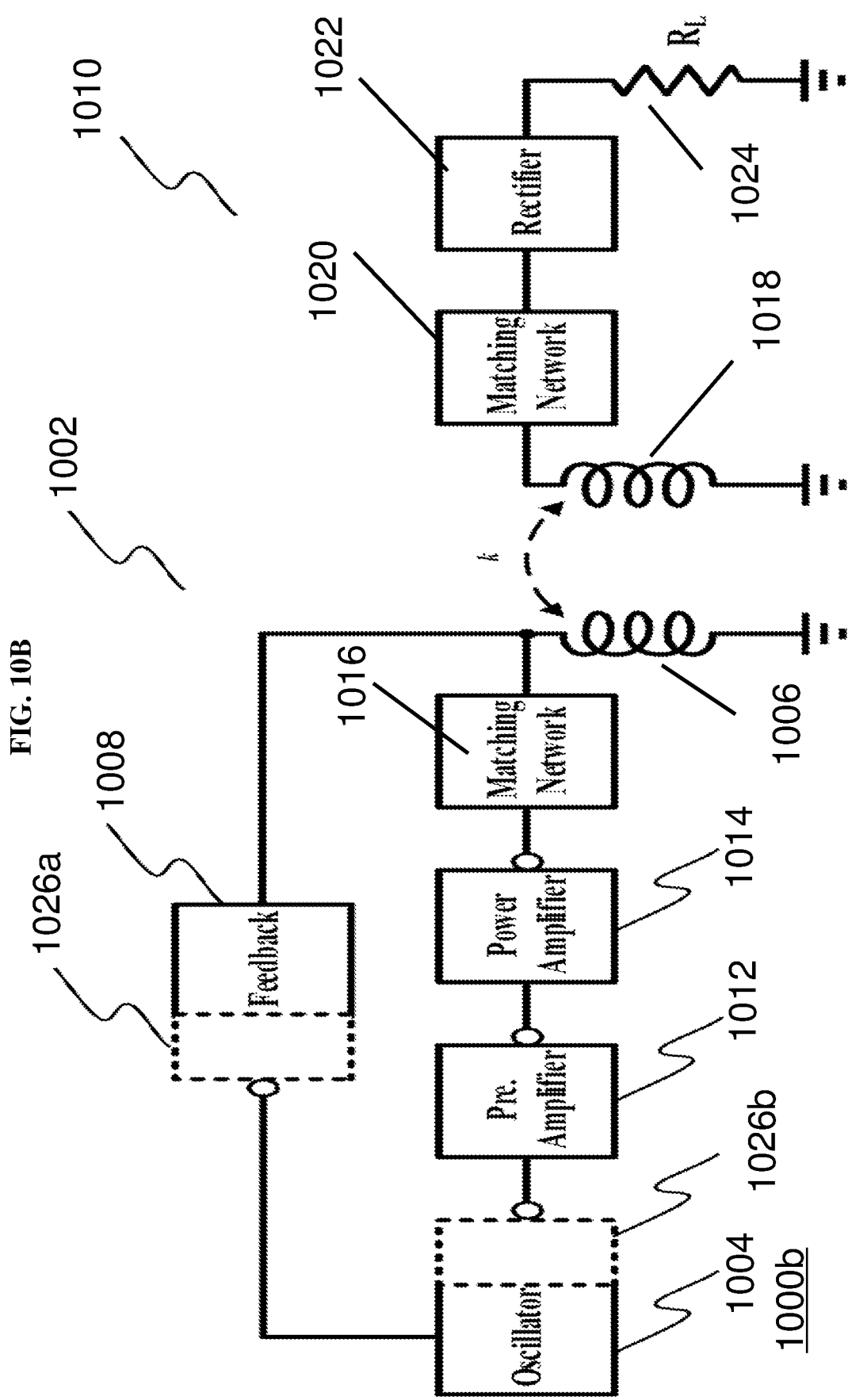
FIG. 10B is a schematic of another single-ended wireless power transfer system according to various embodiments.

FIG. 10B is a schematic of another single-ended wireless power transfer system 1000b according to various embodiments. The system 1000b may be similar to the system 1000a shown in FIG. 10A, but may further include two load isolators 1026a, 1026b. A load isolator may alternatively be referred to as "load isolation".

Load isolator 1026a may be arranged or connected between the feedback arrangement or element 1008 and the oscillator 1004, and may isolate the LC tank of oscillator 1004 and that formed by the transmitter antenna 1006 (and the matching network 1016), thus reducing load effects to both resonant LC tanks. Load isolator 1026b may be arranged or connected between the oscillator 1004 and the pre-amplifier 1012. The load isolation 1026b may reduce the load effects from the pre-amplifier 1012 to the oscillator 1004, and may improve the driving ability of the oscillator 1004. As the load isolators (e.g. 1026a, 1026b) may introduce additional phase inversion, the system or transmitter device may further include additional voltage inverters or phase-shifters between stages in order to sum to a zero-phase condition in the feedback loop for positive feedback.

Figure 11A:
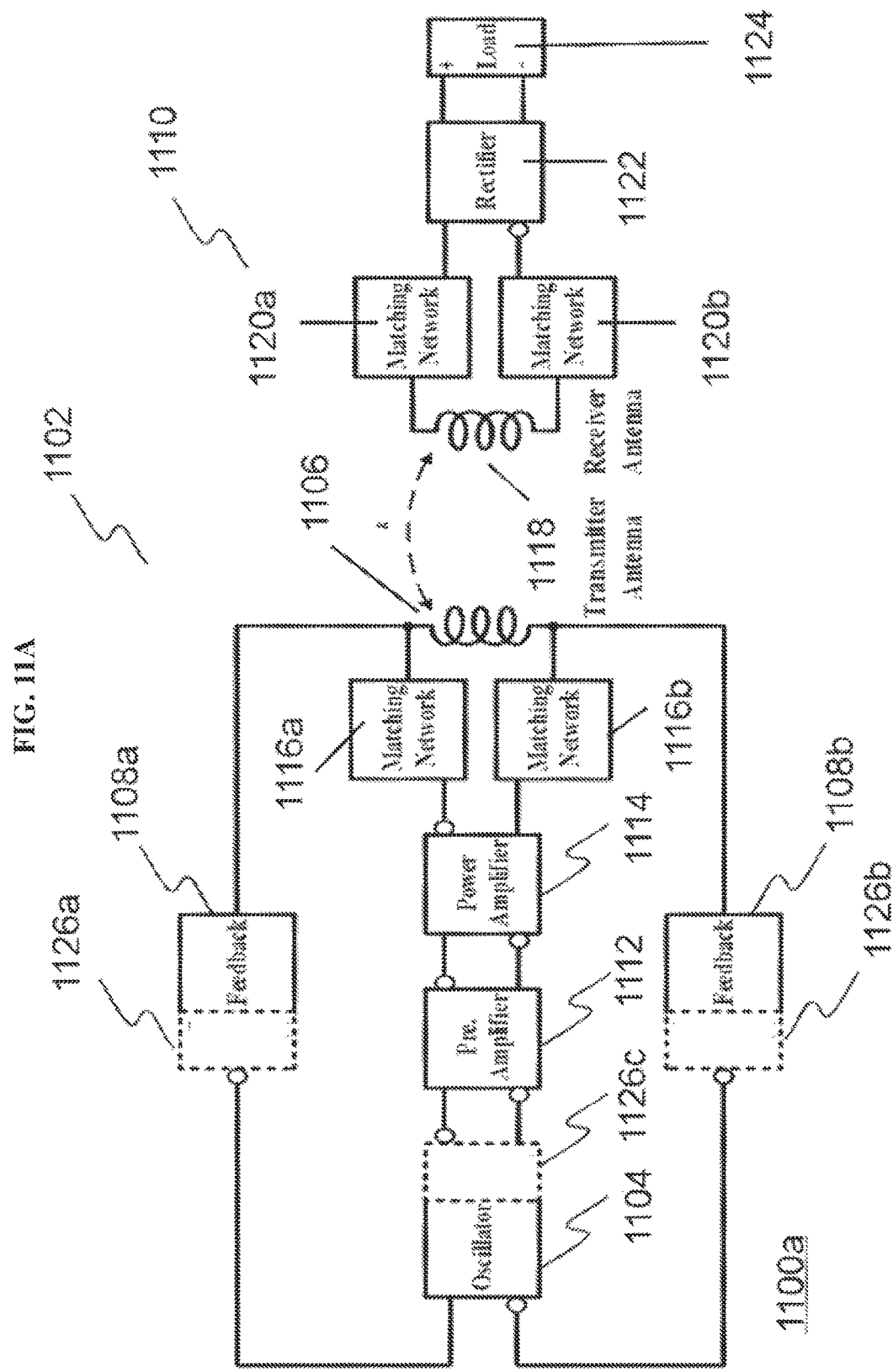
FIG. 11A is a schematic of a fully differential wireless power transfer system according to various embodiments.
Figure 11B:
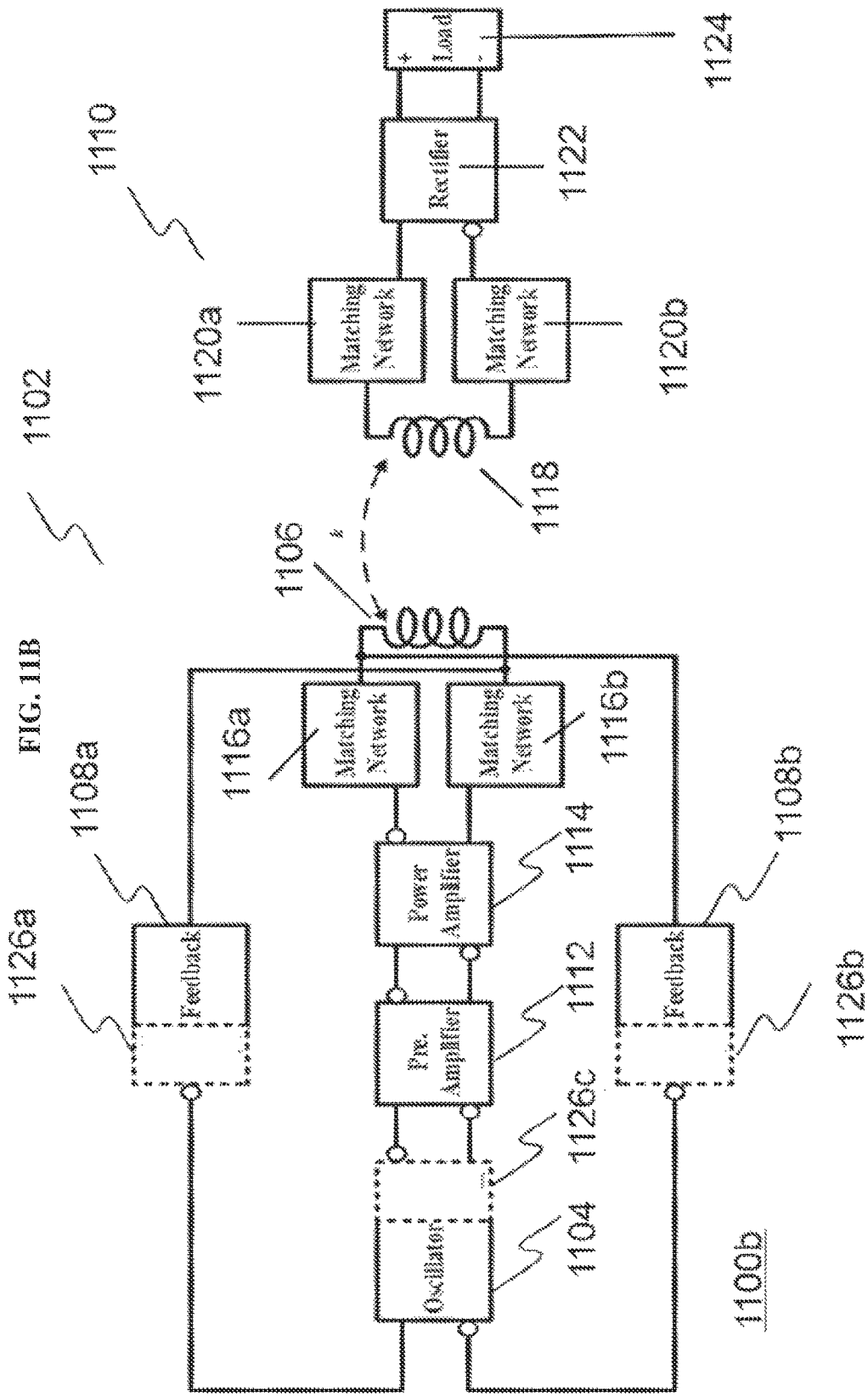
FIG. 11B is a schematic of another fully differential wireless power transfer system according to various embodiments.
Figure 11C:
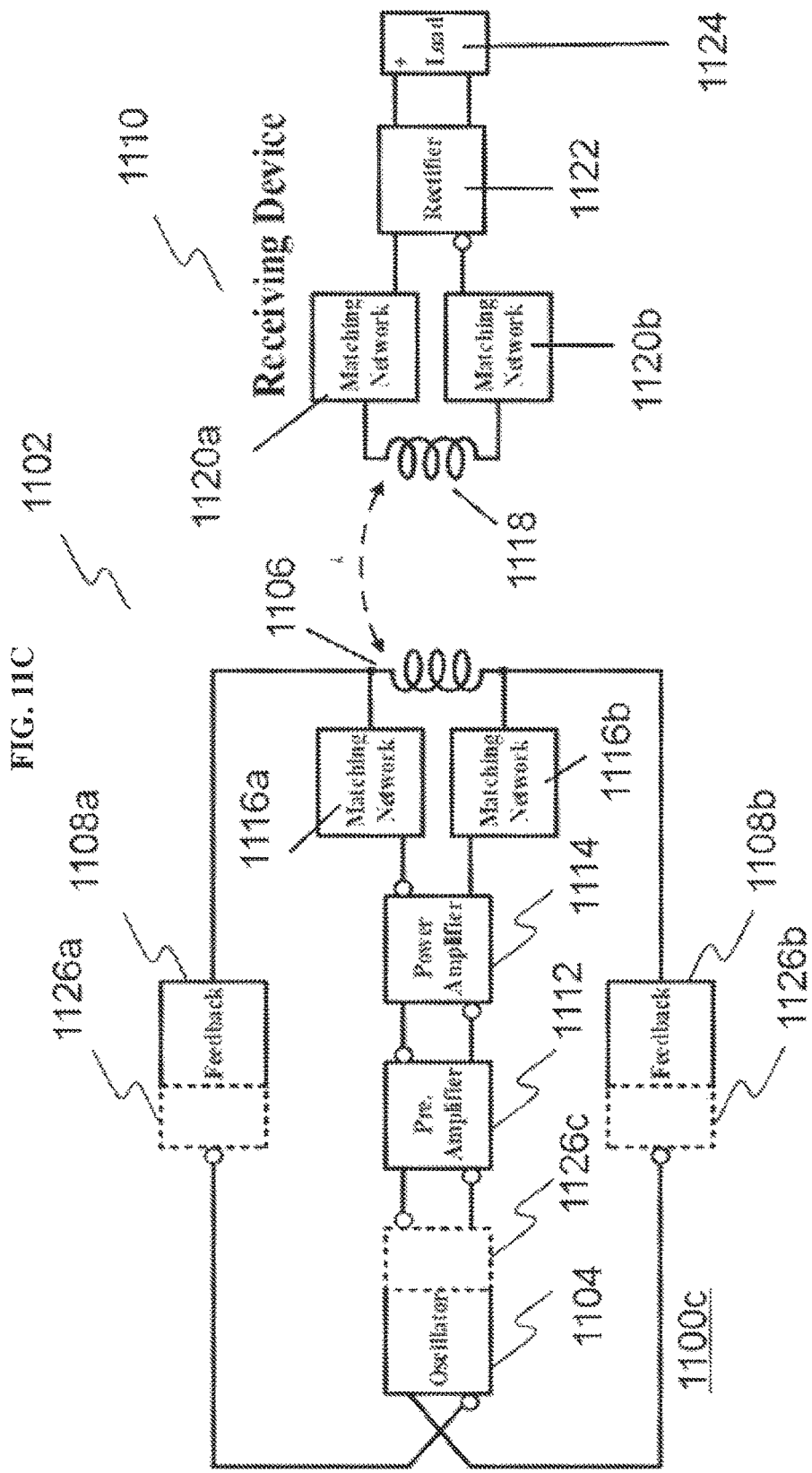
FIG. 11C is a schematic of yet another fully differential wireless power transfer system according to various embodiments.

FIGS. 11A-C illustrate fully differential versions of wireless power transfer system. FIG. 11A is a schematic of a fully differential wireless power transfer system 1100a according to various embodiments. FIG. 11B is a schematic of another fully differential wireless power transfer system 1100b according to various embodiments. FIG. 11C is a schematic of yet another fully differential wireless power transfer system 1100c according to various embodiments. The power transfer systems 1100a-c may each include a fully differential oscillator 1104, a fully differential preamplifier 1112, and a fully differential power amplifier 1114 with differential inputs and outputs.

In FIG. 11A, a first output of the power amplifier 1114 may be connected to a matching network 1116a, while a second output of the power amplifier 1114 may be connected to a further matching network 1116b. The matching networks 1116, 1116b may be connected to opposing ends of the transmitter antenna 1106. A differential matching network may be used instead of the two single-ended matching networks 1116a, 1116b shown in FIG. 11A. A first end of the transmitter antenna 1106 may be connected to feedback element or arrangement 1108a and a second end of the transmitter antenna 1106 may be connected to further feedback element or arrangement 1108b. The feedback element or arrangement 1108a may be connected to load isolator 1126a, while the further feedback element or arrangement 1108b may be connected to load isolator 1126b. The load isolator 1126a may be connected to a first input of the oscillator 1104, while the load isolator 1126b may be connected to a second input of the oscillator 1104. The outputs of the oscillator 1104 may be connected to load isolator 1126c, and the load isolator 1126c may be connected to the inputs of preamplifier 1112. The outputs of preamplifier 1112 may be connected to the inputs of amplifier 1112.

The receiver device 1110 may include a receiver antenna 1118, a matching network 1120a connected to a first end of the receiver antenna 1118, and a further matching network 1120b connected to a second end of the receiver antenna 1118. A first input of the rectifier 1122 may be connected to the matching network 1120a, while a second input of the rectifier 1122 may be connected to the further matching network 1120b. A differential matching network may be used instead of the two single-ended matching networks 1120a, 1120b. The outputs of the rectifier 1122 may be configured to be coupled to a load 1124. FIG. 11A shows the differential version of the wireless power transfer system 1100a without cross-coupling. A first end of the feedback element or arrangement 1108a may be coupled to a first end of the transmitter antenna 1106, and a second end of the feedback element or arrangement 1108a may be coupled (via load isolators 1126a) to the first input (e.g. positive input) of the oscillator 1104. A first end of the further feedback element or arrangement 1108b may be coupled to a second end of the transmitter antenna 1106, and a second end of the further feedback element or arrangement 1108b may be coupled (via load isolators 1126b) to the second input (e.g. negative input) of the oscillator 1104.

FIG. 11B shows the differential version of the wireless power transfer system 1100b with cross-coupling at the inputs of the feedback elements or arrangements 1108a-b. As shown in FIG. 11B, a first end of the feedback element or arrangement 1108a may be coupled to a second end of the transmitter antenna 1106, and a second end of the feedback element or arrangement 1108a may be coupled (via load isolators 1126a) to the first input (e.g. positive input) of the oscillator 1104. A first end of the further feedback element or arrangement 1108b may be coupled to a first end of the transmitter antenna 1106, and a second end of the further feedback element or arrangement 1108b may be coupled (via load isolators 1126b) to the second input (e.g. negative input) of the oscillator 1104. The remaining features of the system 1100b may be similar to the system 1100a shown in FIG. 11A.

FIG. 11C shows the differential version of the wireless power transfer system 1100c with cross-coupling at the outputs of the feedback elements or arrangements 1108a-b. As shown in FIG. 11C, a first end of the feedback element or arrangement 1108a may be coupled to a first end of the transmitter antenna 1106, and a second end of the feedback element or arrangement 1108a may be coupled (via load isolators 1126a) to the second input (e.g. negative input) of the oscillator 1104. A first end of the further feedback element or arrangement 1108b may be coupled to a second end of the transmitter antenna 1106, and a second end of the further feedback element or arrangement 1108b may be coupled (via load isolators 1126b) to the first input (e.g. positive input) of the oscillator 1104. The remaining features of the system 1100c may be similar to the system 1100a shown in FIG. 11A.

Figure 12A:
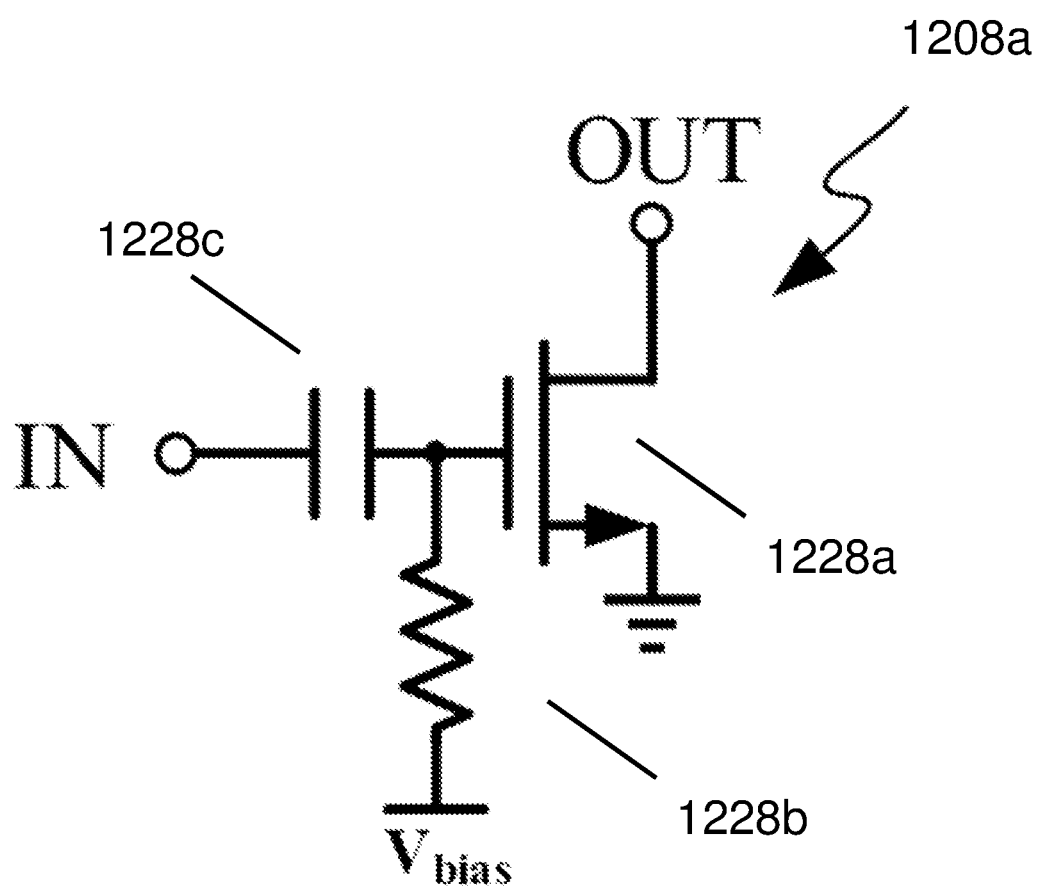
FIG. 12A is a schematic illustrating a feedback arrangement or further feedback arrangement according to various embodiments.

FIG. 12A is a schematic illustrating a feedback arrangement or further feedback arrangement 1208a according to various embodiments. IN may be connected to the transmitter antenna, and OUT may be connected to the oscillator (or load isolator).

The feedback arrangement or further feedback arrangement 1208a may include a feedback transistor 1228a having a control electrode, a first controlled electrode connected to the oscillator (or load isolator), and a second controlled electrode configured to be connected to ground. The feedback arrangement or further feedback arrangement 1208a may also include a feedback resistor 1228b having a first end connected to the control electrode of the feedback transistor 1228a, and a second end configured to be connected to a feedback bias voltage ($V_{bias}$). The feedback arrangement or further feedback arrangement 1208a may additionally include a feedback capacitor 1228c having a first end connected to the control electrode of the feedback transistor 1228a, and a second end connected to the transmitter antenna.

Figure 12B:
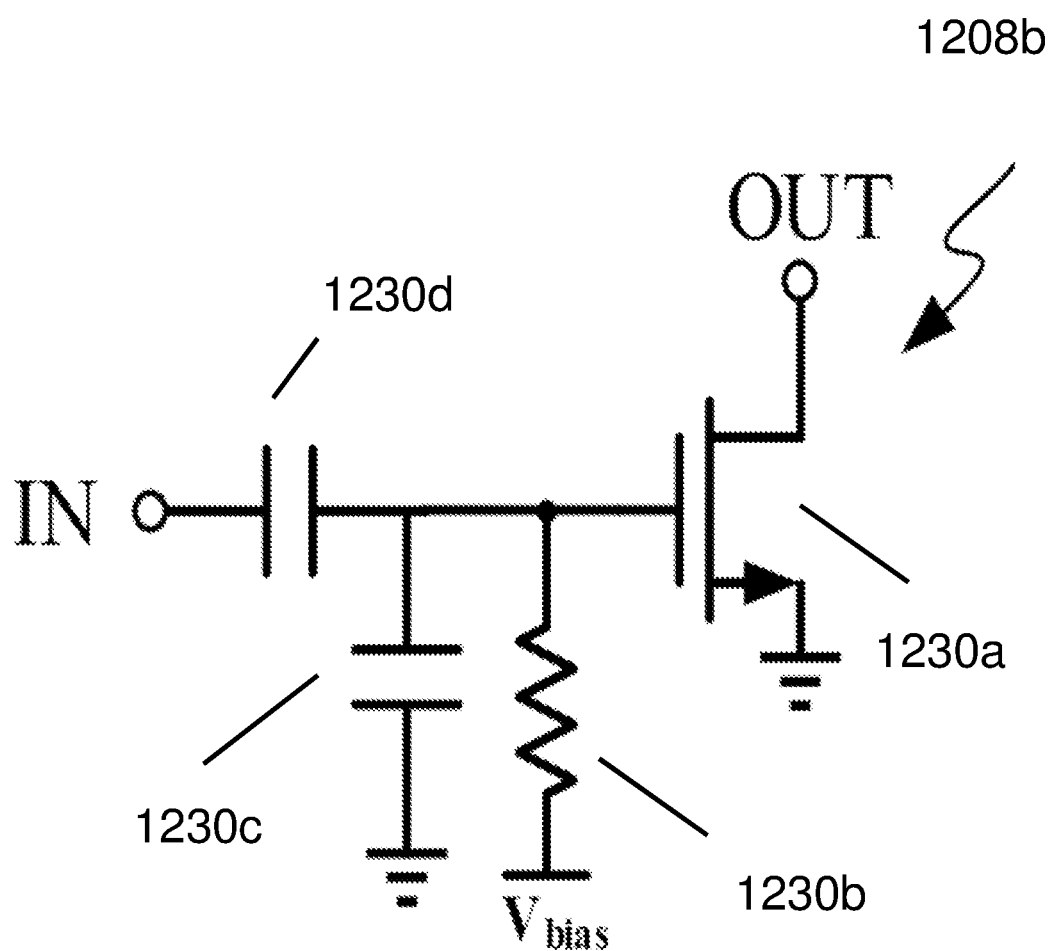
FIG. 12B is a schematic illustrating a feedback arrangement or further feedback arrangement according to various other embodiments.

FIG. 12B is a schematic illustrating a feedback arrangement or further feedback arrangement 1208b according to various other embodiments. IN may be connected to the transmitter antenna, and OUT may be connected to the oscillator (or load isolator).

The feedback arrangement or further feedback arrangement 1208b may include a feedback transistor 1230a having a control electrode, a first controlled electrode connected to the oscillator (or load isolator), and a second controlled electrode configured to be connected to ground. The feedback arrangement or further feedback arrangement 1208b may also include a feedback resistor 1230b having a first end connected to the control electrode of the feedback transistor 1230a, and a second end configured to be connected to a feedback bias voltage ($V_{bias}$). The feedback arrangement or further feedback arrangement 1208b may further include a first feedback capacitor 1230c having a first end connected to the control electrode of the feedback transistor 1230a, and a second end configured to be connected to ground. The feedback arrangement or further feedback arrangement 1208b may additionally include a second feedback capacitor 1230d having a first end connected to the control electrode of the feedback transistor 1230a, and a second end connected to the transmitter antenna.

Figure 12C:
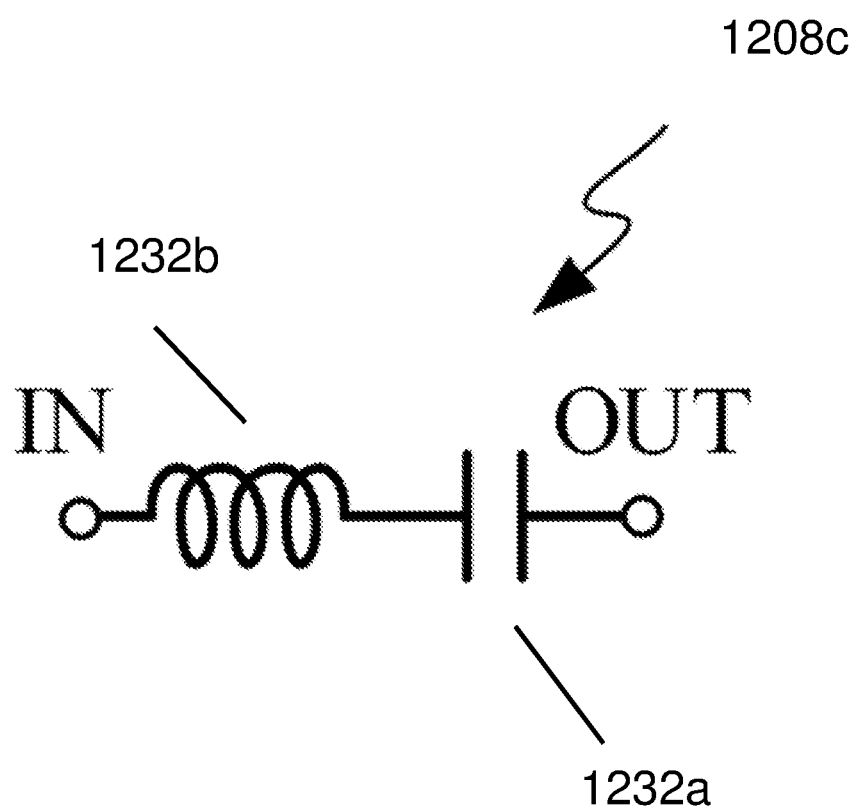
FIG. 12C is a schematic illustrating a feedback arrangement or further feedback arrangement according to various other embodiments.

FIG. 12C is a schematic illustrating a feedback arrangement or further feedback arrangement 1208c according to various other embodiments. IN may be connected to the transmitter antenna, and OUT may be connected to the oscillator (or load isolator).

The feedback arrangement or further feedback arrangement 1208c may include a feedback capacitor 1232a having a first end connected to the oscillator (or load isolator), and a second end. The feedback arrangement or further feedback arrangement 1208c may also include a feedback inductor 1232b having a first end connected to the second end of the feedback capacitor 1232a, and a second end connected to the transmitter antenna.

Figure 12D:
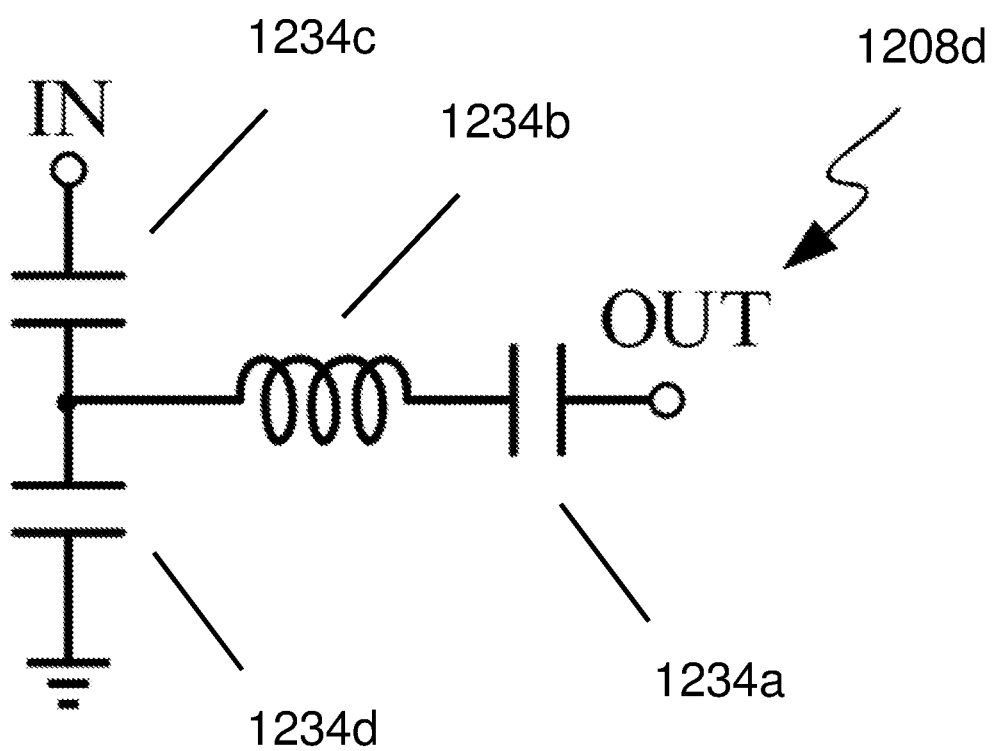
FIG. 12D is a schematic illustrating a feedback arrangement or further feedback arrangement according to various other embodiments.

FIG. 12D is a schematic illustrating a feedback arrangement or further feedback arrangement 1208d according to various other embodiments. IN may be connected to the transmitter antenna, and OUT may be connected to the oscillator (or load isolator).

The feedback arrangement or further feedback arrangement 1208d may include a first feedback capacitor 1234a having a first end connected to the oscillator (or load isolator), and a second end. The feedback arrangement or further feedback arrangement 1208d may also include a feedback inductor 1234b having a first end connected to the second end of the first feedback capacitor 1234a, and a second end. The feedback arrangement or further feedback arrangement 1208d may further include a second feedback capacitor 1234c having a first end connected to the second end of the feedback inductor 1234b, and a second end connected to the transmitter antenna. The feedback arrangement or further feedback arrangement 1208d may additionally include a third feedback capacitor 1234d having a first end connected to the second end of the feedback inductor 1234b, and a second end configured to be connected to ground.

The arrangements 1208a, 1208b shown in FIGS. 12A-B may be examples of active feedback arrangements (feedback arrangements using or including active elements), while the arrangements 1208c, 1208d shown in FIGS. 12C-D may be examples of passive feedback arrangements (feedback using only passive elements). A capacitor divider as in FIGS. 12B, 12D may be used to reduce the injection signal to avoid breakdown of transistors. The active feedback arrangements may also provide the load isolator between the feedback arrangement and the oscillator with additional phase inversion.

Other feedback arrangements or further feedback arrangements may also be included in various other embodiments.

Figure 13A:
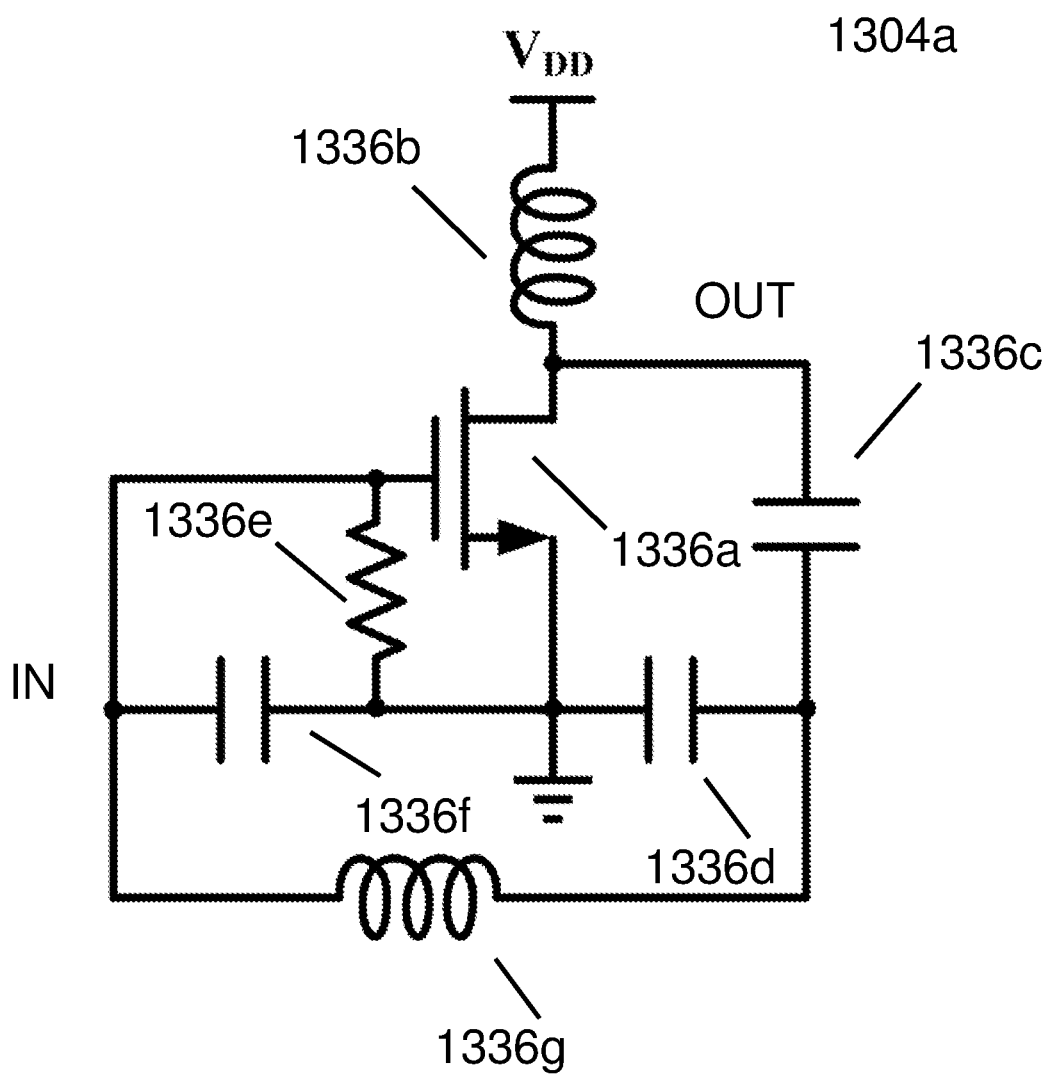
FIG. 13A is a schematic illustrating an oscillator according to various embodiments.

FIG. 13A is a schematic illustrating an oscillator 1304a according to various embodiments. The oscillator 1304a may include an oscillator transistor 1336a including a control electrode, a first controlled electrode, and a second controlled electrode configured to be connected to ground. The oscillator 1304a may also include a first oscillator inductor 1336b having a first end connected to the first controlled electrode of the oscillator transistor 1336a, and a second end configured to be connected to an oscillator supply voltage ($V_{DD}$). The oscillator 1304a may further include a first oscillator capacitor 1336c having a first end connected to the first controlled electrode of the oscillator transistor 1336a, and a second end. The oscillator 1304a may additionally include a second oscillator capacitor 1336d having a first end connected to the second controlled electrode of the oscillator transistor 1336a, and a second end connected to the second end of the first oscillator capacitor 1336c. The oscillator 1304a may include an oscillator resistor 1336e having a first end connected to the control electrode of the oscillator transistor 1336a, and a second end connected to the second controlled electrode of the oscillator transistor 1336a. The oscillator 1304a may additionally include a third oscillator capacitor 1336f having a first end connected to the control electrode of the oscillator transistor 1336a, and a second end connected to the second controlled electrode of the oscillator transistor 1336a. The oscillator 1304a may also include a second oscillator inductor 1336g having a first end connected to the control electrode of the oscillator transistor 1336a and a second end connected to the second end of the first oscillator capacitor 1336c. The oscillator 1304a may be a single-ended oscillator. The oscillator 1304a may be coupled to the feedback arrangement or load isolator via connection point IN. The oscillator 1304a may be coupled to the load isolator, preamplifier or amplifier via connection point OUT.

Figure 13B:
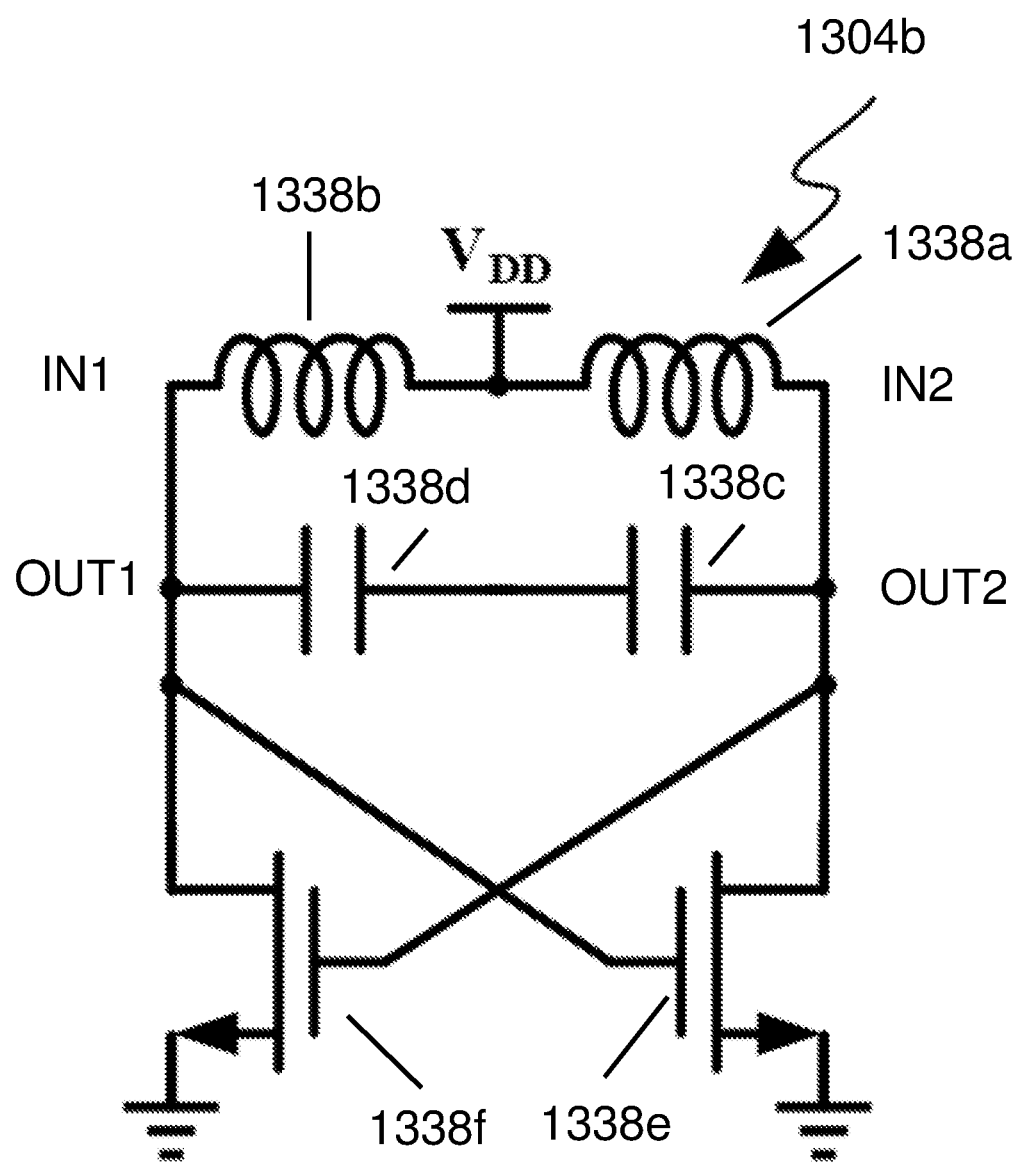
FIG. 13B is a schematic illustrating an oscillator according to various other embodiments.

FIG. 13B is a schematic illustrating an oscillator 1304b according to various other embodiments. The oscillator 1304b may include a first oscillator inductor 1338a having a first end configured to be connected to an oscillator supply voltage ($V_{DD}$) and a second end. The oscillator 1304b may also include a second oscillator inductor 1338b having a first end connected to the first end of the first oscillator inductor 1338a, and a second end. The oscillator 1304b may also include a first oscillator capacitor 1338c having a first end, and a second end connected to the second end of the first oscillator inductor 1338a. The oscillator 1304b may additionally include a second oscillator capacitor 1338d having a first end connected to the first end of the first oscillator capacitor 1338c, and a second end connected to the second end of the second oscillation inductor 1338b. The oscillator 1304b may also include a first oscillator transistor 1338e having a control electrode connected to the second end of the second oscillator inductor 1338d, a first controlled electrode connected to the second end of the first oscillator inductor 1338c, and a second controlled electrode configured to be connected to ground. The oscillator 1304b may additionally include a second oscillator transistor 1338f having a control electrode connected to the second end of the first oscillator inductor 1338c, a first controlled electrode connected to the second end of the second oscillator inductor 1338d, and a second controlled electrode configured to be connected to ground. The oscillator 1304b may be a differential oscillator.

The oscillator 1304b may be coupled to the feedback arrangement or load isolator via connection point IN1 and further feedback arrangement or load isolator via connection point IN2. The oscillator 1304b may be coupled to the load isolator, preamplifier or amplifier via connection points OUT1, OUT2.

Figure 13C:
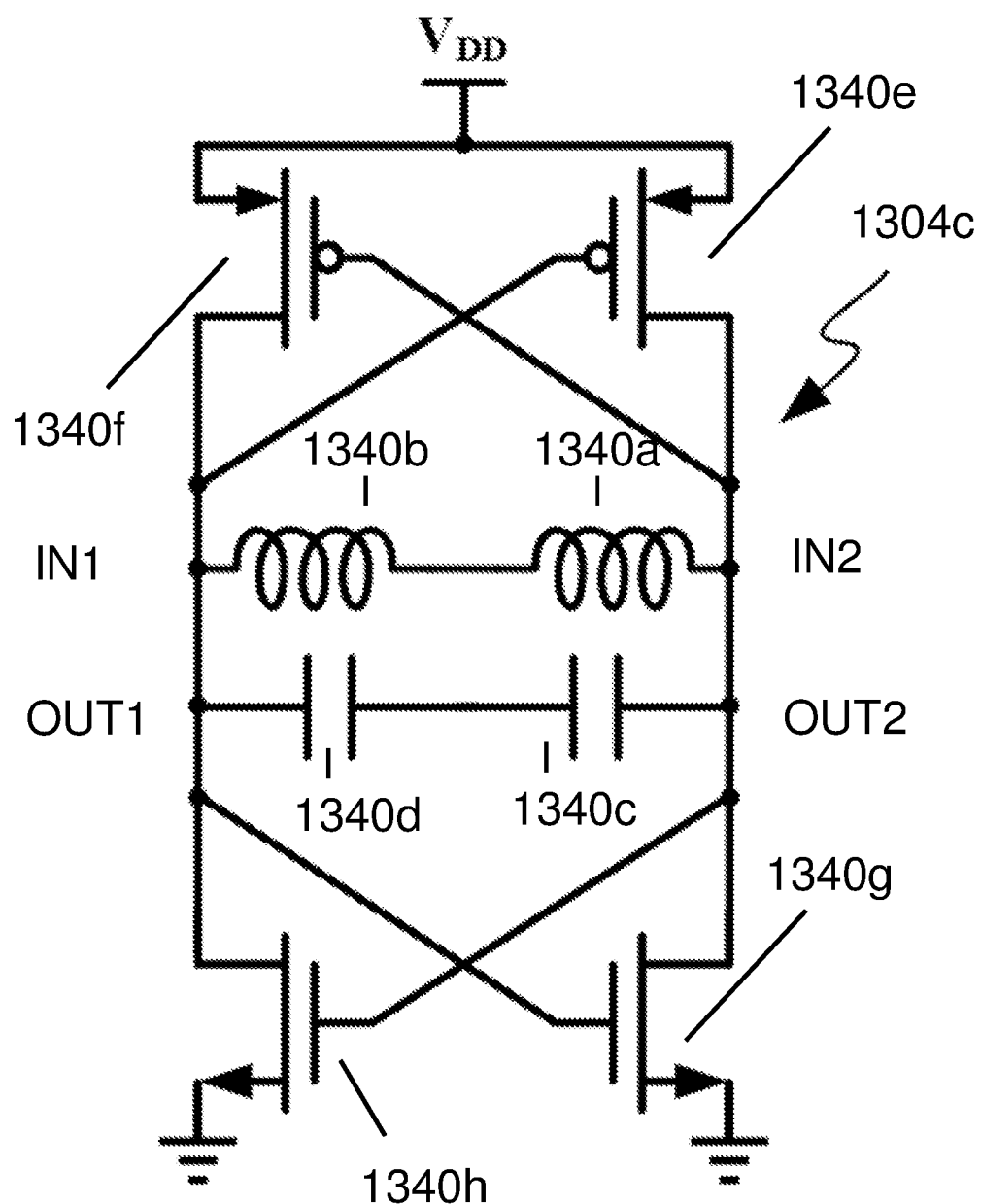
FIG. 13C is a schematic illustrating an oscillator according to various other embodiments.

FIG. 13C is a schematic illustrating an oscillator 1304c according to various other embodiments. The oscillator 1304c may include a first oscillator inductor 1340a having a first end, and a second end. The oscillator 1304c may also include a second oscillator inductor 1340b having a first end connected to the first end of the first oscillator inductor 1340a, and a second end. The oscillator 1304c may additionally include a first oscillator capacitor 1340c having a first end, and a second end connected to the second end of the first oscillator inductor 1340a. The oscillator 1304c may also include a second oscillator capacitor 1340d having a first end connected to the first end of the first oscillator capacitor 1340c, and a second end connected to the second end of the second oscillator inductor 1340b. The oscillator 1304c may further include a first oscillator transistor 1340e having a control electrode connected to the second end of the second oscillator inductor 1340b, a first controlled electrode connected to the second end of the first oscillator inductor 1340a, and a second controlled electrode configured to be connected to an oscillator supply voltage ($V_{DD}$). The oscillator 1304c may include a second oscillator transistor 1340f having a control electrode connected to the second end of the first oscillator inductor 1340a, a first controlled electrode connected to the second end of the second oscillator inductor 1340b, and a second controlled electrode configured to be connected to the oscillator supply voltage. The oscillator 1304c may also include a third oscillator transistor 1340g having a control electrode connected to the second end of the second oscillator inductor 1340b, a first controlled electrode connected to the second end of the first oscillator inductor 1340a, and a second controlled electrode configured to be connected to ground. The oscillator 1340d may further include a fourth oscillator transistor 1340h having a control electrode connected to the second end of the first oscillator inductor 1340a, a first controlled electrode connected to the second end of the second oscillator inductor 1340h, and a second controlled electrode configured to be connected to ground. The oscillator 1304c may be a differential oscillator. The oscillator 1304c may be coupled to the feedback arrangement or load isolator via connection point IN1 and further feedback arrangement or load isolator via connection point IN2. The oscillator 1304c may be coupled to the load isolator, preamplifier or amplifier via connection points OUT1, OUT2.

Figure 13D:
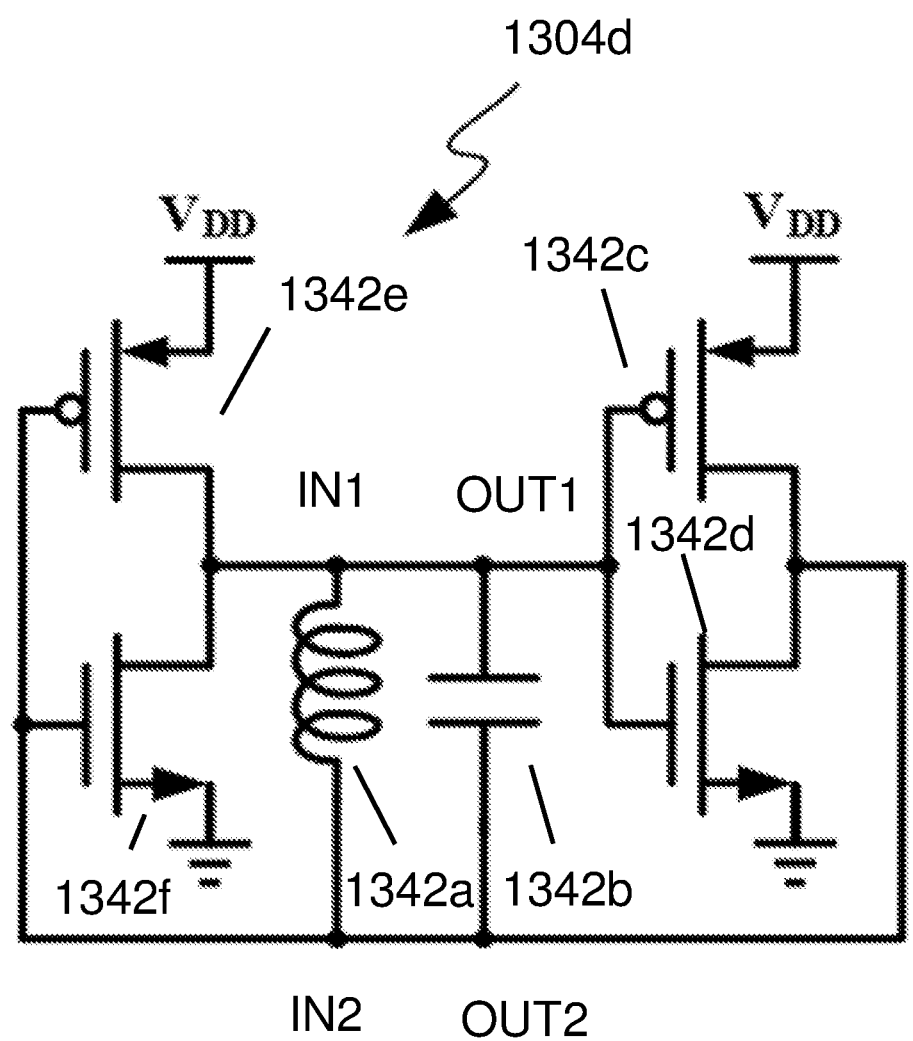
FIG. 13D is a schematic illustrating an oscillator according to various other embodiments.

FIG. 13D is a schematic illustrating an oscillator 1304d according to various other embodiments. The oscillator 1304d may include an oscillator inductor 1342a having a first end and a second end. The oscillator 1304d may also include an oscillator capacitor 1342b having a first end connected to the first end of the oscillator inductor 1342a, and a second end connected to the second end of the oscillator inductor 1342a. The oscillator 1304d may also include a first oscillator transistor 1342c having a control electrode connected to the second end of the oscillator inductor 1342a, a first controlled electrode connected to the first end of the oscillator inductor 1342a, and a second controlled electrode configured to be connected to an oscillator supply voltage ($V_{DD}$). The oscillator 1304d may further include a second oscillator transistor 1342d having a control electrode connected to the second end of the oscillator inductor 1342a, a first controlled electrode connected to the first end of the oscillator inductor 1342a, and a second controlled electrode configured to be connected to ground. The oscillator 1304d may additionally include a third oscillator transistor 1342e having a control electrode connected to the first end of the oscillator inductor 1342a, a first controlled electrode connected to the second end of the oscillator inductor 1342a, and a second controlled electrode configured to be connected to the oscillator supply voltage. The oscillator 1304d may further include a fourth oscillator transistor 1342f having a control electrode connected to the first end of the oscillator inductor 1342a, a first controlled electrode connected to the second end of the oscillator inductor 1342a, and a second controlled electrode configured to be connected to ground. The oscillator 1304d may be a differential oscillator. The oscillator 1304d may be coupled to the feedback arrangement or load isolator via connection point IN1 and further feedback arrangement or load isolator via connection point IN2. The oscillator 1304d may be coupled to the load isolator, preamplifier or amplifier via connection points OUT1, OUT2.

Figure 13E:
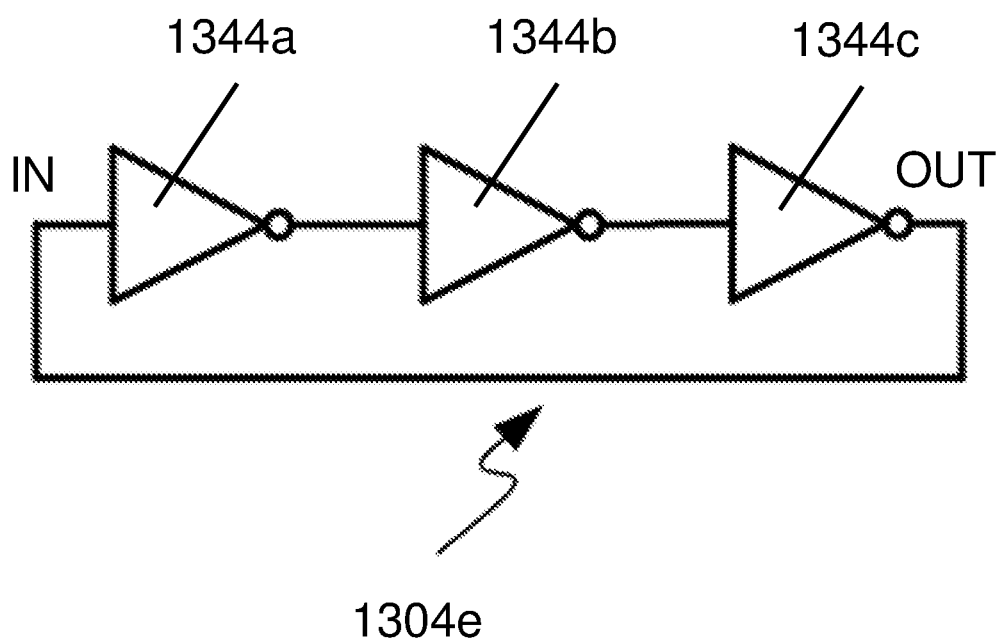
FIG. 13E is a schematic illustrating an oscillator according to various other embodiments.

FIG. 13E is a schematic illustrating an oscillator 1304e according to various other embodiments. The oscillator 1304e may include a first oscillator inverter 1344a having an input and an output. The oscillator 1304e may also include a second oscillator inverter 1344b having an input connected to the output of the first oscillator inverter 1344a, and an output. The oscillator 1304e may additionally include a third oscillator inverter 1344c having an input connected to the output of the second oscillator inverter 1344b, and an output connected to the input of the first oscillator inverter 1344a. The oscillator 1304e may be a ring oscillator. The oscillator 1304e may be a single-ended oscillator. The oscillator 1304e may be coupled to the feedback arrangement or load isolator via connection point IN. The oscillator 1304e may be coupled to the load isolator, preamplifier or amplifier via connection point OUT.

Figure 13F:
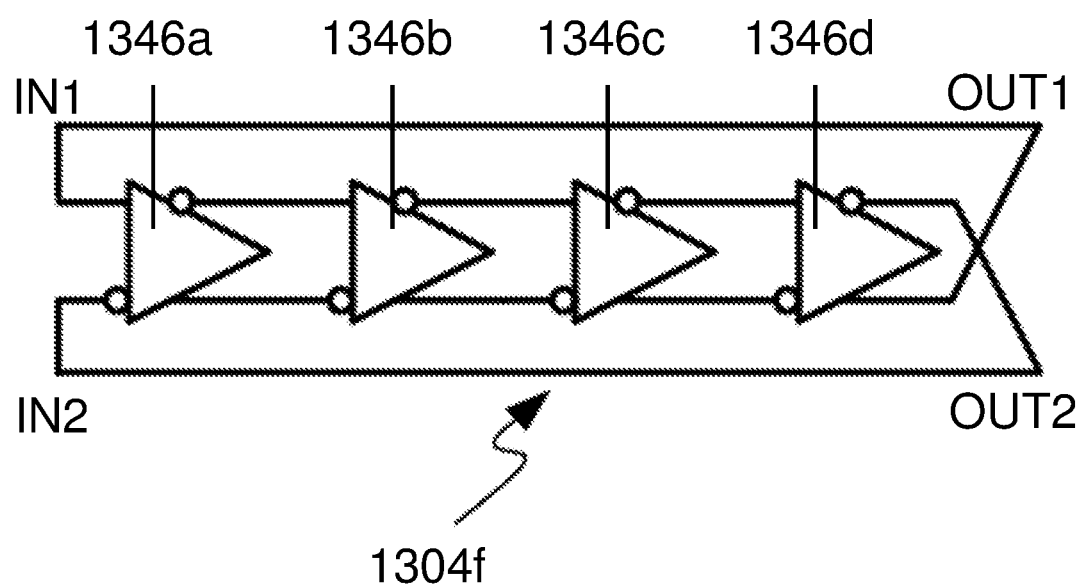
FIG. 13F is a schematic illustrating an oscillator according to various other embodiments.

FIG. 13F is a schematic illustrating an oscillator 1304f according to various other embodiments. The oscillator 1304f may include a first amplifier 1346a having a non-inverting input, an inverting input, a non-inverting output, and an inverting output. The oscillator 1304f may also include a second amplifier 1346b having a non-inverting input connected to the inverting output of the first amplifier 1346a, an inverting input connected to the non-inverting output of the first amplifier 1346a, a non-inverting output, and an inverting output. The oscillator 1304f may additionally include a third amplifier 1346c having a non-inverting input connected to the inverting output of the second amplifier 1346b, an inverting input connected to the non-inverting output of the second amplifier 1346b, a non-inverting output, and an inverting output. The oscillator 1304f may additionally include a fourth amplifier 1346d having a non-inverting input connected to the inverting output of the third amplifier 1346c, an inverting input connected to the non-inverting output of the third amplifier 1346c, a non-inverting output connected to the non-inverting input of the first amplifier 1342a, and an inverting output connected to the inverting input of the first amplifier 1342. The oscillator 1304f may be a ring oscillator. The oscillator 1304f may be a differential oscillator. The oscillator 1304f may be coupled to the feedback arrangement or load isolator via connection point IN1 and further feedback arrangement or load isolator via connection point IN2. The oscillator 1304f may be coupled to the load isolator, preamplifier or amplifier via connection points OUT1, OUT2.

Other oscillators may also be included in various other embodiments. The oscillator may be used to generate the operation frequency, which can be injection locked to the resonant frequency of the coupled transmitter and receiver antennas.

Figure 14A:
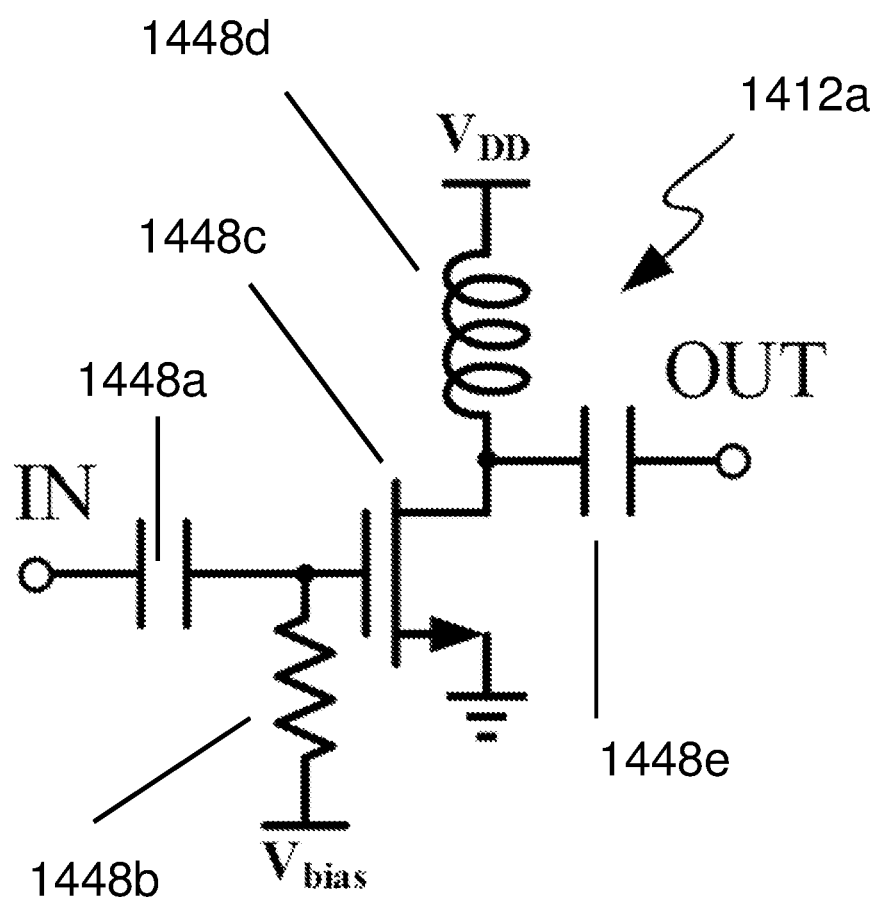
FIG. 14A is a schematic illustrating a preamplifier according to various embodiments.

FIG. 14A is a schematic illustrating a preamplifier 1412a according to various embodiments. The point IN may be coupled to an oscillator or a load isolator, while the point OUT may be coupled to a power amplifier. The preamplifier 1412a may include a first pre-amplification capacitor 1448a having a first end, and a second end. The preamplifier 1412a may also include a pre-amplification resistor 1448b having a first end connected to the second end of the first pre-amplification capacitor, and a second end configured to be connected to a pre-amplification bias voltage. The first end of the first pre-amplification capacitor 1148a may be connected to the oscillator or load isolator. The preamplifier 1412a may further include a pre-amplification transistor 1448c having a control electrode connected to the second end of the pre-amplification capacitor 1448a, a first controlled electrode, and a second controlled electrode configured to be connected to ground. The preamplifier 1412a may also include a pre-amplification inductor 1448d having a first end connected to the first controlled electrode of the pre-amplification transistor 1448c, and a second end configured to be connected to a preamplification supply voltage. The preamplifier 1412a may additionally include a second pre-amplification capacitor 1448e having a first end connected to the first end of the pre-amplification inductor 1448d and a second end connected to the power amplifier. The preamplifier 1412a may be based on a common-source single-stage amplifier, and by tuning the inductor and capacitor at output node, high gain may be achieved at the operation frequency.

Figure 14B:
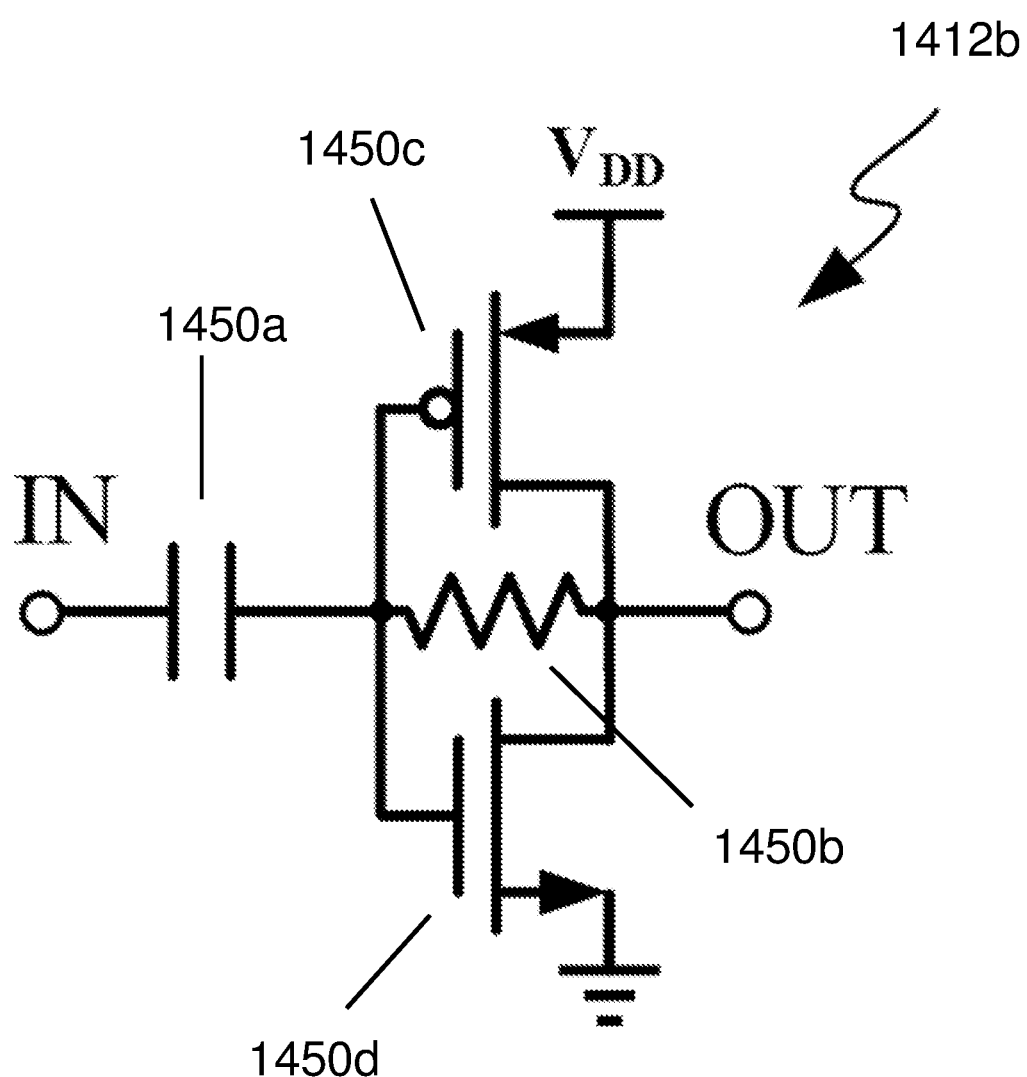
FIG. 14B is a schematic illustrating a preamplifier according to various other embodiments.

FIG. 14B is a schematic illustrating a preamplifier 1412b according to various other embodiments. The point IN may be coupled to an oscillator or a load isolator, while the point OUT may be coupled to a power amplifier. The preamplifier 1412b may include a pre-amplification capacitor 1450a having a first end, and a second end. The first end of the pre-amplification capacitor 1450a may be coupled to the oscillator or load isolator. The preamplifier 1412b may also include a pre-amplification resistor 1450b having a first end connected to the second end of the pre-amplification capacitor 1450a, and a second end connected to the power amplifier. The preamplifier 1412b may also include a first pre-amplification transistor 1450c having a control electrode connected to the second end of the pre-amplification capacitor 1450a, a first controlled electrode connected to the second end of the pre-amplification resistor 1450b, and a second controlled electrode configured to be connected to a pre-amplification supply voltage. The preamplifier 1412b may further include a second pre-amplification transistor 1450d having a control electrode connected to the second end of the pre-amplification capacitor 1450a, a first controlled electrode connected to the second end of the pre-amplification resistor 1450b, and a second controlled electrode configured to be connected to ground. The preamplifier 1412b may be an inverter-based pre-amplifier, and by changing the value of the resistor, different gains may be obtained. Both preamplifiers 1412a and 1412b may introduce additional phase inversion.

Figure 15A:
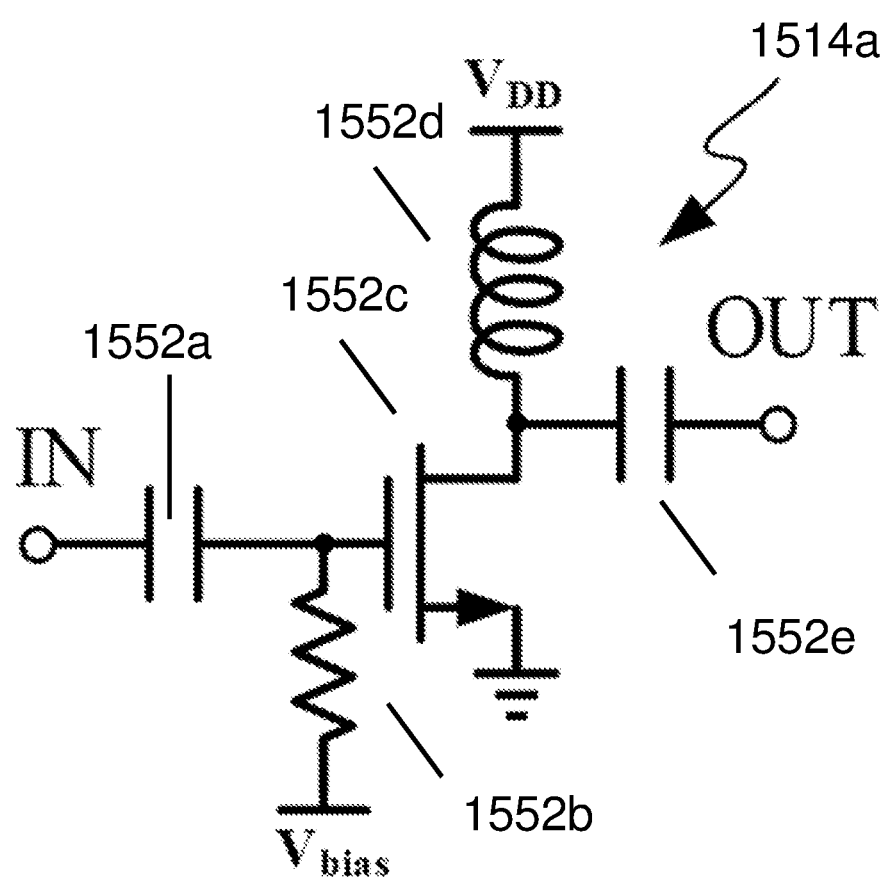
FIG. 15A is a schematic illustrating an amplifier according to various embodiments.

FIG. 15A is a schematic illustrating an amplifier 1514a according to various embodiments. The amplifier 1514a may include a first amplification capacitor 1552a having a first end and a second end. The first end of the first amplification capacitor 1552a may be connected to a pre-amplifier, an oscillator, or a load isolator. The amplifier 1514a may also include an amplification resistor 1552b having a first end connected to the second end of the first amplification capacitor 1552a, and a second end configured to be connected to an amplification bias voltage. The amplifier 1514a may further include an amplification transistor 1552c having a control electrode connected to the second end of the amplification capacitor 1552a, a first controlled electrode, and a second controlled electrode configured to be connected to ground. The amplifier 1514a may additionally include an amplification inductor 1552d having a first end connected to the first controlled electrode of the amplification transistor 1552c, and a second end configured to be connected to an amplification supply voltage. The amplifier 1514a may also include a second amplification capacitor 1552e having a first end connected to the first end of the amplification inductor 1552d and a second end connected to a transmitter antenna or to a matching network. The amplifier 1514a may be of the single-end version.

Figure 15B:
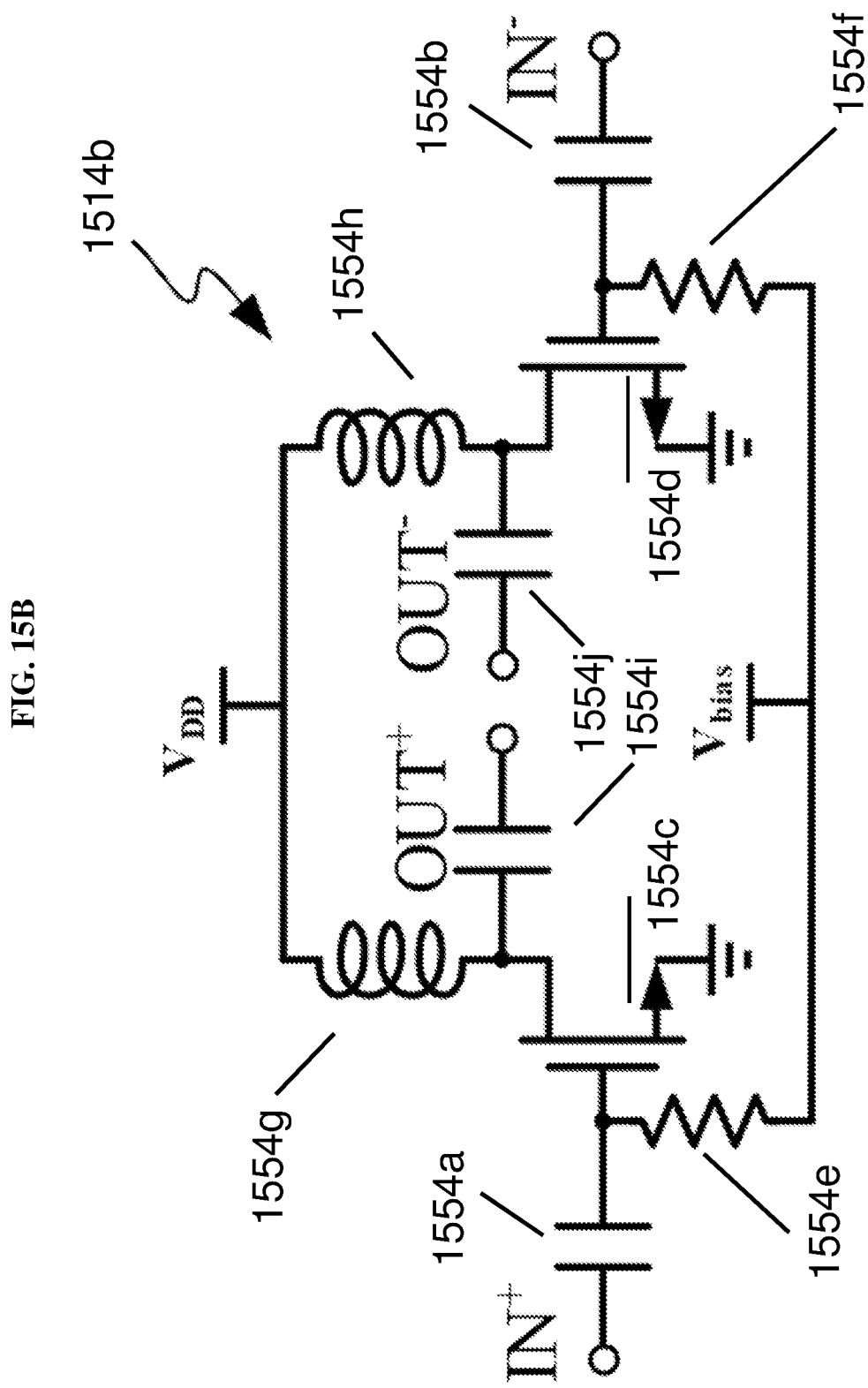
FIG. 15B is a schematic illustrating an amplifier according to various other embodiments.

FIG. 15B is a schematic illustrating an amplifier 1514b according to various other embodiments. The amplifier 1514b may include a first amplification capacitor 1554a having a first end, and a second end. The amplifier 1514b may also include a second amplification capacitor 1554b having a first end, and a second end. The first end of the first amplification capacitor 1554a and the first end of the second amplification capacitor 1554b may be connected to a pre-amplifier, an oscillator, or a load isolator. The amplifier 1514b may further include a first amplification transistor 1554c having a control electrode connected to the second end of the first amplification capacitor 1554a, a first controlled electrode, and a second controlled electrode configured to be connected to ground. The amplifier 1514b may also include a second amplification transistor 1554d having a control electrode connected to the second end of the second amplification capacitor 1554b, a first controlled electrode, and a second controlled electrode configured to be connected to ground. The amplifier 1514b may also include a first amplification resistor 1554e having a first end connected to the second end of the first amplification capacitor 1554a, and a second end configured to be connected to an amplification bias voltage ($V_{bias}$). The amplifier 1514b may also include a second amplification resistor 1554f having a first end connected to the second end of the second amplification capacitor 1554b, and a second end configured to be connected to the amplification bias voltage. The amplifier 1514b may further include a first amplification inductor 1554g having a first end connected to the first controlled electrode of the first amplification transistor 1554c, and a second end configured to be connected to an amplification supply voltage ($V_{DD}$). The amplifier 1514b may also include a second amplification inductor 1554h having a first end connected to the first controlled electrode of the second amplification transistor 1554d, and a second end configured to be connected to the amplification supply voltage. The amplifier 1514b may further include a third amplification capacitor 1554i having a first end connected to the first end of the first amplification inductor 1554g and a second end connected to a transmitter antenna or to a matching network. The amplifier 1514b may also include a fourth amplification capacitor 1554j having a first end connected to the first end of the second amplification inductor 1554h and a second end connected to the transmitter antenna or to the matching network. The amplifier 1514b may be of the differential version. Both power amplifiers 1514a, 1514b may be common-source based amplifiers. Various other embodiments may also include any other suitable power amplifiers. The power amplifier may generate strong output signal with high efficiency when driven by the oscillator and the pre-amplifier.

Figure 16A:
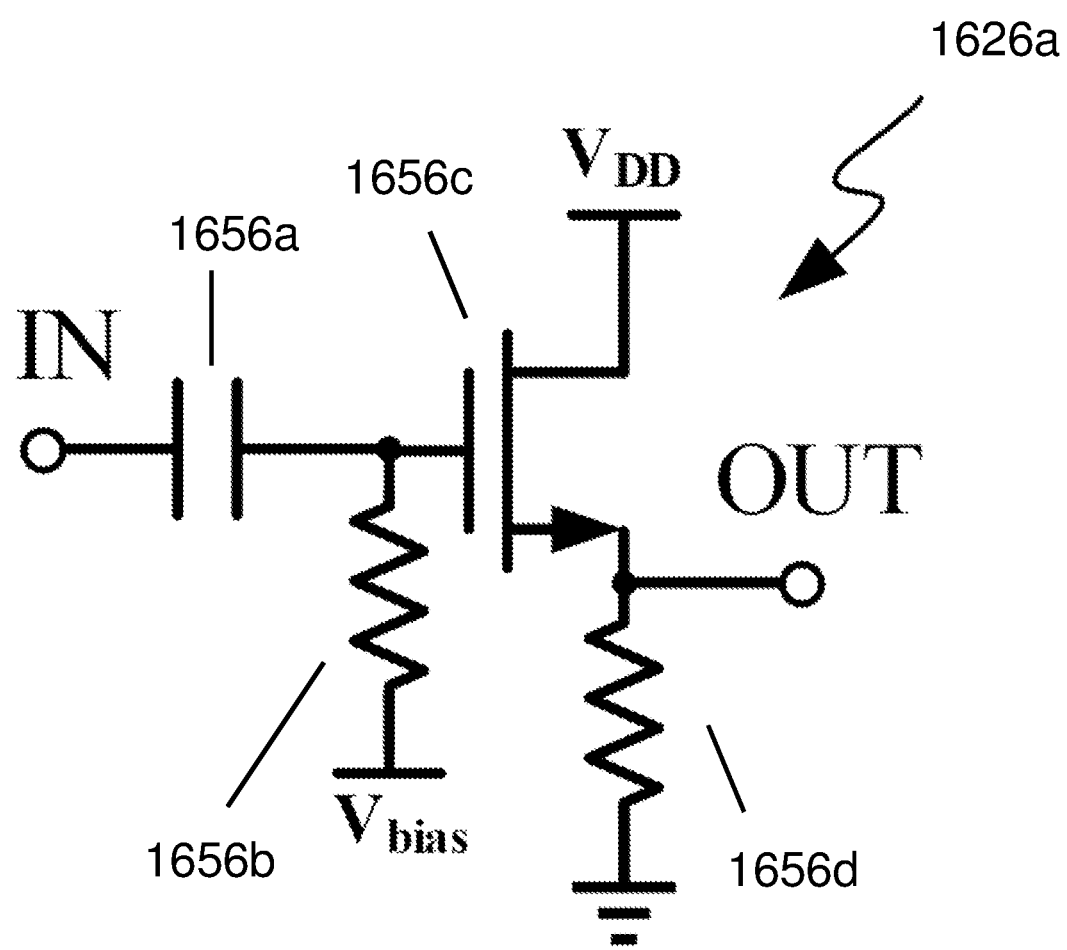
FIG. 16A is a schematic illustrating a load isolator according to various embodiments.

FIG. 16A is a schematic illustrating a load isolator 1626a according to various embodiments. The load isolator 1626a may include a load isolator capacitor 1656a. The load isolator 1626a may further include a first load isolator resistor 1656b having a first end connected to an end of the load isolator capacitor 1656a, and a second end configured to be connected to a load isolator bias voltage ($V_{bias}$). The load isolator 1626a may also include a load isolator transistor 1656c having a control electrode connected to the end of the load isolator capacitor 1656a, a first controlled electrode configured to be connected to a load isolator supply voltage ($V_{DD}$), and a second controlled electrode. The load isolator 1626a may additionally include a second load isolator resistor 1656d having a first end connected to the second controlled electrode of the load isolator transistor 1656c, and a second end configured to be connected to ground. The load isolator 1626a may be a voltage buffer, and may not introduce additional phase inversion.

Figure 16B:
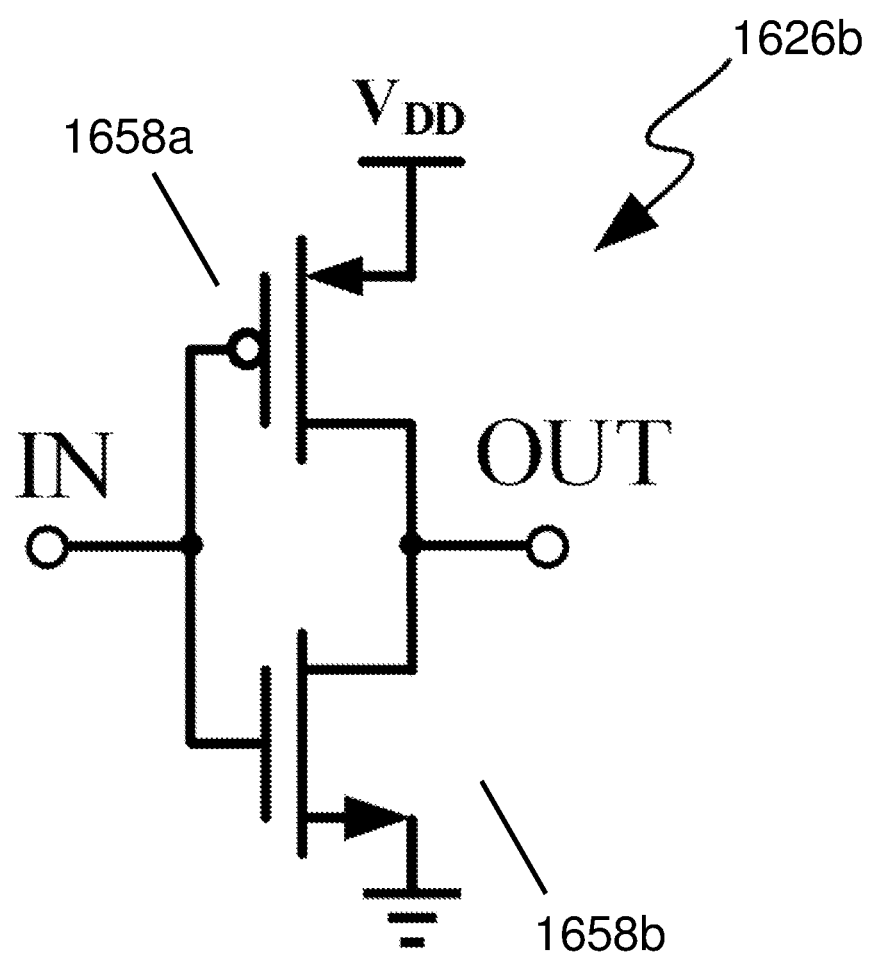
FIG. 16B is a schematic illustrating a load isolator according to various other embodiments.

FIG. 16B is a schematic illustrating a load isolator 1626b according to various other embodiments. The load isolator 1626b may include a first load isolator transistor 1658a having a control electrode, a first controlled electrode, and a second controlled electrode configured to be connected to a load isolator supply voltage ($V_{DD}$). The load isolator 1626b may also include a second load isolator transistor 1658b having a control electrode connected to the control electrode of the first load isolator transistor 1658a, a first controlled electrode connected to the first controlled electrode of the first load isolator transistor 1658a, and a second controlled electrode configured to be connected to ground. The load isolator 1626b may be a voltage inverter, and may introduce additional phase inversion.

Figure 17A:
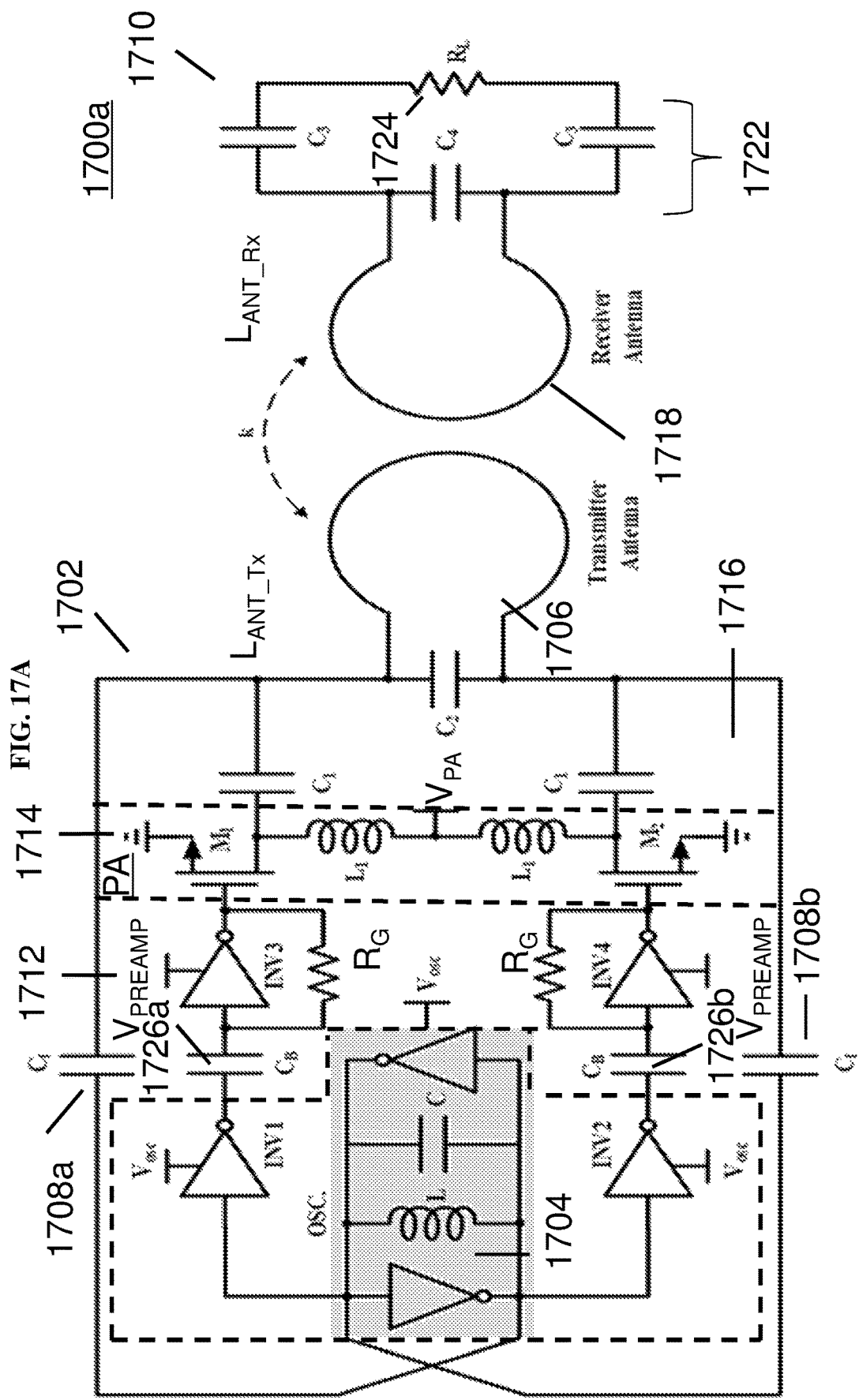
FIG. 17A shows a schematic illustrating a wireless power transfer (WPT) system according to various embodiments.

FIG. 17A shows a schematic illustrating a wireless power transfer (WPT) system 1700a according to various embodiments. The system 1700a may be implemented by discrete components and may be verified by measurement results.

As shown in FIG. 17A, the transmitter device 1702 may include an oscillator 1704, load isolators 1726a-b, preamplifiers 1712, a power amplifier 1714, a matching network 1716, a transmitter antenna 1706, a feedback arrangement 1708a, and a further feedback arrangement 1708b. The receiver device 1710 may include a receiver antenna 1718, and a matching network 1722. The receiver device 1710 may be coupled to a load 1724. In order to simplify the implementation, a rectifier in the receiving device 1710 was not included, and the antenna 1718 was matched directly to 50 ohms. However, inclusion of a rectifier for practical WPT systems would be straightforward to implement by matching the antenna impedance to the input impedance of the rectifier instead. For comparison, one traditional wireless power system (open-loop system) was also implemented. The transmitter antenna 1706 and the receiver antenna 1718 can be fabricated in Rogers 4350B. Each antenna may have two turns with trace width of 3 mm and diameter of 40 mm Signal traces on the first 2 layers connected in parallel form the first turn to reduce skin effect and those on the bottom 2 layers form the second turn in the same way, leading to high quality factors.

As shown in FIG. 17A, each of the feedback arrangement 1708a and the further feedback arrangement 1708b may include a single capacitor having capacitance $C_f$. The cross-coupled oscillator 1704 may provide s start-up drive for the drive amplifiers.

The elements of each of the circuit component have not been labelled with reference numerals to avoid clutter and improve clarity.

The oscillator 1704 may include a first inverter having an input and an output, as well as a second inverter having an input and an output. The output of the first inverter may be coupled to the input of the second inverter, and the output of the second inverter may be coupled to the input of the first inverter. The oscillator 1704 may further include an oscillator capacitor and an oscillator inductor coupled in parallel. A first end of the oscillation inductor may be coupled to the input of the first inverter, and a second end of the oscillator inductor may be coupled to the input of the second inverter. Similarly, a first end of the oscillation capacitor may be coupled to the input of the first inverter, and a second end of the oscillator capacitor may be coupled to the input of the second inverter. The first and second inverters may be unbuffered hex inverters SN74HCU04.

Each of the load isolators 1726a-b may include a capacitor having capacitance $C_B$. Inverters INV1 and INV2 (output buffers running off $V_{OSC}$) may be used to shape the oscillator output from a sine wave to a square wave, while inverters INV3 and INV4 (e.g. implemented with SN74HCU04) with feedback resistors can be used in the pre-amplifiers 1712 to switch respective power transistors M1, M2 sharply.

AC coupling from $C_B$ can provide balanced duty cycles between the two half circuits, since the pre-amplifiers 1712 have a higher power supply $V_{PREAMP}$ (and hence a higher inverter threshold) than $V_{OSC}$.

The power amplifier 1714 may include a first end of a first amplification inductor and a first end of a second amplification inductor connected to $V_{P4}$. The power amplifier 1714 may also include a first amplification transistor $M_1$ having a control electrode connected to the preamplifier 1712 (e.g. INV3 of the preamplifiers 1712), a first controlled electrode connected to a second end of the first amplification inductor, and a second controlled electrode connected to ground. The second amplification transistor $M_2$ may include a control electrode connected to the preamplifier 1712 (e.g. INV4 of the preamplifiers 1712), a first controlled electrode connected to a second end of the second amplification inductor, and a second controlled electrode connected to ground. Commercial off-the-shelf RF power transistors can be adopted to design the class-D power amplifier 1714. Balanced duty cycles can be used for efficient class-D operation by the differential power amplifier 1714

The DC blocking capacitors having capacitance $C_B$ (i.e. the load isolators 1726a-b) may level shift the output to ~$V_{PREAMP}/2$, near the $V_{TH}$ of 2.2V for power amplifier transistors $M_1$ and $M_2$ ($V_{PREAMP}$ is the supply voltage provided to INV3, INV4, and $V_{TH}$ is the threshold voltage of $M_1$, $M_2$). In addition to providing sharp class-D switching for the power amplifier, the level-shift may also provide balanced antiphasic duty-cycles for the differential driver, since any phase imbalance will hurt both output power and efficiency. RF lightly doped metal oxide semiconductor (LDMOS) transistors (AFT05MS003N) may be chosen for $M_1$ and $M_2$.

By connecting the transmitter antenna 1706 back to the oscillator source 1704 in a cross-coupled fashion to complete a fully-differential feedback loop, where the feedback is positive, the feedback loop may push the open-loop antenna poles onto the jai-axis for self-oscillation. The saturating gain stages may naturally limit the oscillation. Due to the high Q resonance, the antenna voltage may build up to a level much larger than the low-voltage oscillator 1704 by design, and hence only a small-valued capacitive feedback $C_f$ can be used for the transmitter antenna oscillation to overpower the original oscillator frequency through injection locking.

The matching network 1716 may include a first matching network capacitor $C_2$ connected in parallel to the transmitter antenna 1706. The matching network 1716 may also include a second matching network capacitor $C_1$ having a first end connected to the transmitter antenna 1706, and a second end connected to the power amplifier 1714. The matching network 1716 may further include a third matching network capacitor $C_1$ having a first end connected to the transmitter antenna 1706, and a second end connected to the power amplifier 1714.

Capacitors with capacitance values $C_1$ and $C_2$ may form the impedance matching network 1706 between the power amplifier 1714 and the transmitter antenna 1706 to obtain maximum efficiency, while capacitors with capacitance values $C_3$ and $C_4$ may match the receiver antenna 1718 to 50Ω. $C_1$ and $C_2$ may match $Z_{in}$ to the impedance of the power amplifier 1714 for maximum $\eta_{PA}$ at 40 mm coupling using a load pull (found to be 40-j7Ω).

System parameters may be provided in the table below:

TABLE I

SYSTEM PARAMETERS

| Parameter | Value | Parameter | Value |
|---|---|---|---|
| $L_{ANT\_Tx}$ | 307 nH | $C_3$ | 22.0 pF |
| $Q_{ANT\_Tx}$ | 168 | $C_4$ | 39.0 pF |
| $L_{ANT\_Rx}$ | 306 nH | $C_f$ | 1.80 pF |
| $Q_{ANT\_Rx}$ | 170 | $C_B$ | 0.22 µF |
| L | 390 nH | R | 330 kΩ |
| C | 40.0 pF | $R_L$ | 50.0 Ω |
| $L_1$ | 1.00 µH | $V_{OSC}$ | 2.50 V |
| $C_1$ | 16.4 pF | $V_{PREAMP}$ | 4.00 V |
| $C_2$ | 33.4 pF | $V_{PA}$ | 5.00 V |

$L_{ANT\_Tx}$ refers to the inductance of the transmitter antenna 1706, $Q_{ANT\_Tx}$ refers to the quality factor of the transmitter antenna 1706, $L_{ANT\_Rx}$ refers to the inductance of the receiver antenna 1718, $Q_{ANT\_Tx}$ refers to the quality factor of the receiver antenna 1718, L refers to the inductance of the inductor included in the oscillator 1704, C refers to the capacitance of the capacitor included in the oscillator 1704, $L_1$ refers to the inductance of each inductor included in the power amplifier 1714, $C_1$ and $C_2$ refer to the capacitances of the capacitors in the matching network 1716, $C_3$ and $C_4$ refer to the capacitances of the capacitors in the matching network 1722, $C_f$ refers to the capacitance of the capacitor included in each of the feedback arrangement 1708a or further feedback arrangement 1708b, $C_B$ refers to the capacitance of the capacitor included in each of load isolators 1726a, 1726b, $R_G$ refers to the resistance of each feedback resistor included in preamplifiers 1712, $R_L$ refers to the resistance of the load 1724, $V_{OSC}$ refers to the supply voltage provided to the oscillator 1704, $V_{PREAMP}$ refers to the supply voltage provided to each of the preamplifiers 1712, and $V_{PA}$ refers to the supply voltage provided to the power amplifier 1714.

Figure 17B:
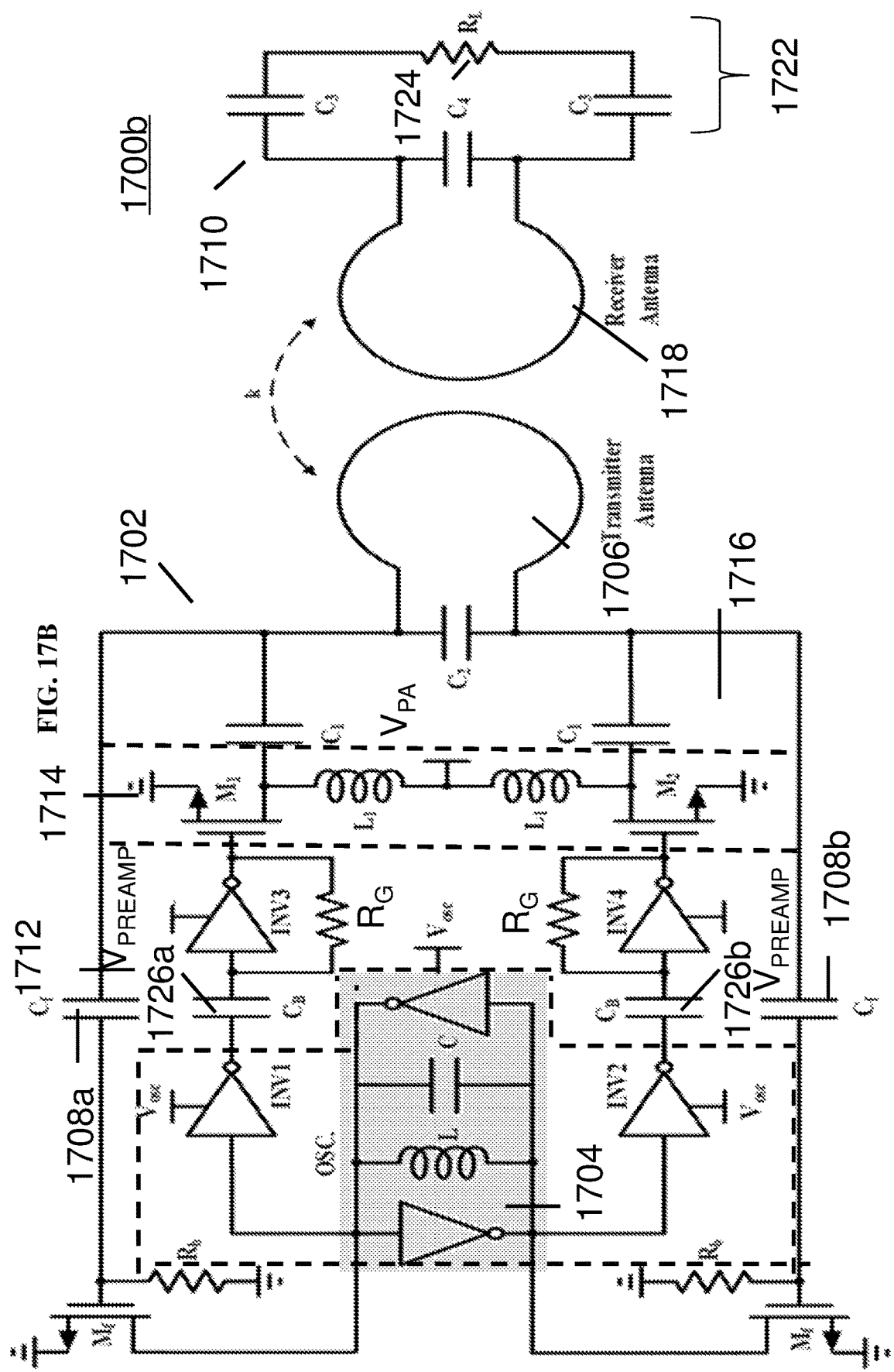
FIG. 17B shows a schematic illustrating a wireless power transfer (WPT) system according to various other embodiments.

FIG. 17B shows a schematic illustrating a wireless power transfer (WPT) system 1700b according to various other embodiments. System 1700b may be verified by simulation using Spectre model in GlobalFoundries 0.13 µm BCD process. As in system 1700a, a rectifier in the receiving device 1710 may be omitted for simplicity. The transmitter device 1702 may include an oscillator 1704, load isolators 1726a-b, preamplifiers 1712, a power amplifier 1714, a matching network 1716, a transmitter antenna 1706, a feedback arrangement 1708a, and a further feedback arrangement 1708b. The receiver device 1710 may include a receiver antenna 1718, and a matching network 1722. The receiver device 1710 may be coupled to a load 1724. System 1700b may be similar to system 1700a, but may include injection transistors $M_f$.

Similar as in system 1700a, inverters can be employed for the design of source oscillator 1704 in system 1700b. RF power transistors may be adopted to design the class-D power amplifier 1714. The oscillator 1704 may provide a start-up gate drive for the power amplifiers. INV1 and INV2 can be used to shape the oscillator output from a sine wave to a square wave, while INV3 and INV4 with feedback resistors may be used in pre-amplifiers 1714 to switch the power transistors sharply. AC coupling from $C_B$ can provide balanced duty cycles between the two half circuits, since the pre-amplifiers have a higher power supply $V_{PREAMP}$ (and hence a higher inverter threshold) than $V_{OSC}$. Balanced duty cycles can be used for efficient class-D operation by the differential power amplifier 1714.

By feeding the transmitter antenna voltage back to the oscillator source through current injection transistors $M_f$, the sign of the feedback loop is positive without cross-coupling at the output of feedback elements 1708a-b and can push the open-loop antenna poles onto the jai-axis for self-oscillation. Due to the high Q resonance, the antenna voltage builds up to a level much larger than the low-voltage oscillator 5 by design, hence the transmitter antenna oscillation can overcome the original oscillator frequency through injection locking. Capacitors with capacitances $C_1$ and $C_2$ form the impedance matching network between power amplifier 1714 and transmitter antenna 1706 to obtain maximum efficiency, while capacitors with capacitances $C_3$ and $C_4$ match the receiver antenna 1718 to 50Ω.

Figure 18A:
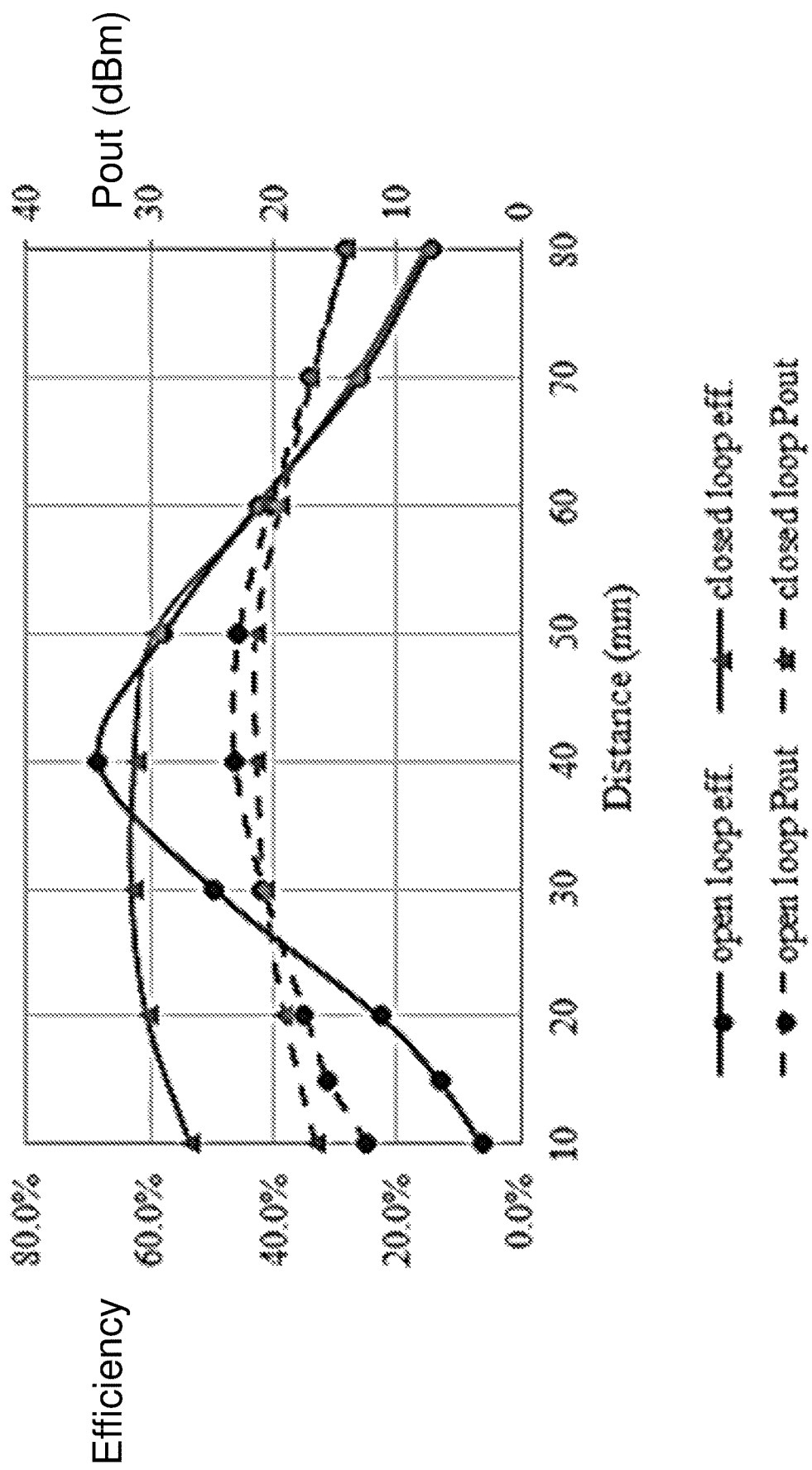
FIG. 18A is a plot of efficiency (in percent or %)/output power Pout (in decibels meters or dBm) as a function of distance (in millimeters or mm) showing the measured efficiency and output power of an open-loop power transfer system and closed-loop wireless power transfer system according to various embodiments.

FIG. 18A is a plot of efficiency (in percent or %)/output power Pout (in decibels meters or dBm) as a function of distance (in millimeters or mm) showing the measured efficiency and output power of an open-loop power transfer system and closed-loop wireless power transfer system according to various embodiments. The transfer efficiency may be defined by the ratio between received power and the direct current (DC) power consumption of the power amplifier. As shown in FIG. 18A, the peak efficiency drops around 5% compared to that of open-loop system, but the efficiency improves a lot in the over-coupling range <40 mm. At distance of 20 mm, the efficiency increases from ~20% to 60%. Additionally, the output power level is more stable than that of the open-loop system as distance varies. The variation of output power is 4 dB less than that of the open-loop system.

Figure 18B:
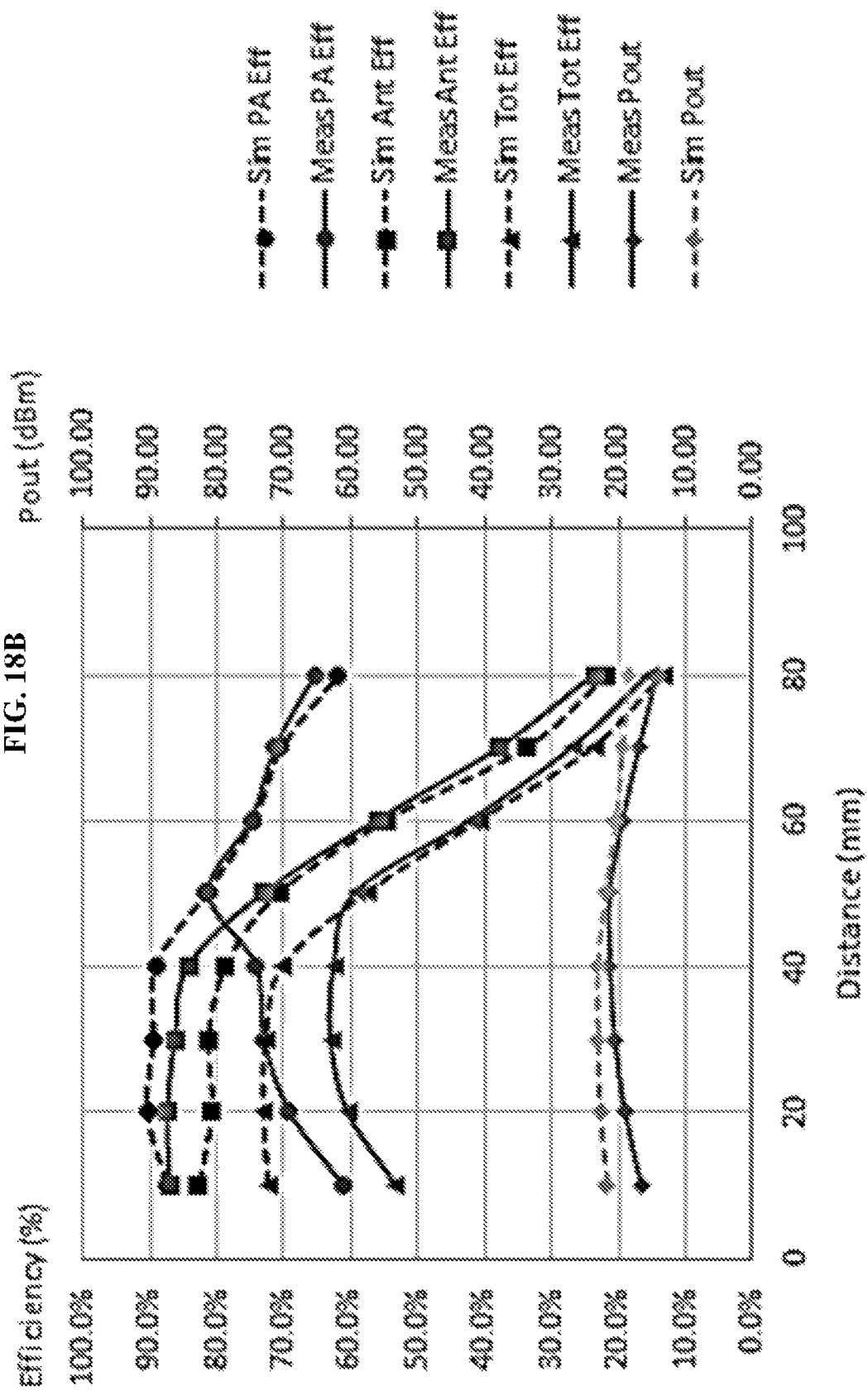
FIG. 18B is a plot of efficiency (in percent or %)/output power Pout (in decibels meters or dBm) as a function of distance (in millimeters or mm) illustrating the performance comparison between measurement results of the system shown in FIG. 17A according to various embodiments and simulation results of the system shown in FIG. 17B according to various embodiments.

FIG. 18B is a plot of efficiency (in percent or %)/output power Pout (in decibels meters or dBm) as a function of distance (in millimeters or mm) illustrating the performance comparison between measurement results of the system shown in FIG. 17A according to various embodiments and simulation results of the system shown in FIG. 17B according to various embodiments. Both embodiments may achieve better efficiency in the over coupling region compared to the open-loop system. The measurement and simulation results are matched with each other quite well when the distance is larger than 50 mm. The main reason for the mismatch within distance of 50 mm is the limited performance of off-the-shelf power transistors.

Figure 19A:
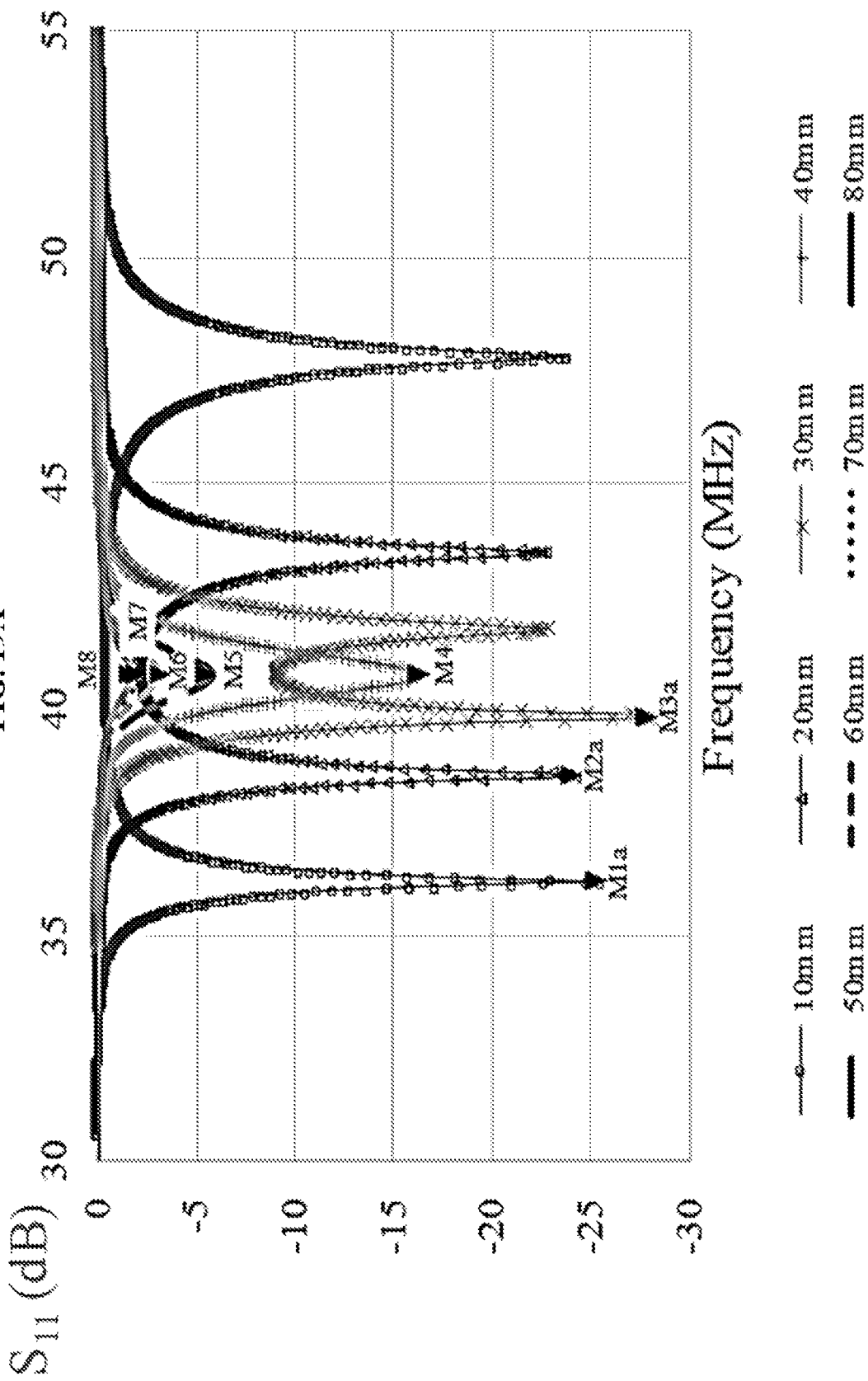
FIG. 19A is a plot of loss $S_{11}$ (in decibels or dB) as a function of frequency (in megahertz or MHz) showing the measured S11 when the transmitter (Tx) antenna and the receiver (Rx) antenna of the system shown in FIG. 17A according to various embodiments are at different distances.

The return loss (=20 log$_{10}$|S$_{11}$|) of the coupled antennas shown in FIG. 17A at different distances may be measured by a vector network analyzer (Keysight VNA E5063A). FIG. 19A is a plot of loss S$_{11}$ (in decibels or dB) as a function of frequency (in megahertz or MHz) showing the measured S11 when the transmitter (Tx) antenna and the receiver (Rx) antenna of the system shown in FIG. 17A according to various embodiments are at different distances. The Tx antenna is rematched to 50Ω at 40.8 MHz and ~40 mm distance for the VNA measurement using slightly different values for $C_1$=27 pF and $C_2$=34.5 pF. The 40 mm match can be seen by the fusion of two resonant frequencies into one at 40 mm Below 40 mm, the lower of the two resonant frequencies is higher Q with a lower |S11| minima.

Figure 19B:
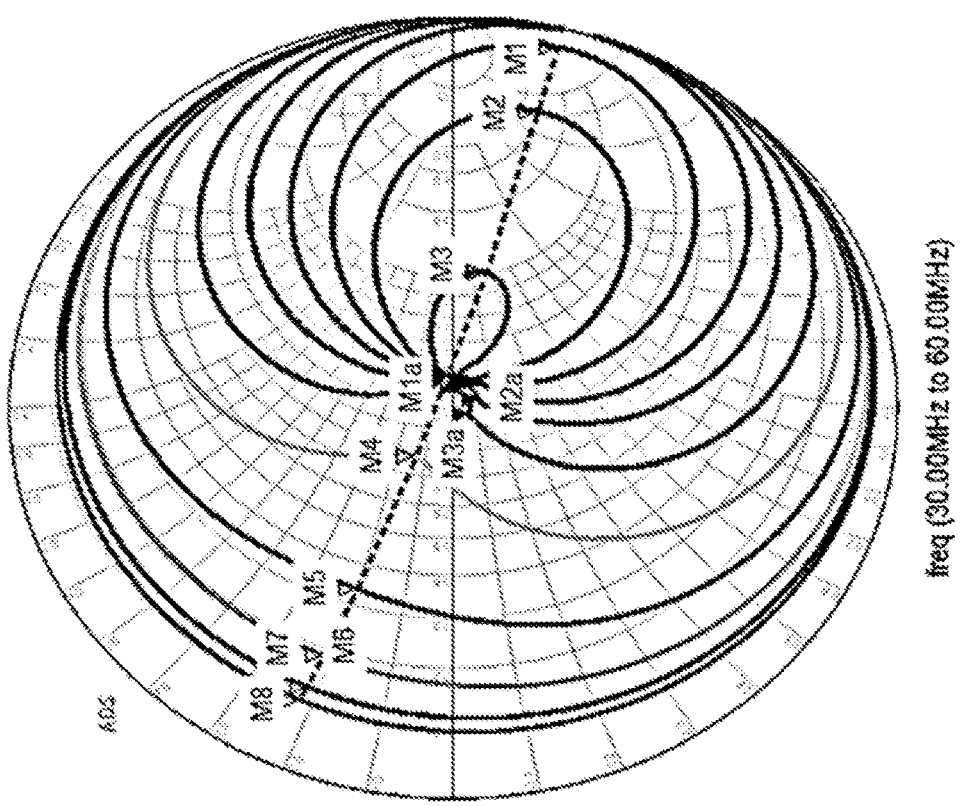
FIG. 19B shows a Smith Chart illustrating the change in input impedance Zin as the distance of the antennas in the system shown in FIG. 17A according to various embodiments is varied from 10 mm to 80 mm.

FIG. 19B shows a Smith Chart illustrating the change in input impedance Zin as the distance of the antennas in the system shown in FIG. 17A according to various embodiments is varied from 10 mm to 80 mm. It becomes clear that the minimum $S_{11}$ frequency for 10-30 mm (Markers 1a-3a) corresponds to maintaining $Z_{in}$~50Ω, whereas if the frequency was fixed at 40.8 MHz, $|Z_{in}|$ would double above 50Ω with every 10 mm reduction in distance.

Figure 19C:
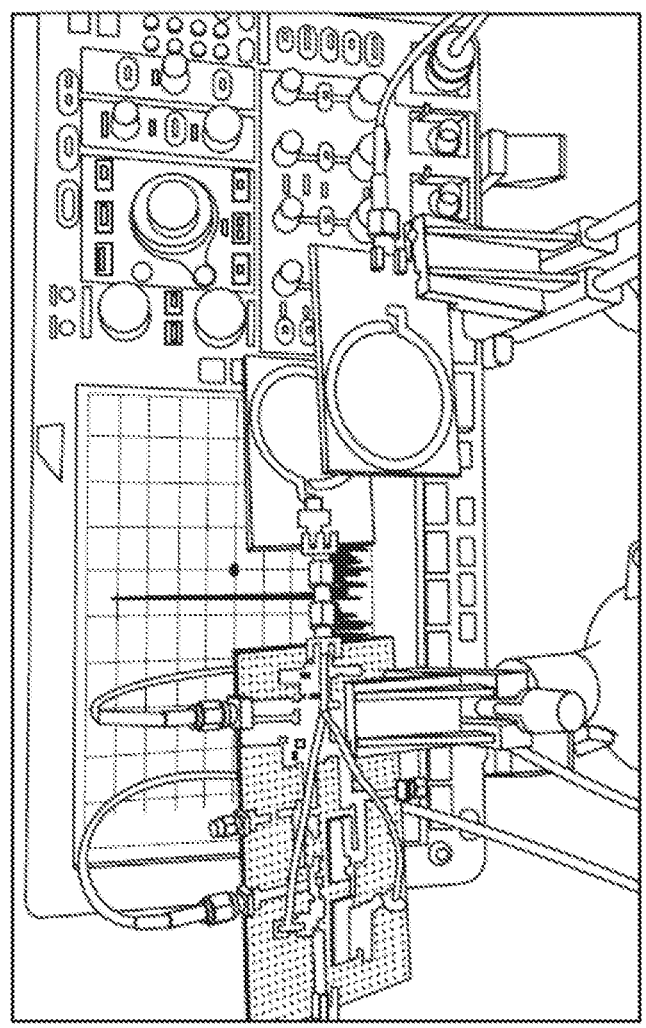
FIG. 19C shows an image of the prototype and measurement setup of the injection-locked power oscillator according to various embodiments, powered by external power supplies.

FIG. 19C shows an image of the prototype and measurement setup of the injection-locked power oscillator according to various embodiments, powered by external power supplies. The received power is measured by the spectrum analyzer input of a Tektronix MD04104C. By disconnecting the feedback loop using jumpers, an open-loop system was also implemented for comparison. For the open-loop case, $C_1$ and $C_2$ are also changed slightly to 14.8 pF and 32.6 pF respectively, to compensate for the lower parasitic capacitance once the feedback path is disconnected.

Figure 19D:
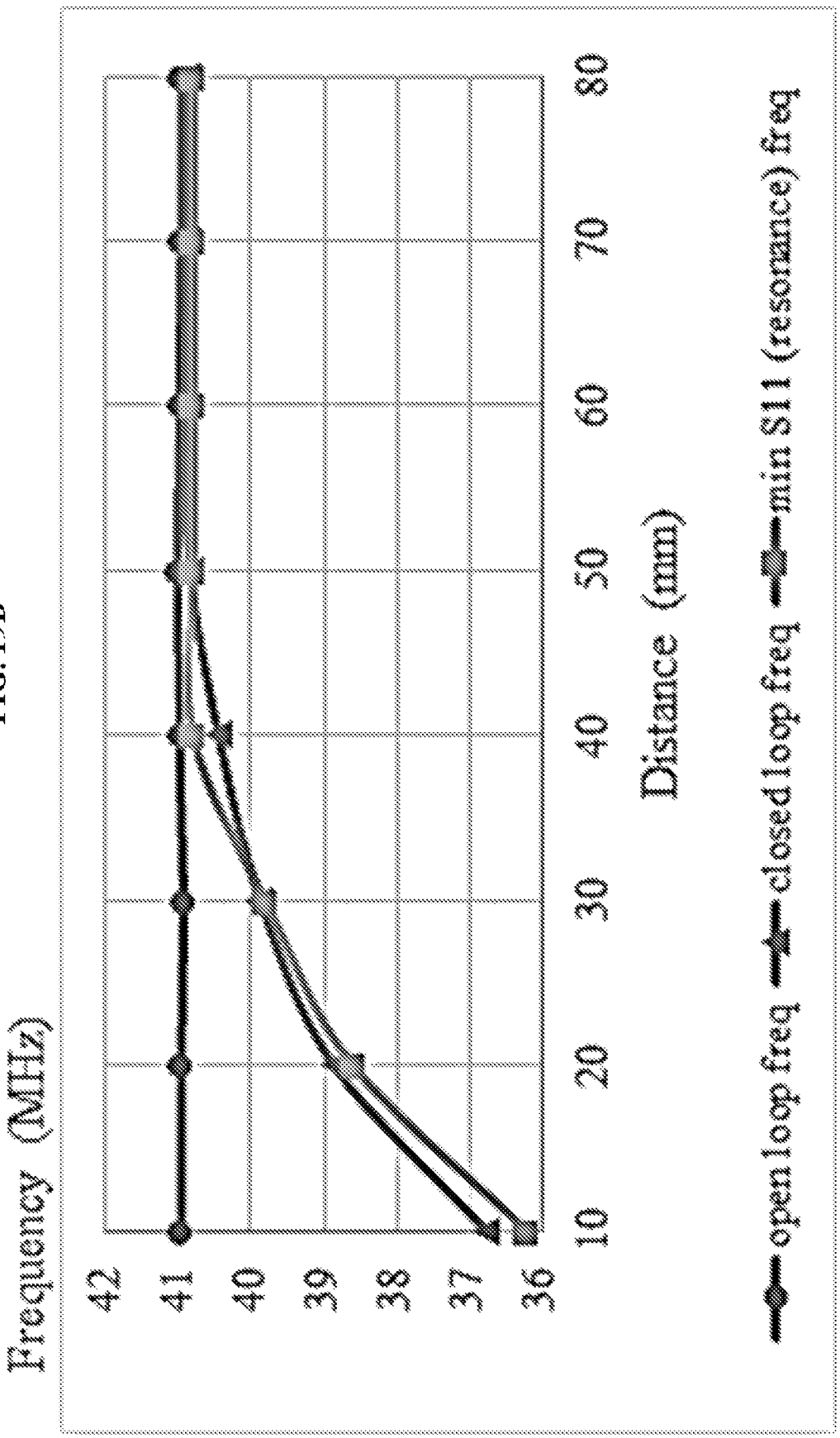
FIG. 19D is a plot of frequency (in megahertz or MHz) as a function of distance (in millimeters or mm) illustrating the operation frequency of the open-loop power transfer system and the closed-loop wireless power transfer system according to various embodiments as the distance changes, as well as the resonance frequency (indicated by minimum S11) for coupled antennas.

FIG. 19D is a plot of frequency (in megahertz or MHz) as a function of distance (in millimeters or mm) illustrating the operation frequency of the open-loop power transfer system and the closed-loop wireless power transfer system according to various embodiments as the distance changes, as well as the resonance frequency (indicated by minimum S11) for coupled antennas. Without the feedback loop, the operation frequency is fixed around 41 MHz. However, the resonant frequency of coupled antennas changes as distance varies. Due to the feedback loop for injection locking, the closed-loop system is able to control the oscillation frequency automatically for maximum power transfer efficiency. As depicted in FIG. 18B, the tracked frequency of closed-loop system agrees with the resonance/minimum S11 frequency of the coupled antennas very well. Besides changes in distance, the resonance frequency of coupled transmitter and receiver antennas may also be varied due to misalignment, different-sized antennas, foreign metallic object proximity, and transmission media with variable dielectric properties between the antennas to name a few sources of disturbance. The prior list may not be exhaustive; essentially any effect that significantly alters the magnetic flux linkage between the two antennas hence changing their self or mutual inductance can cause a shift in the resonance frequency. However, the operation frequency for maximum power transfer efficiency may still be tracked by the closed-loop system according to various embodiments due to the injection-locked self-oscillation, without the use of sophisticated communication systems or control algorithms.

Figure 19E:
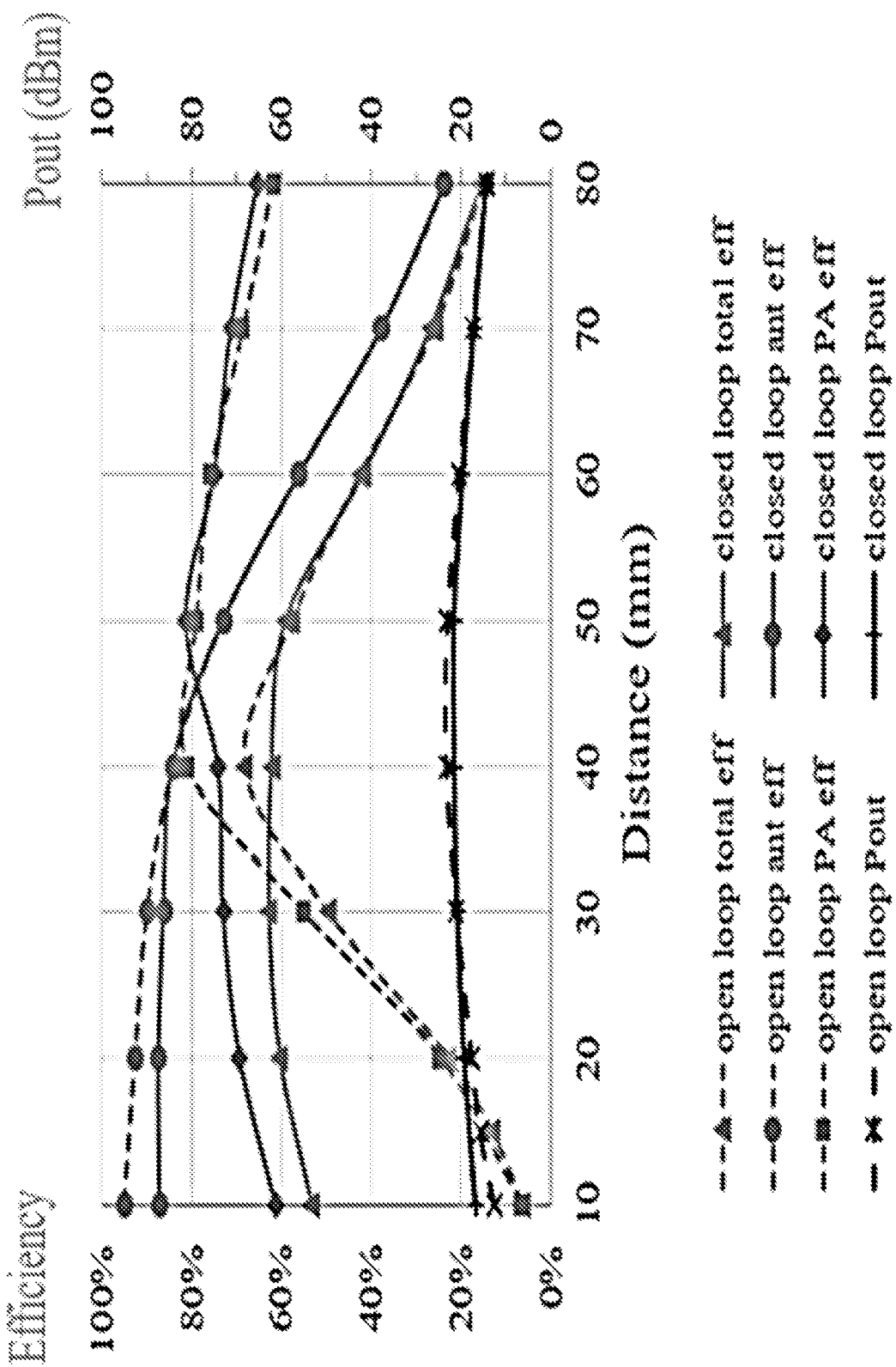
FIG. 19E is a plot of efficiency (in percent or %)/output power Pout (in decibels meters or dBm) as a function of distance (in millimeters or mm) comparing the efficiency and output power of the open loop system and a closed loop system according to various embodiments.

FIG. 19E is a plot of efficiency (in percent or %)/output power Pout (in decibels meters or dBm) as a function of distance (in millimeters or mm) comparing the efficiency and output power of the open loop system and a closed loop system according to various embodiments. $\eta_{TOT}$ was measured as $P_L/P_{DC}$, and $\eta_{ANT}$ from S-parameters as given by Equation (1). $\eta_{PA}$ was hence calculated as $\eta_{TOT}/\eta_{ANT}$. Above 40 mm, the two systems show little difference because the frequencies match around 40.8 MHz. However, total efficiency is markedly improved for distance <40 mm as can be seen primarily due to $\eta_{PA}$ maintained >60% for the closed loop, while the open loop $\eta_{PA}$ drops rapidly due to rapidly rising $Z_{in}$ as indicated in FIG. 19B, despite a slight rise in $\eta_{ANT}$ at the open loop frequency. The variation of closed loop Pout is also 4 dB less than the open-loop.

Figure 19F:
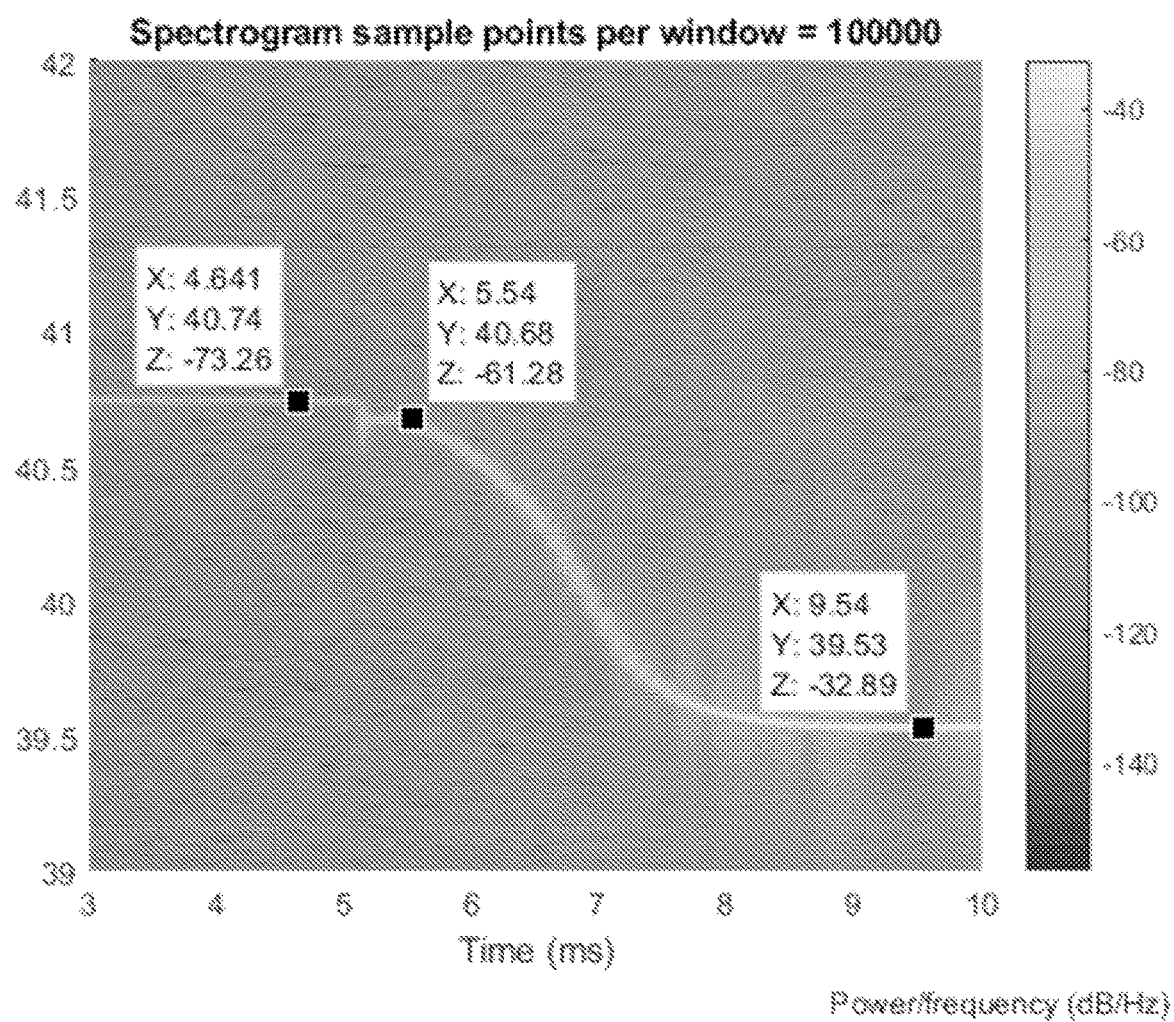
FIG. 19F is a plot of a frequency (MHz) as a function of time (in milliseconds or ms) showing the measured spectrogram of a power amplifier (PA) output of the system according to various embodiments.

In order to provide a better insight about the process of injection locking in the closed-loop system, the startup output waveform at an antenna distance of ~30 mm was captured and plotted as a spectrogram in FIG. 19F. FIG. 19F is a plot of a frequency (MHz) as a function of time (in milliseconds or ms) showing the measured spectrogram of a power amplifier (PA) output of the system according to various embodiments. Initially, the PA is turned off so a very weak feedthrough of the gate drive at the native oscillator frequency of ~40.74 MHz is captured. At around 5 ms, the PA is manually turned on and the transient frequency drops to 40.68 MHz due to loading effects on the oscillator.

However, the closed loop quickly starts to injection lock the oscillator from 5.5 ms to 9.5 ms as the output amplitude increases. By 9.5 ms, the injection-locking is fully stable and maintains the closed loop frequency at 39.53 MHz.

Various embodiments may provide a closed-loop injection-locked power oscillator for WPT which is able to track the resonance frequency automatically. Compared against prior designs using negative $g_m$ cells for self-oscillation, this system may be robust in achieving good efficiency across a wide range of antenna distances both above and below critical coupling, doing no worse than an open loop system when under-coupled, as that represents the best performance at the same resonance frequency. The resonance frequency tracking when over-coupled maintains high efficiency primarily by minimizing changes to $Z_{in}$, and by doing so also reduces the variation in output power by 4 dB over the same range. The preamplifier and oscillator overhead power was not optimized and measured ~65 mW in the prototype described, but may be reduced to ~12 mW with an RFIC design in progress. This closed-loop topology could hence be useful for WPT use cases in implanted medical devices and other applications where a wide range of coupling and environmental factors is expected to vary the antennas' resonance frequency.

Various embodiments may provide a wireless power transfer system that transmits power wirelessly from a transmitting device to a receiver device through a resonant magnetic field. The system may include a transmitter device including an oscillator, a pre-amplifier, a power amplifier and a transmitter matching network. The oscillator may be connected to a pre-amplifier, the pre-amplifier may be connected to a power amplifier, and the power amplifier may be connected to the transmitter matching network. The transmitter matching network may deliver power to a transmitter antenna at its output.

The system may include a receiver device including a receiver antenna that receives wireless power from the transmitter antenna. The receiving device may also include a receiver matching network and a rectifier. The receiver antenna may be connected to the receiver matching network, and the receiver matching network may be connected to the rectifier. The rectifier may deliver power to a load at its output.

The system may include a feedback element that connects the transmitter antenna at the output of the transmitter matching network back to the oscillator, in order to automatically track the resonant frequency of the coupled system for maximum power transfer efficiency.

The feedback element may be a passive element or an active element or a combination thereof. If the feedback element is passive, the passive element may be a 2-terminal impedance element such as a capacitor, resistor or inductor or some combination thereof. If the feedback element is active, the active element may be a 3-terminal transistor, with its input and output connected to two of the three transistor terminals, and the remaining terminal tied to a fixed potential. If the feedback element is a combination of passive and active elements, the elements may include a combination of 2-terminal impedance elements and 3-terminal transistor elements connected together in series or parallel.

In various embodiments, load isolation may be provided at different stages of the feedback loop. The load isolation may be provided between the feedback element and the oscillator of the transmitting device.

The load isolation may be provided by using a 3-terminal transistor as an active feedback element.

The load isolation may be provided between the oscillator and the preamplifier.

The load isolation may be accomplished using a voltage buffer, voltage inverter or voltage phase-shifters.

If the load isolation is provided by a voltage buffer, no phase inversion may be introduced into the feedback loop.

If the load isolation is provided by a voltage inverter, phase inversion may be introduced into the feedback loop.

Additional voltage inverters or phase-shifters may be added between the different stages of the feedback loop in order to sum to a zero-phase condition in the feedback loop for self-oscillation.

In various embodiments, a fully-differential topology may be used for the wireless power transfer system.

The oscillator, pre-amplifier and power amplifier may be fully-differential designs with differential (inverting and non-inverting) inputs and outputs.

Both ends of the transmitter antenna may be connected to feedback elements, which may be connected to differential inputs on the oscillator.

A differential matching network or two equivalent single-ended matching networks may be used to connect the differential outputs of the power amplifier to both ends of the transmitter antenna.

A differential matching network or two equivalent single-ended matching networks may be used to connect both ends of the receiver antenna to the differential inputs of the rectifier.

Cross-coupling may be used for feedback from the output of the transmitter antenna to the oscillator, to introduce one additional phase inversion. For example, the cross-coupling may be at the input of the feedback elements, or at the output of the feedback elements.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A transmitter device comprising:
an oscillator configured to operate at a variable oscillation frequency to generate an oscillator signal;
a transmitter antenna configured to transmit power to a receiver device via magnetic coupling based on the oscillator signal;
a feedback arrangement configured to generate a feedback to the oscillator based on a resonant frequency of the magnetic coupling between the transmitter antenna and a receiver antenna of the receiver device such that the variable oscillation frequency of the oscillator is adjusted towards the resonant frequency; and
a further feedback arrangement configured to provide a further feedback to the oscillator based on the resonant frequency of the magnetic coupling between the transmitter antenna and the receiver antenna of the receiver device such that the variable oscillation frequency of the oscillator is adjusted towards the resonant frequency;
wherein the oscillator is a fully differential oscillator having a first input and a second input; and
wherein the transmitter antenna is coupled to the oscillator via the feedback arrangement and the further feedback arrangement.

2. The transmitter device according to claim 1,
wherein the variable oscillation frequency of the oscillator is initially at a starting frequency; and
wherein the variable oscillation frequency of the oscillator is adjusted to the resonant frequency upon the oscillator receiving the feedback from the feedback arrangement.

3. The transmitter device according to claim 1,
wherein the transmitter antenna has a first end and a second end;
wherein a first end of the feedback arrangement is coupled to the first end of the transmitter antenna, and a second end of the feedback arrangement is coupled to the first input of the oscillator; and
wherein a first end of the further feedback arrangement is coupled to the second end of the transmitter antenna, and a second end of the further feedback arrangement is coupled to the second input of the oscillator.

4. The transmitter device according to claim 1,
wherein the transmitter antenna has a first end and a second end;
wherein a first end of the feedback arrangement is coupled to the first end of the transmitter antenna, and a second end of the feedback arrangement is coupled to the second input of the oscillator; and
wherein a first end of the further feedback arrangement is coupled to the second end of the transmitter antenna, and a second end of the further feedback arrangement is coupled to the first input of the oscillator.

5. The transmitter device according to claim 1,
wherein the transmitter antenna has a first end and a second end;
wherein a first end of the feedback arrangement is coupled to the second end of the transmitter antenna, and a second end of the feedback arrangement is coupled to the first input of the oscillator; and
wherein a first end of the further feedback arrangement is coupled to the first end of the transmitter antenna, and a second end of the further feedback arrangement is coupled to the second input of the oscillator.

6. The transmitter device according to claim 1,
wherein the oscillator comprises:
an oscillator inductor;
an oscillator capacitor coupled with the oscillator inductor to form a resonant tank; and
an active gain element configured to provide energy to the resonant tank to oscillate.

7. The transmitter device according to claim 1,
wherein the oscillator comprises a ring oscillator.

8. The transmitter device according to claim 1, further comprising:
a power amplifier configured to generate an amplified signal based on the oscillator signal;
wherein the transmitter antenna is configured to transmit the power to the receiver device via the magnetic coupling based on the amplified signal.

9. The transmitter device according to claim 8,
wherein the power amplifier comprises one or more active power transistors.

10. The transmitter device according to claim 8, further comprising:
a transmitter matching network having an input coupled to the power amplifier, and an output coupled to the transmitter antenna.

11. The transmitter device according to claim 8, further comprising:
a pre-amplifier coupled to the power amplifier, the pre-amplifier configured to generate a pre-amplification signal based on the oscillator signal generated by the oscillator;
wherein the amplified signal generated by the power amplifier is based on the pre-amplification signal.

12. The transmitter device according to claim 11, wherein the preamplifier comprises a gain stage.

13. The transmitter device according to claim 1, further comprising:
a load isolator coupled to the oscillator.

14. The transmitter device according to claim 1, further comprising:
a load isolator coupled to the feedback arrangement.

15. The transmitter device according to claim 1, further comprising:
a load isolator coupled to the oscillator, and a further isolator coupled to the feedback arrangement.

16. A wireless power transfer system comprising:
a transmitter device, the transmitter device comprising:
an oscillator configured to operate at a variable oscillation frequency to generate an oscillator signal;
a transmitter antenna configured to transmit power to a receiver device via magnetic coupling based on the oscillator signal; and
a feedback arrangement configured to generate a feedback to the oscillator based on a resonant frequency of the magnetic coupling between the transmitter antenna and a receiver antenna of the receiver device such that the variable oscillation frequency of the oscillator is adjusted towards the resonant frequency;
a further feedback arrangement configured to provide a further feedback to the oscillator based on the resonant frequency of the magnetic coupling between the transmitter antenna and the receiver antenna of the receiver device such that the variable oscillation frequency of the oscillator is adjusted towards the resonant frequency; and
the receiver device comprising the receiver antenna configured to receive the power transmitted by the transmitter device via the magnetic coupling;
wherein the receiver device is configured to be coupled to a load;
wherein the oscillator is a fully differential oscillator having a first input and a second input; and
wherein the transmitter antenna is coupled to the oscillator via the feedback arrangement and the further feedback arrangement.

17. A method of forming a transmitter device, the method comprising: providing an oscillator configured to operate at a variable oscillation frequency to generate an oscillator signal;
coupling a transmitter antenna to the oscillator, the transmitter antenna configured to transmit power to a receiver device via magnetic coupling based on the oscillator signal; and
coupling a feedback arrangement with the oscillator and the transmitter antenna, the feedback arrangement configured to generate a feedback to the oscillator based on a resonant frequency of the magnetic coupling between the transmitter antenna and a receiver antenna of the receiver device such that the variable oscillation frequency of the oscillator is adjusted towards the resonant frequency;
coupling a further feedback arrangement with the oscillator and the transmitter antenna, the further feedback arrangement configured to provide a further feedback to the oscillator based on the resonant frequency of the magnetic coupling between the transmitter antenna and the receiver antenna of the receiver device such that the variable oscillation frequency of the oscillator is adjusted towards the resonant frequency;
wherein the oscillator is a fully differential oscillator having a first input and a second input; and
wherein the transmitter antenna is coupled to the oscillator via the feedback arrangement and the further feedback arrangement.

18. A method of forming a wireless power transfer system, the method comprising:
providing a transmitter device, the transmitter device comprising:
an oscillator configured to operate at a variable oscillation frequency to generate an oscillator signal;
a transmitter antenna configured to transmit power to a receiver device via magnetic coupling based on the oscillator signal; and
a feedback arrangement configured to generate a feedback to the oscillator based on a resonant frequency of the magnetic coupling between the transmitter antenna and a receiver antenna of the receiver device such that the variable oscillation frequency of the oscillator is adjusted towards the resonant frequency;
a further feedback arrangement configured to provide a further feedback to the oscillator based on the resonant frequency of the magnetic coupling between the transmitter antenna and the receiver antenna of the receiver device such that the variable oscillation frequency of the oscillator is adjusted towards the resonant frequency; and
providing a receiver device configured to receive the power transmitted by the transmitter device via the magnetic coupling;
wherein the receiver device is configured to be coupled to a load;
wherein the oscillator is a fully differential oscillator having a first input and a second input; and
wherein the transmitter antenna is coupled to the oscillator via the feedback arrangement and the further feedback arrangement.

* * * * *